(12) United States Patent
Kanamori et al.

(10) Patent No.: US 12,302,570 B2
(45) Date of Patent: May 13, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Kohji Kanamori, Seongnam-si (KR); Seungyoon Kim, Seoul (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 473 days.

(21) Appl. No.: 17/739,845

(22) Filed: May 9, 2022

(65) Prior Publication Data
US 2023/0054445 A1    Feb. 23, 2023

(30) Foreign Application Priority Data

Aug. 18, 2021    (KR) ........................ 10-2021-0108563

(51) Int. Cl.
| | | |
|---|---|---|
| H10B 43/27 | (2023.01) | |
| H01L 23/528 | (2006.01) | |
| H10B 41/10 | (2023.01) | |
| H10B 41/27 | (2023.01) | |
| H10B 41/35 | (2023.01) | |
| H10B 41/40 | (2023.01) | |

(Continued)

(52) U.S. Cl.
CPC ........ *H10B 43/27* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
None
See application file for complete search history.

(56) References Cited

U.S. PATENT DOCUMENTS

| | | |
|---|---|---|
| 2014/0061747 A1 | 3/2014 | Tanzawa et al. |
| 2015/0255478 A1 | 9/2015 | Tanzawa et al. |

(Continued)

FOREIGN PATENT DOCUMENTS

| | | |
|---|---|---|
| KR | 10-2017-0126139 A | 11/2017 |
| KR | 10-2018-0014911 A | 2/2018 |

(Continued)

*Primary Examiner* — Kyoung Lee
(74) *Attorney, Agent, or Firm* — Muir Patent Law, PLLC

(57) ABSTRACT

A semiconductor device includes a stack structure of alternating interlayer insulating layers and gate electrodes, a separation structure vertically penetrating the stack structure and extending in a first direction, to separate the gate electrodes in a second direction, and vertical structures vertically penetrating the stack structure and arranged at a constant pitch. The vertical structures are arranged along array lines sequentially arranged in the second direction away from a side of the separation structure in a plan view. The vertical structures include a channel structure including a channel layer, a contact structure including a metal plug having an upper surface on a level higher than that of an upper surface of the channel structure, and a dummy structure disposed adjacent to the contact structure. The channel structure, the dummy structure, and the contact structure are disposed to be aligned with each other on at least one of the array lines.

20 Claims, 47 Drawing Sheets

(51) Int. Cl.
*H10B 43/10* (2023.01)
*H10B 43/35* (2023.01)
*H10B 43/40* (2023.01)

(56) References Cited

U.S. PATENT DOCUMENTS

| | | |
|---|---|---|
| 2017/0323900 A1* | 11/2017 | Kanamori .............. H10B 43/27 |
| 2018/0040553 A1 | 2/2018 | Tak et al. |
| 2018/0301374 A1 | 10/2018 | Masamori et al. |
| 2019/0280002 A1 | 9/2019 | Kai et al. |
| 2020/0027835 A1 | 1/2020 | Hsu et al. |
| 2020/0312864 A1 | 10/2020 | Iwai et al. |
| 2021/0020654 A1 | 1/2021 | Oh et al. |
| 2021/0091105 A1 | 3/2021 | Kim et al. |

FOREIGN PATENT DOCUMENTS

| | | |
|---|---|---|
| KR | 10-2021-0013671 A | 2/2021 |
| KR | 10-2021-0035558 A | 4/2021 |

\* cited by examiner

ND DATA
SEMICONDUCTOR DEVICE AND DATA STORAGE SYSTEM INCLUDING THE SAME

CROSS-REFERENCE TO RELATED APPLICATION

This application claims benefit of priority to Korean Patent Application No. 10-2021-0108563 filed on Aug. 18, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

Data storage systems that depend on data storage may use semiconductor devices capable of storing high-capacity data. Increased data storage capacity of semiconductor devices may be provided by, e.g., a semiconductor device including memory cells arranged three-dimensionally, instead of two-dimensionally arranged memory cells.

SUMMARY

According to an embodiment, a semiconductor device includes: a first structure including a substrate, circuit elements on the substrate, and a lower wiring structure electrically connected to the circuit elements; and a second structure on the first structure, wherein the second structure includes: a conductive plate layer; a stack structure including interlayer insulating layers and gate electrodes alternately stacked on the conductive plate layer; separation structures penetrating through the stack structure in a vertical direction and extending in a first direction, perpendicular to the vertical direction, to separate the gate electrodes; vertical structures penetrating through the stack structure in the vertical direction, the vertical structures including channel structures respectively including a channel layer, contact structures respectively including a metal plug, and dummy structures; and bit lines electrically connected to the channel structures and extending in a second direction, perpendicular to the first direction, on the stack structure, wherein at least one of the contact structures is disposed adjacent to at least one side of at least one of the separation structures, at least one of the dummy structures is disposed adjacent to the at least one contact structure, the channel structures are arranged at a first pitch in the first direction, the at least one contact structure is arranged at a second pitch in the first direction from the at least one dummy structure adjacent thereto, and the first pitch and the second pitch are substantially equal to each other.

According to another embodiment, a semiconductor device includes: a conductive plate layer; a stack structure including interlayer insulating layers and gate electrodes alternately stacked on the conductive plate layer; a separation structure penetrating through the stack structure in a vertical direction and extending in a first direction, perpendicular to the vertical direction, to separate the gate electrodes in a second direction, perpendicular to the first direction; and a plurality of vertical structures penetrating through the stack structure in the vertical direction and arranged at a constant pitch in at least one direction parallel to an upper surface of the conductive plate layer, wherein the plurality of vertical structures are arranged along array lines extending in the first direction and sequentially arranged in the second direction away from at least one side of the separation structure in a plan view, the plurality of vertical structures include a channel structure including a channel layer, a contact structure including a metal plug having an upper surface on a level higher than a level of an upper surface of the channel structure, and a dummy structure disposed closest to the contact structure, wherein the channel structure, the dummy structure, and the contact structure are disposed to be aligned with each other on at least one of the array lines.

According to another embodiment, a data storage system includes: a lower structure including a substrate, circuit elements on the substrate, and a lower wiring structure electrically connected to the circuit elements; an upper structure on the lower structure; a semiconductor storage device including an input/output pad electrically connected to the circuit elements; and a controller electrically connected to the semiconductor storage device through the input/output pad and controlling the semiconductor storage device, wherein the upper structure includes: a conductive plate layer on the lower structure; a stack structure including interlayer insulating layers and gate electrodes alternately stacked on the conductive plate layer; a separation structure penetrating through the stack structure in a vertical direction and extending in a first direction, perpendicular to the vertical direction, to separate the gate electrodes in a second direction, perpendicular to the first direction; and a plurality of vertical structures penetrating through the stack structure in the vertical direction and arranged at a constant pitch in at least one direction, parallel to an upper surface of the conductive plate layer, wherein the plurality of vertical structures are arranged along array lines extending in the first direction and sequentially arranged in the second direction away from at least one side of the separation structure on a plane parallel to the upper surface of the conductive plate layer, the plurality of vertical structures include a channel structure including a channel layer, a contact structure having an upper surface on a level higher than a level of an upper surface of the channel structure and including a metal plug, and a dummy structure disposed closest to the contact structure, and the channel structure, the dummy structure, and the contact structure are disposed to be aligned with each other on at least one of the array lines.

BRIEF DESCRIPTION OF DRAWINGS

Features will become apparent to those of skill in the art by describing in detail example embodiments with reference to the attached drawings in which.

DETAILED DESCRIPTION

Figure 1:
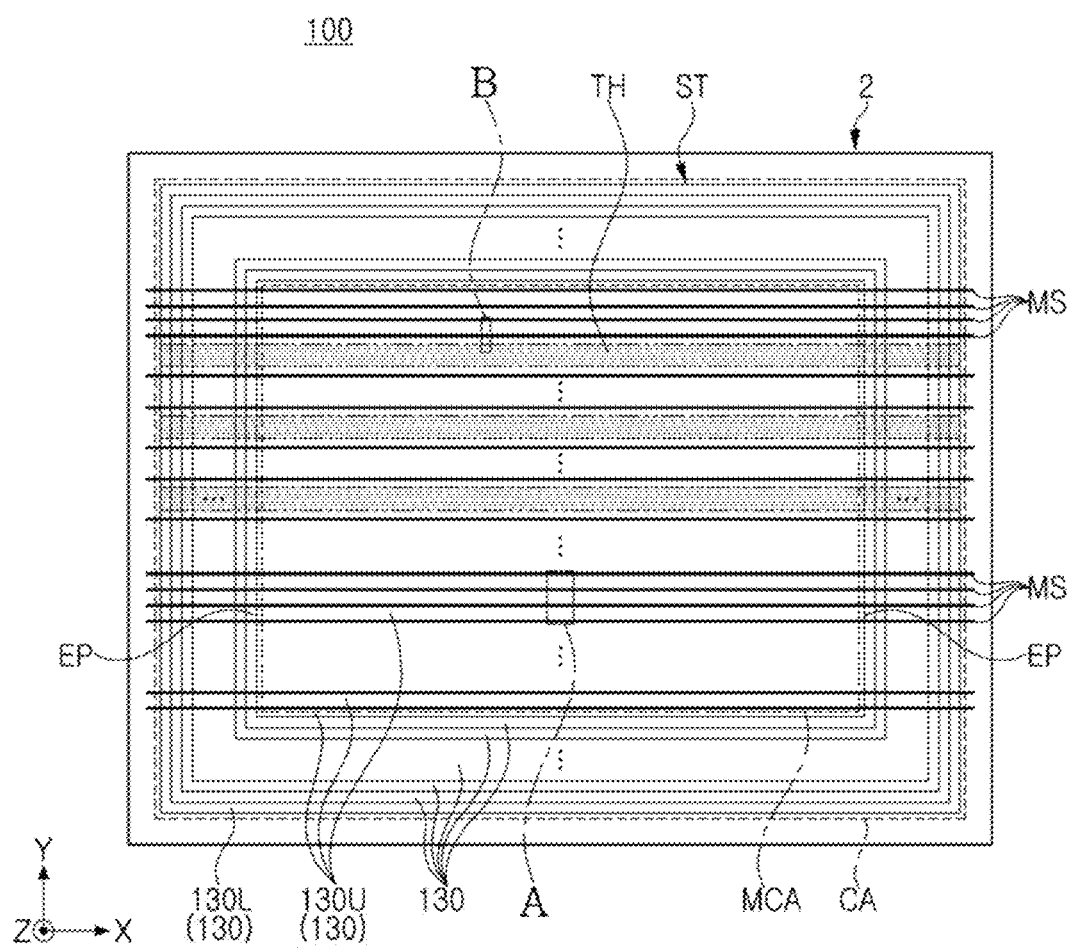
FIG. 1 is a schematic plan view of a semiconductor device according to example embodiments.

FIG. 1 is a schematic plan view of a semiconductor device according to example embodiments. FIG. 1 schematically illustrates a layout of a semiconductor device in a plan view.

Figure 2A:
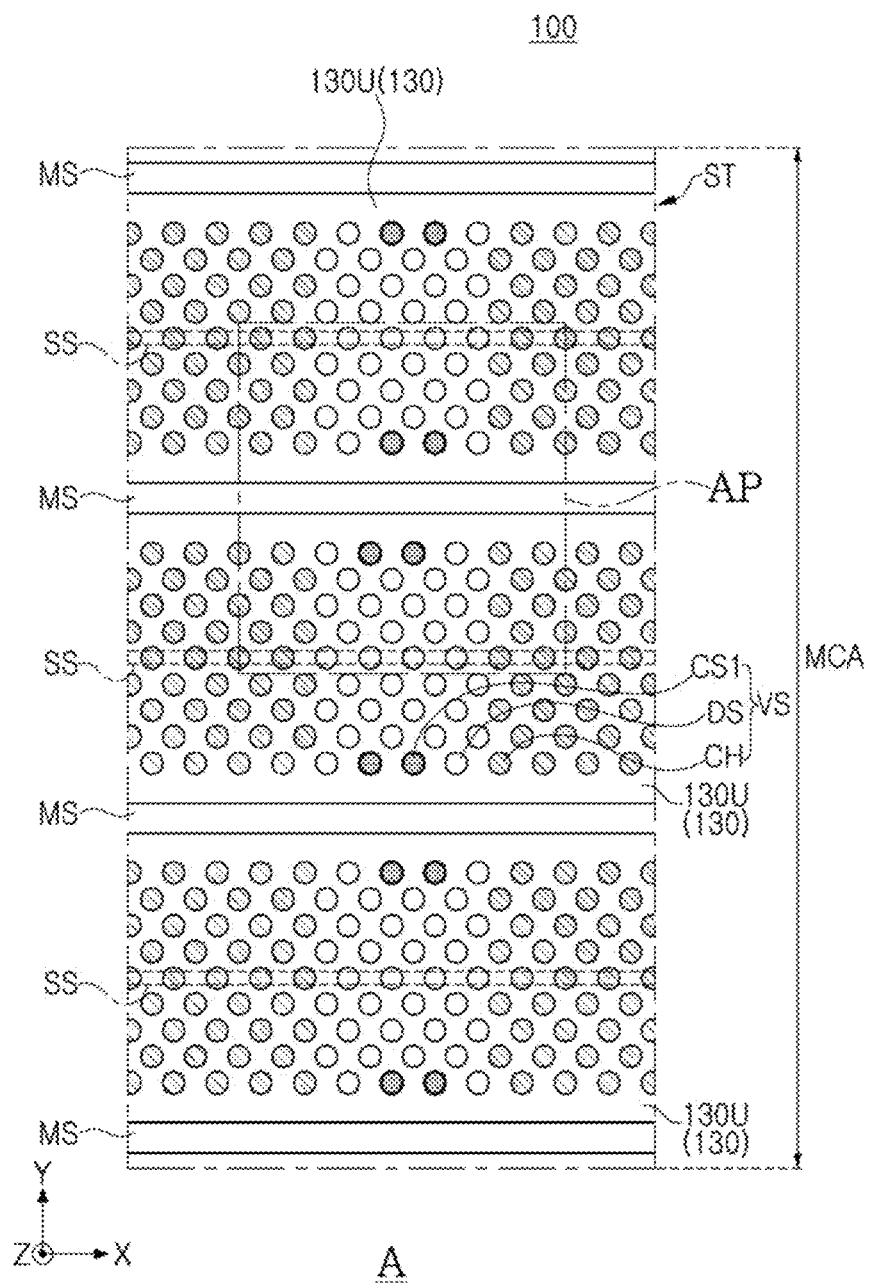
FIGS. 2A, 2B, and 2C are partially enlarged plan views illustrating a semiconductor device according to example embodiments.
Figure 2B:
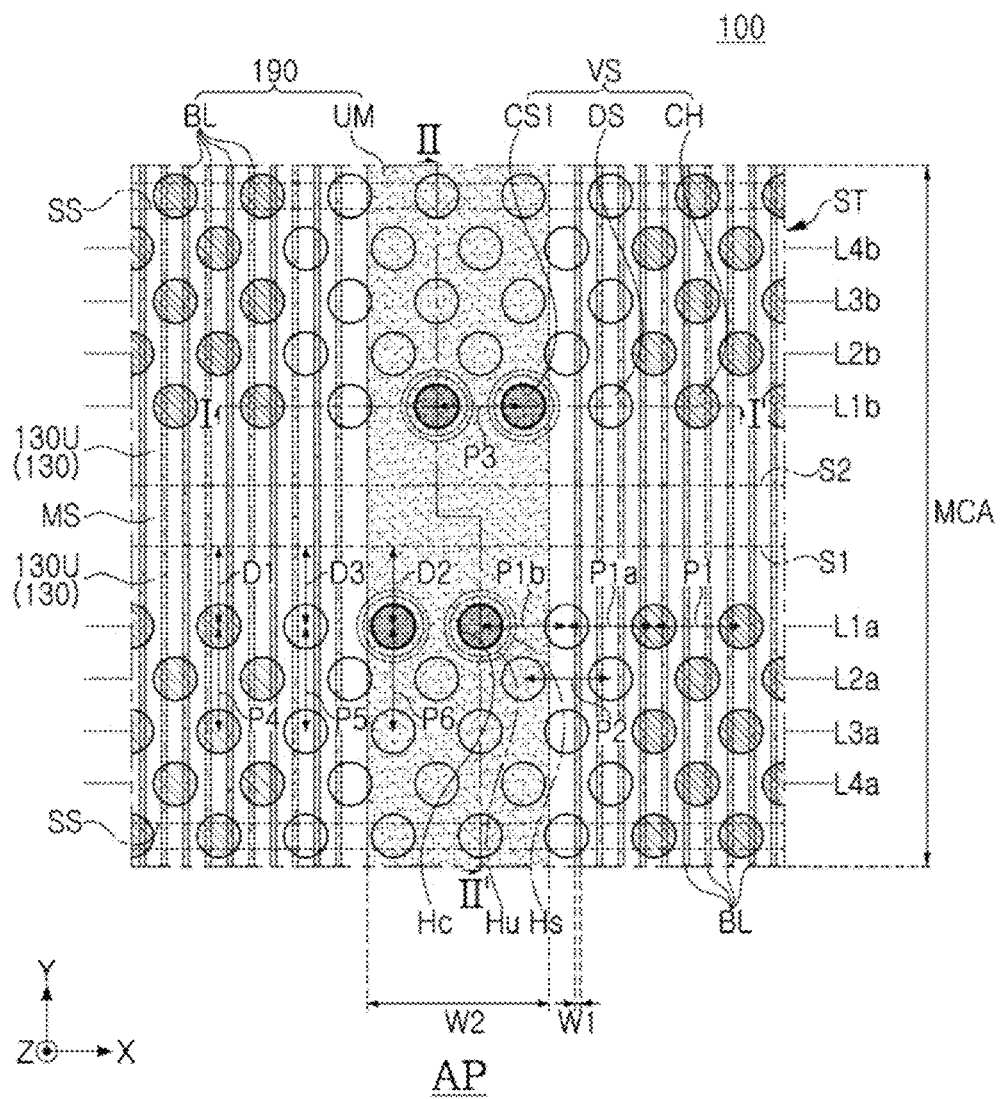
Figure 2C:
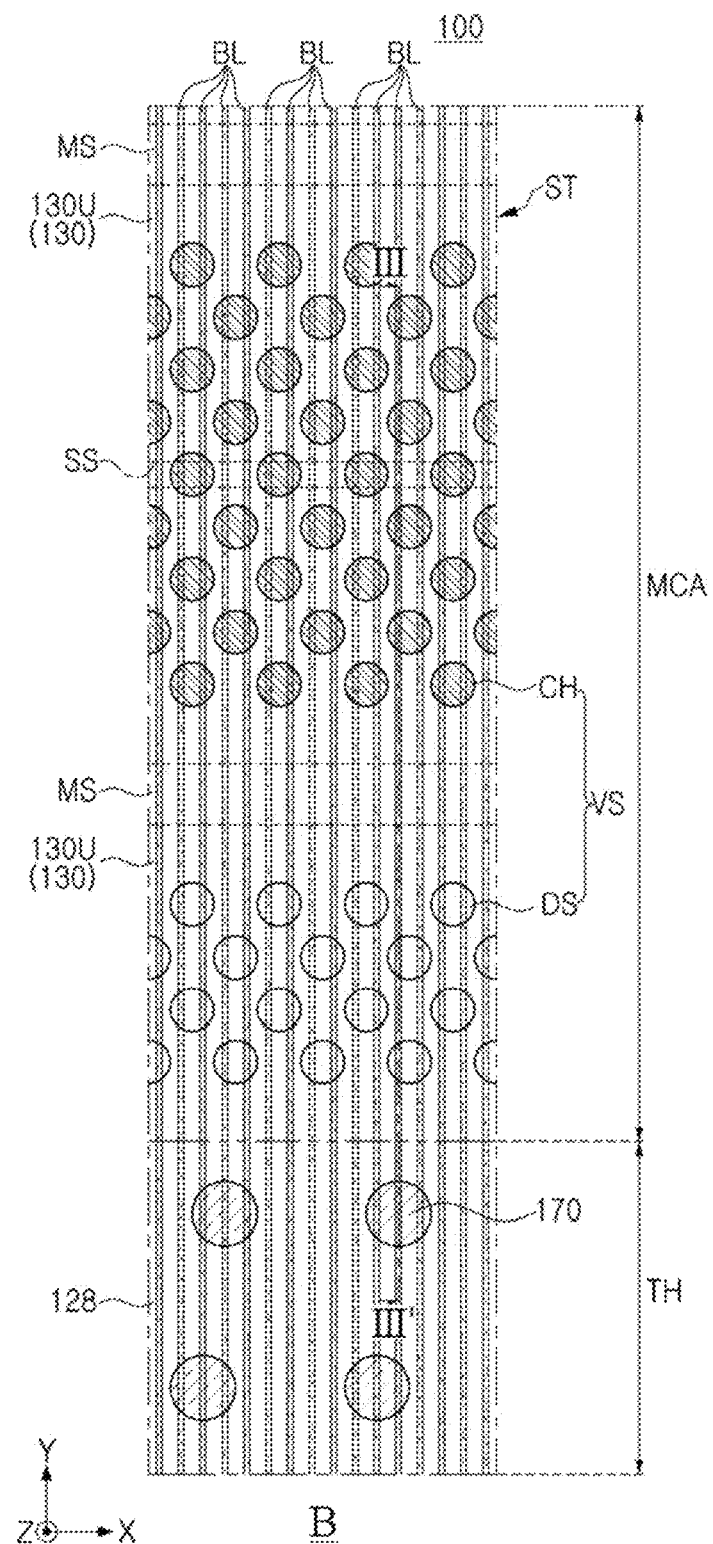

FIGS. 2A, 2B, and 2C are partially enlarged plan views illustrating a semiconductor device according to example embodiments. FIG. 2A is an enlarged view of region "A" of FIG. 1, FIG. 2B is an enlarged view of region "AP" of FIG. 2A, and FIG. 2C is an enlarged view of region "B" of FIG. 1.

Figure 3A:
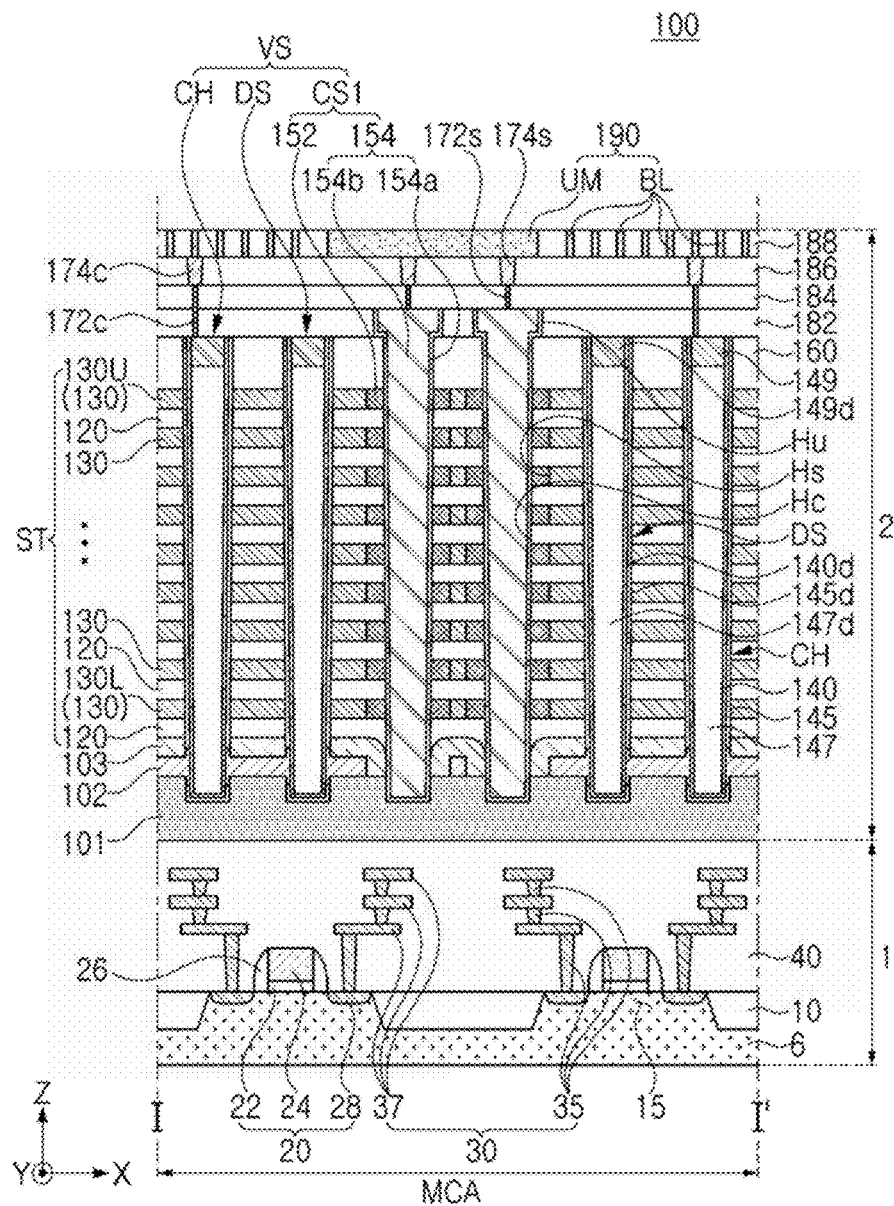
FIGS. 3A, 3B, and 3C are schematic cross-sectional views illustrating a semiconductor device according to example embodiments.
Figure 3B:
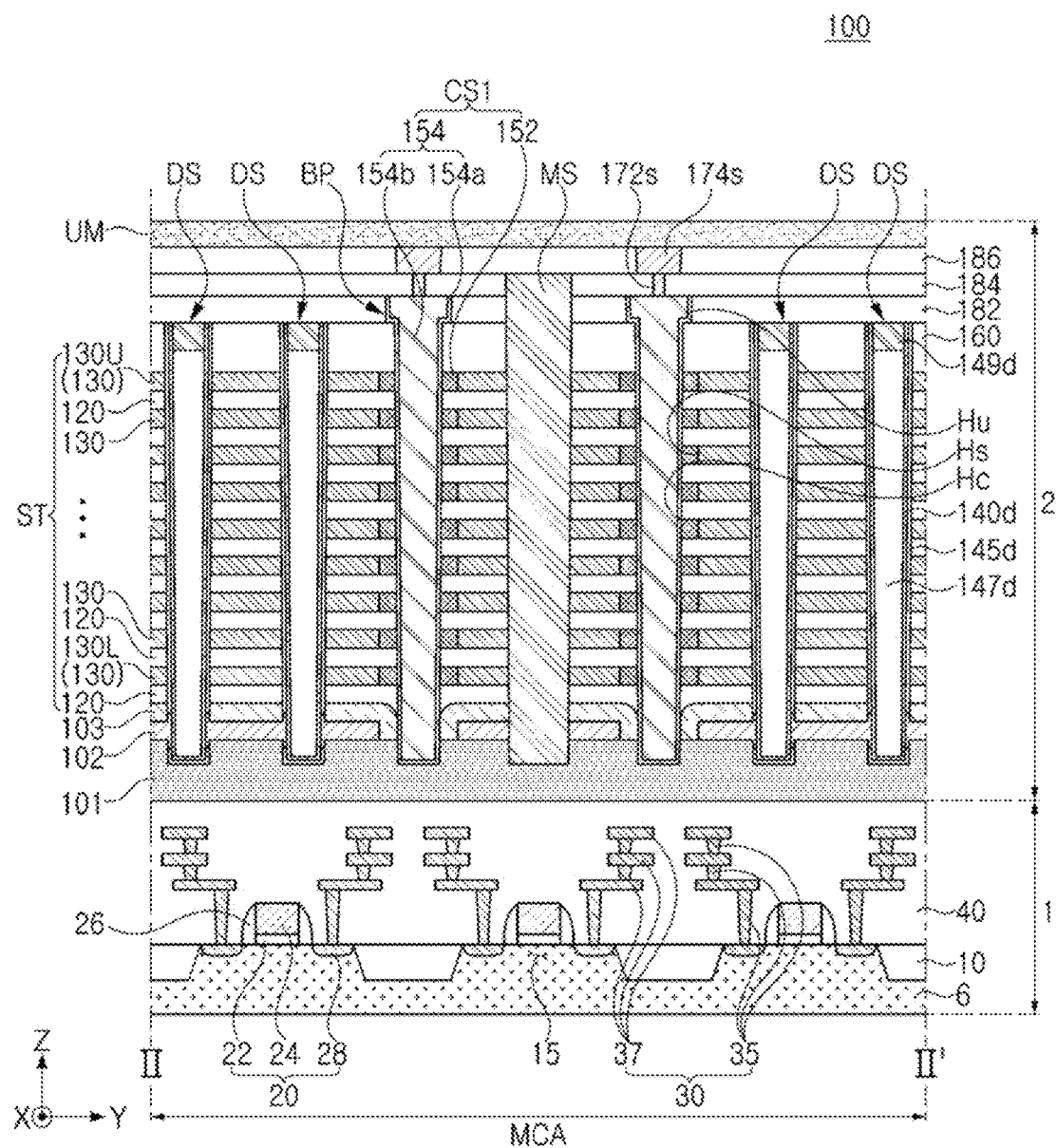
Figure 3C:
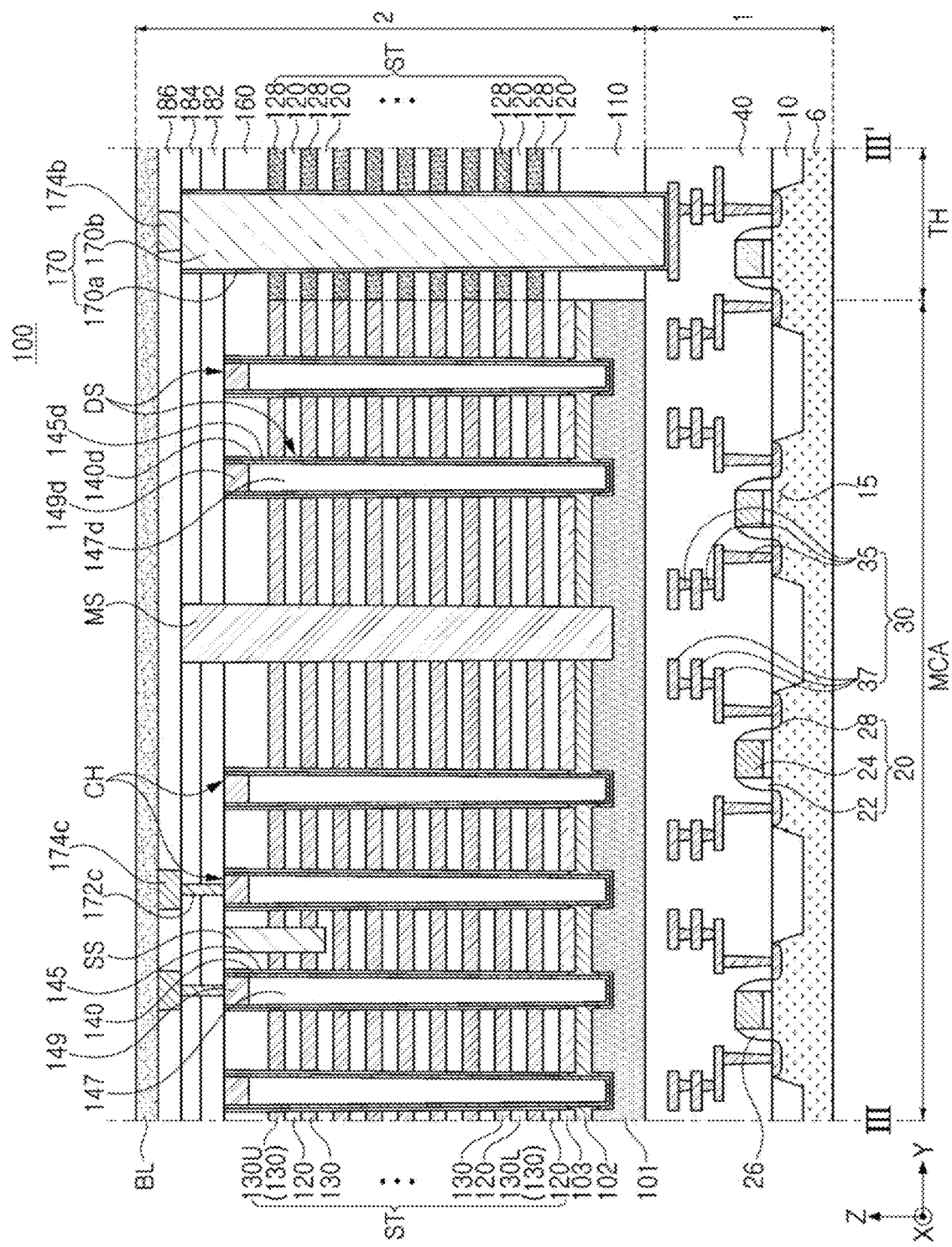

FIGS. 3A, 3B, and 3C are schematic cross-sectional views of a semiconductor device according to example embodiments. FIG. 3A is a cross-sectional view taken along line I-I' of FIG. 2B, FIG. 3B illustrates a cross-sectional view taken along line II-IF of FIG. 2B, and FIG. 3C is a cross-sectional view taken along line of FIG. 2C.

Referring to FIGS. 1 to 3C, a semiconductor device 100 may include a first structure 1 and a second structure 2 on the first structure 1. The first structure 1 may include a region in which peripheral circuit regions for operation of memory cells of the semiconductor device 100 are disposed, and may provide a row decoder, a page buffer, and other peripheral circuits. The second structure 2 may provide a region in which the memory cells are disposed.

The first structure 1 may include a substrate 6, circuit elements 20 on the substrate 6, a lower wiring structure 30 electrically connected to the circuit elements 20, and a lower capping layer 40.

The second structure 2 may include a conductive plate layer 101, a stack structure ST including interlayer insulating layers 120 and gate electrodes 130 alternately stacked on the conductive plate layer 101, a plurality of vertical structures VS penetrating through the stack structure ST, and at least one separation structure MS penetrating through the stack structure ST and extending in one direction. The second structure 2 may further include a first pattern layer 102, a second pattern layer 103, a lower through-insulating layer 110, sacrificial insulating layers 128, a string separation structure SS, an upper capping layer 160, a through-plug 170, upper contacts 172c, 174c, 174b, 172s, and 174s, upper insulating layers 182, 184, 186, and 188, and an upper wiring structure 190.

The substrate 6 may include a semiconductor material, such as a group IV semiconductor, a group III-V compound semiconductor, or a group II-VI compound semiconductor. The group IV semiconductor may include silicon (Si), germanium (Ge), or silicon-germanium (SiGe). The substrate 6 may be a single crystal silicon substrate.

Device isolation layers 10 may be disposed in the substrate 6, and source/drain regions 28 including impurities may be disposed in a portion of an active region 15 defined between the device isolation layers 10.

The circuit elements 20 may include a transistor including a circuit gate dielectric layer 22, a circuit gate electrode 24, and source/drain regions 28. The source/drain regions 28 may be disposed on both sides of the circuit gate electrode 24 in the active region 15. The spacer layer 26 may be disposed on both sides of the circuit gate electrode 24 to insulate the circuit gate electrode 24 and the source/drain region 28 from each other. The circuit gate dielectric layer 22 may include silicon oxide, silicon nitride, silicon oxynitride, or a high-k material. The circuit gate electrode 24 may include at least one of titanium nitride (TiN), tantalum nitride (TaN), tungsten nitride (WN), titanium silicon nitride (TiSiN), tantalum silicon nitride (TaSiN), tungsten silicon nitride (WSiN), tungsten (W), copper (Cu), aluminum (Al), molybdenum (Mo), and ruthenium (Ru). The circuit gate electrode 24 may include a semiconductor layer, e.g., a doped polycrystalline silicon layer, and may include a material layer such as a metal-semiconductor compound. In an example embodiment, the circuit gate electrode 24 may include two or more multilayer structures.

The lower wiring structure 30 may be electrically connected to the circuit gate electrodes 24 and the source/drain regions 28 of the circuit elements 20. The lower wiring structure 30 may include lower contact plugs 35 having a cylindrical or truncated cone shape and lower wiring lines 37 having at least one region in a line shape. Some of the lower contact plugs 35 may be connected to the source/drain regions 28, and although not shown, other portions of the lower contact plugs 35 may be connected to the circuit gate electrodes 24. The lower contact plugs 35 may electrically connect the lower wiring lines 37 disposed on different levels from an upper surface of the substrate 6 to each other. The lower wiring structure 30 may include a conductive material, e.g., tungsten (W), copper (Cu), aluminum (Al), and the like, and each of the components may further include a diffusion barrier including at least one of titanium (Ti), titanium nitride (TiN), tantalum (Ta), tantalum nitride (TaN), and tungsten nitride (WN). In some example embodiments, the number and arrangement of the lower contact plugs 35 and the lower wiring lines 37 constituting the lower wiring structure 30 may be variously changed.

The lower capping layer 40 may be disposed to cover the substrate 6, the circuit elements 20, and the lower wiring structure 30. The lower capping layer 40 may be formed of a material such as silicon oxide, silicon nitride, silicon oxynitride, or silicon oxycarbide. The lower capping layer 40 may include a plurality of insulating layers. The lower capping layer 40 may include an etch stop layer formed of silicon nitride.

The conductive plate layer 101 may be disposed on the first structure 1. The stack structure ST may be disposed on the conductive plate layer 101. The conductive plate layer 101 may include a semiconductor material, e.g., polycrystalline silicon containing an N conductivity-type impurity. In the conductive plate layer 101, a region formed of polycrystalline silicon including an N conductivity-type impurity may include a common source region.

The first pattern layer 102 and the second pattern layer 103 may be disposed on the conductive plate layer 101. The first pattern layer 102 may be in contact with the conductive plate layer 101 and may extend along an upper surface of the conductive plate layer 101. At least one of the first pattern layer 102 and the second pattern layer 103 may function as a portion of a common source region of the semiconductor device 100 together with the conductive plate layer 101. The first pattern layer 102 may penetrate through a gate dielectric layer 145 and contact a channel layer 140. The first pattern layer 102 may be directly connected to the channel layer 140 around the channel layer 140. The first pattern layer 102 and the second pattern layer 103 may include a semiconductor material such as polycrystalline silicon. The first pattern layer 102 may be a layer doped with an impurity of the same conductivity-type as that of the conductive plate layer 101. The second pattern layer 103 may be a doped layer, may be a layer including impurities diffused from the first pattern layer 102, or may be formed of an insulating material.

Referring to FIG. 3C, the lower through-insulating layer 110 may penetrate the conductive plate layer 101 in a vertical direction, e.g., in a Z direction. The lower through-insulating layer 110 may be disposed in a region from which a portion of the conductive plate layer 101 is removed so that a side surface thereof may be surrounded by the conductive plate layer 101. The lower through-insulating layer 110 may also penetrate through the first pattern layer 102 and the second pattern layer 103 in the Z direction. An upper surface of the lower through-insulating layer 110 may be substantially coplanar with the upper surface of the second pattern layer 103, but a lower surface thereof may be substantially coplanar with the lower surface of the conductive plate layer 101 or may be located on a lower level than the lower surface of the conductive plate layer 101. The lower through-insulating layer 110 may include an insulating material, e.g., at least one of silicon oxide, silicon nitride, and silicon oxynitride.

Referring to FIG. 1, the stack structure ST may include a memory cell array region MCA and a connection region CA surrounding at least one side of the memory cell array region MCA in a plan view.

The memory cell array region MCA may be a region in which the gate electrodes 130 are stacked to be spaced apart from each other in the Z direction, and in which a plurality of vertical structures VS and through-plugs 170 are disposed. The memory cell array region MCA may be a partial region of the stack structure ST overlapping an upper gate electrode 130U, e.g., an uppermost gate electrode among the gate electrodes 130 in the Z direction. For example, the memory cell array region MCA may be a partial region of the stack structure ST overlapping an internal region between end portions EP of the upper gate electrode 130U in the Z direction.

The connection region CA may be a region in which the gate electrodes 130 form a step structure. Referring to FIG. 1, the connection region CA may be disposed to surround the memory cell array region MCA in a plan view. The connection region CA may be a region providing a pad region for the gate electrodes 130 forming the step structure to be connected to the gate contact plugs. An insulating region penetrating through the stack structure ST may be provided in a partial region of the connection region CA to electrically connect the gate contact plugs to the circuit elements 20 of the first structure 1.

Referring to FIG. 1, the stack structure ST may further include a through-insulating region TH extending from a partial region of the memory cell array region MCA toward the connection region CA in a plan view. The through-insulating region TH may be spaced apart from the separation structure MS. Referring to FIGS. 2C and 3C, in the through-insulating region TH, the through-plugs 170 may be disposed to penetrate through the sacrificial insulating layers 128 and the interlayer insulating layers 120 of the stack structure ST in the Z direction. The through-insulating region TH may extend, e.g., in the X direction, and may be arranged in plurality. The arrangement and/or number of the through-insulating regions TH may be variously changed according to example embodiments.

The gate electrodes 130 may be stacked to be spaced apart from each other in the Z direction on the conductive plate layer 101 in the memory cell array region MCA. The gate electrodes 130 may be separated by the separation structures MS that extend in the X direction. The gate electrodes 130 may include lower gate electrodes 130L, e.g., including a lowermost gate electrode among the gate electrodes 130, forming a gate of a ground select transistor, memory gate electrodes forming a plurality of memory cells, and upper gate electrodes 130U forming the gates of string select transistors. A storage capacity of the semiconductor device 100 may be determined according to the number of the memory gate electrodes constituting the memory cells. In some example embodiments, the gate electrodes 130 may further include a gate electrode disposed above the upper gate electrodes 130U and/or below the lower gate electrodes 130L and forming an erase transistor used for an erase operation using a gate induced drain leakage (GIDL) phenomenon.

The gate electrodes 130 may extend to have different lengths in the X direction to form a step structure in the form of a step. Due to the step structure, the lower gate electrode 130L of the gate electrodes 130 may extend, relative to the upper gate electrode 130U, to have an upwardly exposed pad region. The step structure of the gate electrodes 130 may be varied, e.g., the gate electrodes 130 may form a step structure in the X direction and a step structure in the Y direction between the pair of separation structures MS.

The gate electrodes 130 may be disposed to be separated from each other in the Y direction by the separation structure MS extending in the X direction. The gate electrodes 130 between the pair of separation structures MS may form one memory block, for example. The gate electrodes 130 may each include a first layer and a second layer. The first layer may cover upper and lower surfaces of the second layer, and may extend between the channel structure CH and the second layer. The first layer may include a high dielectric material such as aluminum oxide (AlO). The second layer may include at least one of titanium (Ti), titanium nitride (TiN), tantalum (Ta), tantalum nitride (TaN), tungsten (W), and tungsten nitride (WN). In some example embodiments, the gate electrodes 130 may include polycrystalline silicon or a metal-semiconductor compound.

The interlayer insulating layers 120 may be disposed between the gate electrodes 130 in the memory cell array region MCA. Like the gate electrodes 130, the interlayer insulating layers 120 may be stacked apart from each other in the vertical direction Z and may extend in the X direction.

The interlayer insulating layers 120 may extend to the through-insulating region TH and be disposed between the sacrificial insulating layers 128. The interlayer insulating layers 120 may include an insulating material such as silicon oxide, silicon nitride, or silicon oxynitride. Some of the interlayer insulating layers 120 may have different thicknesses.

The sacrificial insulating layers 128 may be positioned on substantially the same level as that of the gate electrodes 130 in the through-insulating region TH, and may electrically insulate the gate electrodes 130 from the through-plugs 170. The sacrificial insulating layers 128 may at least partially overlap the lower through-insulating layer 110 in the Z direction. The sacrificial insulating layers 128 may include an insulating material such as silicon nitride. Side surfaces of the sacrificial insulating layers 128 may contact side surfaces of the gate electrodes 130 at a boundary of the through-insulating region TH. Portions of the sacrificial insulating layers 128 may not be removed, but may remain in the through-insulating region TH in the process of removing the sacrificial insulating layers 128 through isolation openings (described below as "OP" in FIG. 17C).

As shown in FIGS. 2A and 2B, a plurality of vertical structures VS may be spaced apart from each other, while forming rows and columns in the memory cell array region MCA. The plurality of vertical structures VS may be arranged to form a lattice pattern or arranged in a zigzag form in one direction. Each of the plurality of vertical structures VS may penetrate through the stack structure ST in the Z direction to contact the conductive plate layer 101. The plurality of vertical structures VS may also penetrate through the first pattern layer 102 and the second pattern layer 103 in the Z direction.

Referring to FIG. 2B, the plurality of vertical structures VS may be arranged along a plurality of array lines, e.g., array lines L1a, L2a, L3a, L4a, L1b, L2b, L3b, and L4b, which are disposed to be sequentially arranged in a direction away from at least one side of the separation structure MS in a plan view. The array lines L1a, L2a, L3a, L4a, L1b, L2b, L3b, and L4b may extend in the X direction, and may be spaced apart from each other at regular intervals, e.g., a constant interval, in the Y direction. The number of array lines arranged in a pair of separation structures MS may be variously changed in example embodiments. The array lines L1a, L2a, L3a, L4a, L1b, L2b, L3b, and L4b may include, e.g., a first array line L1a, a second array line L2a, a third array line L3a, and a fourth array line L4a parallel to the first surface S1 of the separation structure MS, and the first array line L1a may be an array line closest to the separation structure MS in the Y direction.

The plurality of vertical structures VS may include channel structures CH, dummy structures DS, and contact structures CS1. The plurality of vertical structures VS may be arranged at a constant pitch in the memory cell array region MCA. For example, the channel structures CH, the dummy structures DS, and the contact structures CS1 may be arranged at a constant pitch in the memory cell array region MCA and may have a uniform pattern, e.g., a lattice pattern. Since the plurality of vertical structures VS are formed to have a uniform pattern in the memory cell array region MCA and the contact structures CS1 may be formed by replacing the dummy structures DS in a hole pattern in which some of the dummy structures DS are arranged in regions in which the dummy structures DS are arranged, the degree of integration of the semiconductor device 100 may be improved and the degree of freedom in layout design may be improved. Since the contact structures CS1 may be formed in the memory cell array region MCA, while maintaining pattern continuity, the degree of integration and reliability of the semiconductor device may be improved.

Each of the channel structures CH may form one memory cell string. The channel structures CH may be arranged at a constant first pitch P1 in the X direction. The channel structures CH may be arranged at a constant fourth pitch P4 in the Y direction. The center of the channel structure CH disposed on the first array line L1a may be spaced apart from the first surface S1 of the separation structure MS in the Y direction by a first distance D1. The channel structures CH may have a pillar shape, and may have inclined side surfaces that are narrower in width toward the conductive plate layer 101 according to an aspect ratio.

The channel layer 140 may be disposed in the channel structures CH. In the channel structures CH, the channel layer 140 may be formed in an annular shape surrounding an inner core insulating layer 147, and the inner core insulating layer 147 may thus be disposed on an inner surface of the channel layer 140. The channel layer 140 may be in contact with the first pattern layer 102 at a lower portion and may be electrically connected to the conductive plate layer 101. The channel layer 140 may include a semiconductor material such as polycrystalline silicon or monocrystalline silicon.

A channel pad 149 may be disposed on the channel layer 140 in the channel structures CH. The channel pad 149 may be disposed to cover an upper surface of the inner core insulating layer 147 and may be electrically connected to the channel layer 140. The channel pad 149 may contact an upper region of the channel layer 140. The channel pad 149 may include a semiconductor material such as polycrystalline silicon or monocrystalline silicon, and may include, e.g., doped polycrystalline silicon.

The gate dielectric layer 145 may extend between the gate electrodes 130 and the channel layer 140. The gate dielectric layer 145 may include a tunneling layer, an information storage layer, and a blocking layer sequentially stacked from the channel layer 140. The tunneling layer may tunnel charges into the information storage layer and may include, e.g., silicon oxide ($SiO_2$), silicon nitride ($Si_3N_4$), silicon oxynitride (SiON), or a combination thereof. The information storage layer may be a charge trap layer and may include silicon nitride or silicon oxynitride. The blocking layer may include silicon oxide ($SiO_2$), silicon nitride ($Si_3N_4$), silicon oxynitride (SiON), a high-k dielectric material, or a combination thereof.

The dummy structure DS may be disposed adjacent to the channel structures CH and the contact structures CS1 as illustrated in FIGS. 2A and 2B. The dummy structures DS may be arranged at a second pitch P2 substantially equal to the first pitch P1 in the X direction. In this specification, "substantially the same" refers to the sameness or a difference within a range of deviations occurring in terms of a manufacturing process, and may be interpreted as having the same meaning even when the expression "substantially" is omitted. The dummy structures DS may be disposed at a fifth pitch P5 substantially equal to the fourth pitch P4 in the Y direction. The dummy structure DS may be spaced apart from the adjacent channel structure CH in the X direction by a predetermined pitch P1a substantially equal to the first pitch P1. A center of the dummy structure DS disposed on the first array line L1a may be spaced apart from the first surface S1 of the separation structure MS by a third distance D3 in the Y direction. The first distance D1 and the third distance D3 may be substantially the same as each other.

Referring to FIG. 2C, the dummy structures DS may also be disposed between the through-insulating region TH and the separation structure MS in a region adjacent to the through-insulating region TH in the memory cell region MCA. The dummy structures DS may be disposed to be spaced apart from each other, while forming rows and columns similar to the channel structures CH, and may be disposed to form a lattice pattern or disposed in a zigzag shape in one direction.

The dummy structure DS may have the same or similar structure to the channel structure CH, but may not perform a substantial function when the memory cell operates in the semiconductor device 100. Unlike the channel structures CH, the dummy structures DS may not be electrically connected to the bit lines BL. However, since the insulating patterns 152 of the contact structure CS1 extend horizontally, patterns adjacent to the contact structure CS1 may be formed of the dummy structures DS, so that the channel structures CH may be protected. When the dummy structure DS is formed to have a structure similar to that of the channel structure CH, the dummy structure DS may include a dummy channel layer 140d, a dummy gate dielectric layer 145d, a dummy core insulating layer 147d, and a dummy channel pad 149d to correspond to components of the channel structure CH. In an example embodiment, the dummy structure DS may have a structure different from that of the channel structure CH, and, e.g., an inside thereof may be formed of an insulating material such as silicon oxide.

The contact structure CS1 may be, e.g., a source contact structure connected to the conductive plate layer 101. The contact structure CS1 may be spaced apart from the first pattern layer 102. The contact structure CS1 may be disposed to pass through the upper gate electrode 130U and the lower gate electrode 130L in the Z direction in the memory cell array region MCA. The contact structure CS1 may be disposed adjacent to the separation structure MS as illustrated in FIGS. 2A and 2B. For example, the contact structure CS1 may include at least one contact structure CS1, and the at least one contact structure CS1 may be disposed on an array line L1a closest to the first surface S1 of the separation structure MS. The at least one contact structure CS1 may be disposed on the array line L1b closest to the second surface S2 opposite to the first surface S1 of the separation structure MS.

At least one contact structure CS1 disposed on one array line L1a or L1b may be arranged at a third pitch P3 substantially equal to the first pitch P1 in the X direction. The contact structure CS1 may be spaced apart from the adjacent dummy structures DS by a sixth pitch P6 substantially equal to the fifth pitch P5 in the Y direction. At least one contact structure CS1 disposed on the array line L1a or L1b may be spaced apart from the adjacent dummy structure DS in the X direction by a predetermined pitch P1b substantially equal to the first pitch P1. A center of the contact structure CS1 disposed on the first array line L1 may be spaced apart from the first surface S1 of the separation structure MS by a second distance D2 in the Y direction. The second distance D2 may be substantially equal to the first distance D1. At least one contact structure CS1 disposed on at least one array line, e.g., array line L1a or L1b, may be aligned with adjacent channel structures CH and dummy structure DS in the X direction.

The contact structure CS1 may include a contact plug 154 disposed in a contact hole Hc passing through the stack structure ST and insulating patterns 152 surrounding at least a portion of a side surface of the contact plug 154. The contact hole Hc may extend upwardly in the Z direction to be connected to an upper open region Hu exposing inner side surfaces of a first upper insulating layer 182 on the upper capping layer 160. The contact plug 154 may extend to the upper open region Hu, and may have a portion BP in which a side surface of the upper region is bent. The insulating patterns 152 may be disposed in side regions extending from the side surface of the contact hole Hc toward the gate electrodes 130. For example, the insulating patterns 152 may extend horizontally from the contact hole Hc toward an extension portion Hs to have a greater width than the contact hole Hc. The insulating patterns 152 may be patterns surrounding the contact plug 154 in a ring shape.

The insulating patterns 152 may extend from a side surface of a barrier layer 154a of the contact plug 154 toward the gate electrodes 130 at a corresponding level between the interlayer insulating layers 120. The insulating patterns 152 may be disposed between a lower surface of an upper interlayer insulating layer 120 and an upper surface of a lower interlayer insulating layer 120, among the interlayer insulating layers 120. The insulating patterns 152 may electrically insulate the contact plug 154 from the gate electrodes 130. The insulating patterns 152 of each of the contact structures CS1 may be connected to each other between the adjacent contact structures CS1 in the X direction. The insulating patterns 152 may include a material such as silicon oxide, silicon oxynitride, or silicon oxycarbide.

The contact plug 154 may include the barrier layer 154a and a metal plug 154b. The barrier layer 154a may surround lower surface and side surfaces of the metal plug 154b. The barrier layer 154a may include, e.g., at least one of titanium (Ti), titanium nitride (TiN), tantalum (Ta), tantalum nitride (TaN), tungsten nitride (WN), and tungsten carbon nitride (WCN). The metal plug 154b may include a conductive material, e.g., at least one of tungsten (W), copper (Cu), and aluminum (Al).

In general, if a contact structure were to be connected with an edge portion of a conductive plate layer in a plan view, a semiconductor material layer of the conductive plate layer may provide an electrical connection path from the edge portion of the conductive plate layer to a channel structure of a memory cell array region. The electrical connection path may have a fairly long length from the edge portion of the conductive plate layer to the channel structure of the memory cell array region. In this case, noise occurring due to a resistance component of the conductive plate layer may interfere with the operation (e.g., a read operation) of a memory cell. For example, when a current flows into a common source region of the conductive plate layer, a resistance component of the conductive plate layer may cause a voltage drop in the common source region, so that a read operation of the memory cell may not be properly performed. Example embodiments described herein may mitigate or avoid such a situation.

For example, according to an example embodiment, the contact structure CS1 (which is a source contact structure) may be disposed to be connected to a middle region of the conductive plate layer 101 in the memory cell array region MCA, and, as such, a length of an electrical connection path from a portion in which the contact structure CS1 contacts the conductive plate layer 101 to the channel structure CH may be reduced. Thus, a resistance component of the common source region of the conductive plate layer 101 may be reduced, and thus, noise occurring due to the common source region when the memory cell operates may be reduced. In addition, since the resistance component of the common source region may be reduced, the RC delay may also be improved.

According to an example embodiment, the separation structure MS may pass through the stack structure ST in the Z direction and may be disposed to extend in the X direction. The separation structure MS may include a plurality of separation structures MS arranged in parallel in the Y direction, and may separate the gate electrodes 130 from each other in the Y direction. Based on the upper surface of the conductive plate layer 101, the level of the upper surface of the separation structure MS may be higher than the level of the upper surface of the channel structure CH. The separation structure MS may vertically pass through the entire stacked gate electrodes 130 and contact the conductive plate layer 101. The separation structure MS may also pass through the first pattern layer 102 and the second pattern layer 103 in the Z direction. The separation structure MS may have a width decreasing toward the conductive plate layer 101 due to a high aspect ratio. The separation structure MS may include an insulating material such as silicon oxide, silicon nitride, or silicon oxynitride.

A string separation structure SS may extend in the X direction between ones of the separation structures MS. The string separation structure SS may separate upper ones of the gate electrodes 130 including the upper gate electrodes 130U in the Y direction. For example, the string separation structure SS may pass through the upper gate electrode 130U and the second uppermost gate electrode 130 disposed therebelow. The number of gate electrodes 130 separated by the string separation structure SS may be variously changed in example embodiments. The upper gate electrodes 130U separated by the string separation structure SS may form different string selection lines in the semiconductor device 100. The string separation structure SS may include an insulating material, e.g., silicon oxide, silicon nitride, or silicon oxynitride.

The upper capping layer 160 may be disposed on the stack structure ST to cover a portion of side surface of each of the plurality of vertical structures VS, the separation structure MS, the string separation structure SS, and the through-plug 170. An upper surface of the upper capping layer 160 may be substantially coplanar with an upper surface of the channel structure CH and an upper surface of the channel structure DS. The upper capping layer 160 may be formed of a material such as silicon oxide, silicon nitride, silicon oxynitride, or silicon oxycarbide.

Referring to FIG. 2C, a plurality of through-plugs 170 may be disposed to be spaced apart from each other in the through-insulating region TH. The through-plugs 170 may penetrate the sacrificial insulating layers 128 and the interlayer insulating layers 120 of the stack structure ST in the through-insulating region TH, pass through the lower through-insulating layer 110 in the Z direction, and be connected to the lower wiring structure 30 of the first structure 1. For example, the through-plug 170 may pass through the conductive plate layer 101 and land on the uppermost lower wiring line 37 among the lower wiring lines 37. The through-plug 170 may be spaced apart from and insulated from the gate electrodes 130 by the sacrificial insulating layers 128. The through-plug 170 may have an inclined side surface having width narrower toward the bottom according to an aspect ratio. The through-plug 170 may electrically connect the circuit elements 20 of the first structure 1 and the channel layer 140 of the channel structure CH of the second structure 2 to each other. The through-plug 170 may include a barrier layer 170a and a metal plug 170b. Materials forming the barrier layer 170a and the metal plug 170b of the through-plug 170 may be the same as materials forming the barrier layer 154a and the metal plug 154b of the contact structure CS1.

The upper contacts 172c, 174c, 174b, 172s, and 174s may include first channel contacts 172c and 174c, second channel contacts 174b, and source contacts 172s and 174s. The first channel contacts 172c and 174c may be connected to the channel structures CH. The second channel contacts 174b may be connected to the through-plugs 170. The first channel contacts 172c and 174c and the second channel contacts 174b may be connected to the bit lines BL. The source contacts 172s and 174s may be connected to the contact structures CS1 and may be connected to an upper metal pattern UM. The upper contacts 172c, 174c, 174b, 172s, and 174s may each include a conductive layer and a barrier layer covering lower surface and side surfaces of the conductive layer. The barrier layer may include, e.g., at least one of titanium (Ti), titanium nitride (TiN), tantalum (Ta), tantalum nitride (TaN), tungsten nitride (WN), and tungsten carbon nitride (WCN). The conductive layer may include a conductive material, e.g., at least one of tungsten (W), copper (Cu), and aluminum (Al).

The upper insulating layers 182, 184, 186, and 188 may be disposed on the upper capping layer 160, and may include a first upper insulating layer 182, a second upper insulating layer 184, a third upper insulating layer, and a fourth upper insulating layer 188 that are sequentially stacked. An upper surface of the first upper insulating layer 182 may be substantially coplanar with an upper surface of the contact structure CS1. An upper surface of the second upper insulating layer 184 may be substantially coplanar with an upper surface of the separation structure MS. The upper insulating layers 182, 184, 186, and 188 may each be formed of a material such as silicon oxide, silicon nitride, silicon oxynitride, or silicon oxycarbide.

The upper wiring structure 190 may be disposed on the upper contacts 172c, 174c, 174b, 172s, and 174s. The upper wiring structure 190 may include wiring lines extending in the Y direction. For example, the upper wiring structure 190 may include the bit lines BL extending in the Y direction from the channel structures CH, and the upper metal pattern UM extending in the Y direction from the contact structure CS1. The upper wiring structure 190 may include a conductive layer and a barrier layer, similarly to the upper contacts 172c, 174c, 174b, 172s, and 174s.

The bit lines BL may extend over the memory cell array region MCA and the through-insulating region TH as illustrated in FIG. 2C. The bit lines BL may be electrically connected to the channel structures CH among the channel structures CH and the dummy channel structures DHC. The bit lines BL may be arranged at a constant pitch in the X direction. The upper metal pattern UM may be disposed between the bit lines BL on substantially the same level as that of the bit lines BL. The upper metal pattern UM may have a width W2 greater than a width W1 of the bit lines BL in the X direction. The upper metal pattern UM may be electrically connected to the conductive plate layer 101 through the contact structure CS1. For example, a ground signal to ground the conductive plate layer 101 may be applied to the upper metal pattern UM.

Figure 4A:
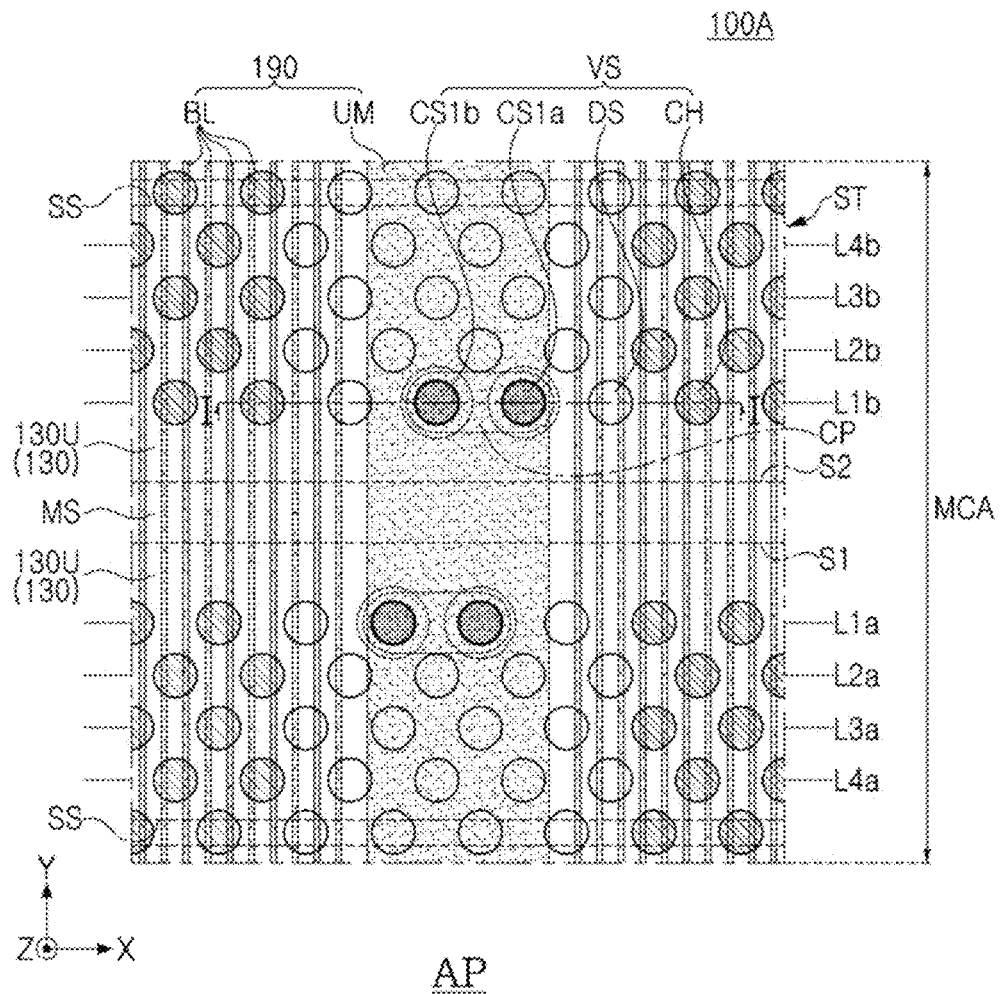
FIG. 4A is a partially enlarged plan view illustrating a semiconductor device according to example embodiments.

FIG. 4A is a partially enlarged plan view of a semiconductor device according to example embodiments. FIG. 4A is an enlarged view of a region corresponding to the region "AP" of FIG. 2A.

Figure 4B:
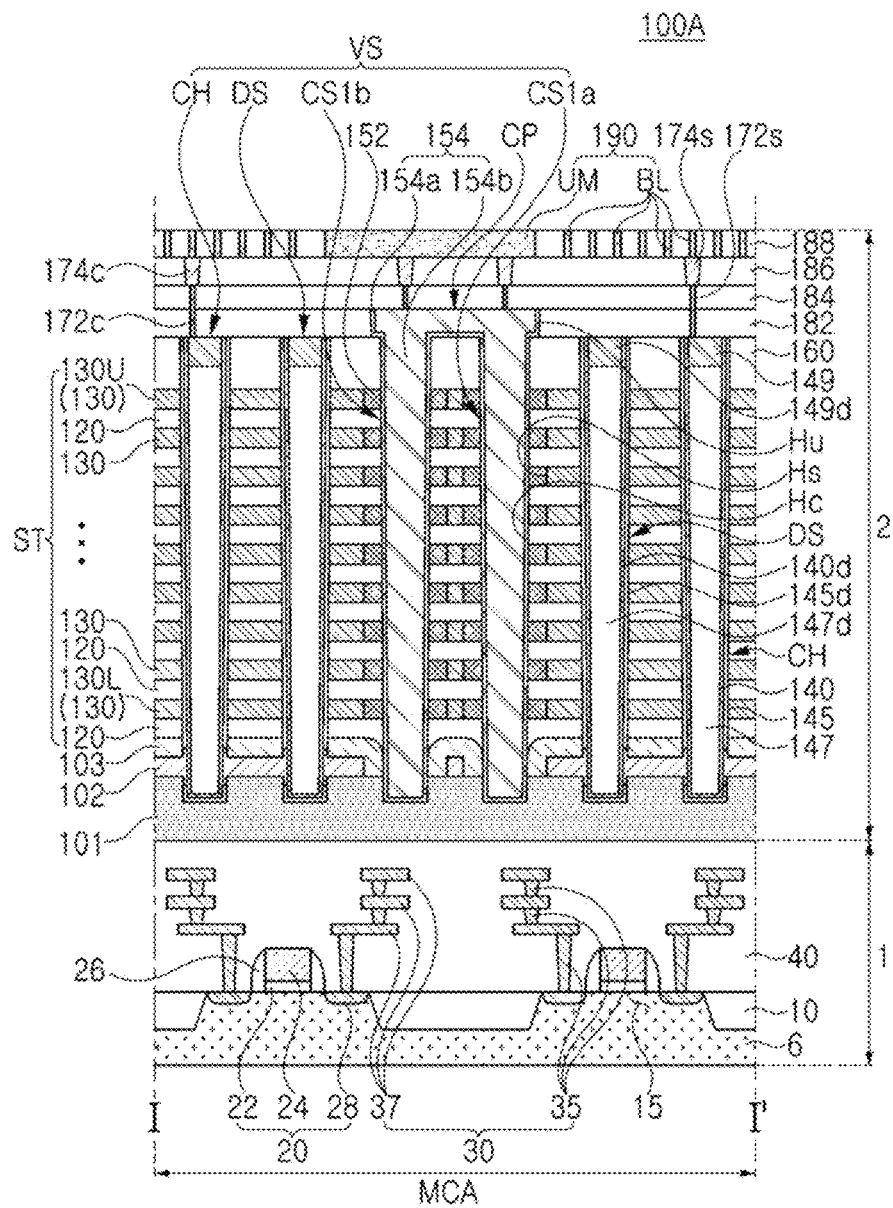
FIG. 4B is a schematic cross-sectional view of a semiconductor device according to example embodiments.

FIG. 4B is a schematic cross-sectional view of a semiconductor device according to example embodiments. FIG. 4B illustrates a cross-section taken along line I-I' of FIG. 4A.

Referring to FIGS. 4A and 4B, in a semiconductor device 100A, a plurality of vertical structures VS may include a contact structure in which a first contact structure CS1a and a second contact structure CS1b, which are adjacent to each other in the X direction on one array line L1a or L1b, are connected, e.g., electrically connected, to each other through a connection pattern, e.g., a source connection pattern CP. For example, the first contact structure CS1a, the second contact structure CS1b, and the source connection pattern CP may be integrally connected to each other as illustrated in FIG. 4B. An alignment margin between the upper open region Hu exposing the first upper insulating layer 182 and the contact holes Hc may be secured.

Figure 5A:
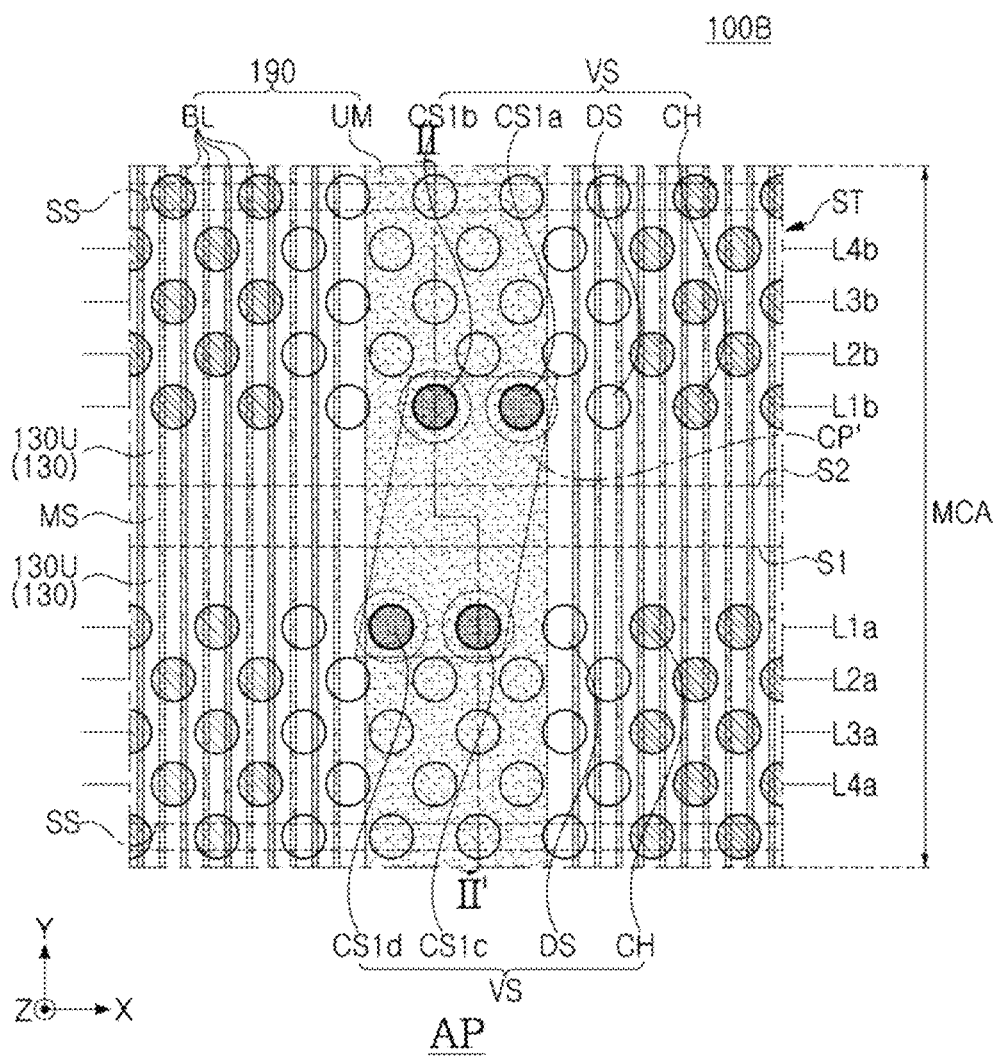
FIG. 5A is a partially enlarged plan view illustrating a semiconductor device according to example embodiments.

FIG. 5A is a partially enlarged plan view of a semiconductor device according to example embodiments. FIG. 5A is an enlarged view of a region corresponding to the region "AP" of FIG. 2A.

Figure 5B:
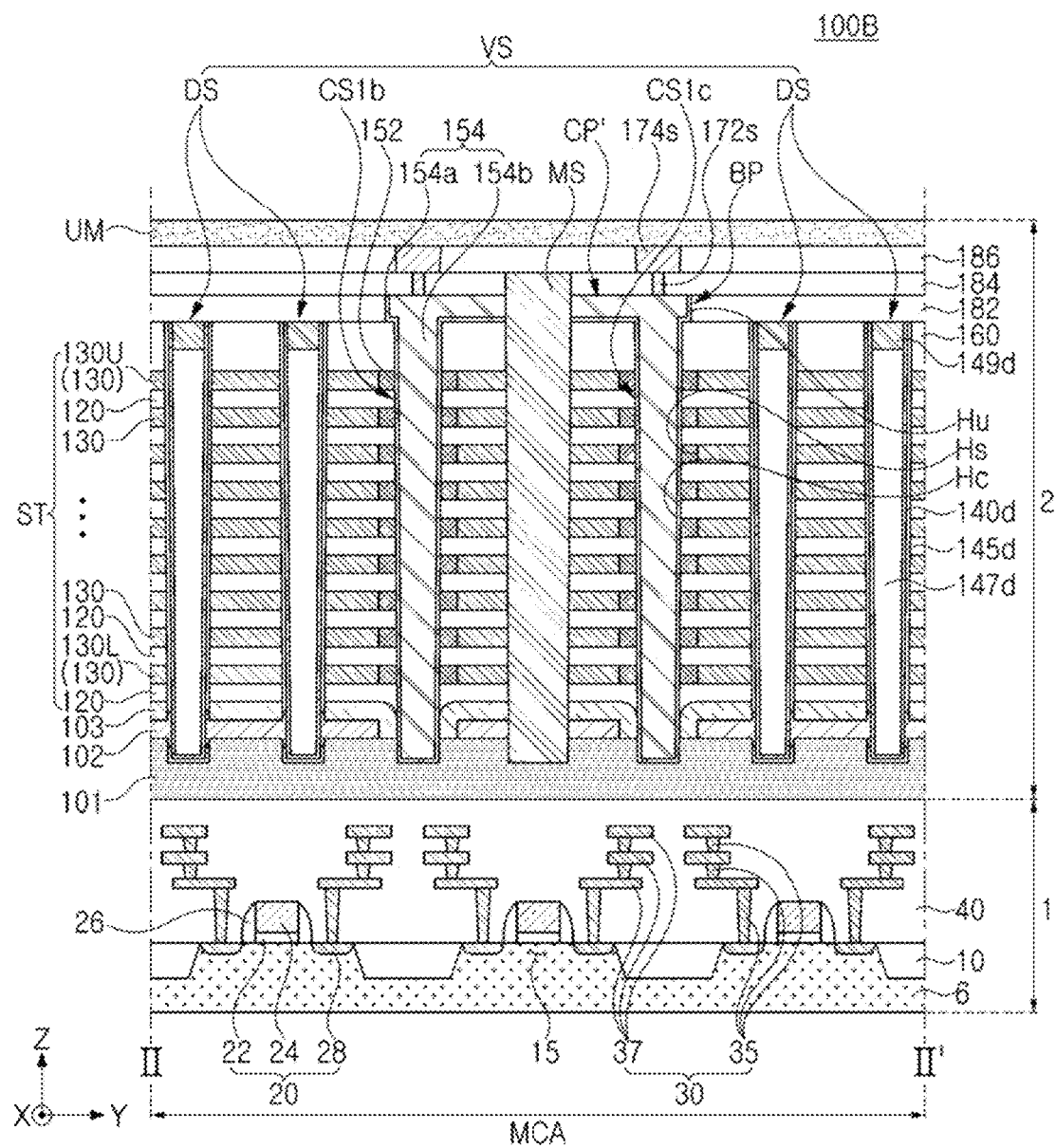
FIG. 5B is a schematic cross-sectional view of a semiconductor device according to example embodiments.

FIG. 5B is a schematic cross-sectional view of a semiconductor device according to example embodiments. FIG. 5B illustrates a cross-section taken along line II-IF in FIG. 5A.

Referring to FIGS. 5A and 5B, in a semiconductor device 100B, in a plurality of vertical structures VS, contact structures CS1a, CS1b, CS1c, and CS1d arranged on array lines L1a and L1b closest to the separation structure MS are connected to each other through a source connection pattern CP'. For example, the contact structures CS1a, CS1b, CS1c, and CS1d and the source connection pattern CP' may be integrally connected to each other as illustrated in FIG. 5B. The source connection pattern CP' may be penetrated by the separation structure MS. An alignment margin of the upper open region Hu exposing the first upper insulating layer 182 and the contact holes Hc may be secured.

Figure 6A:
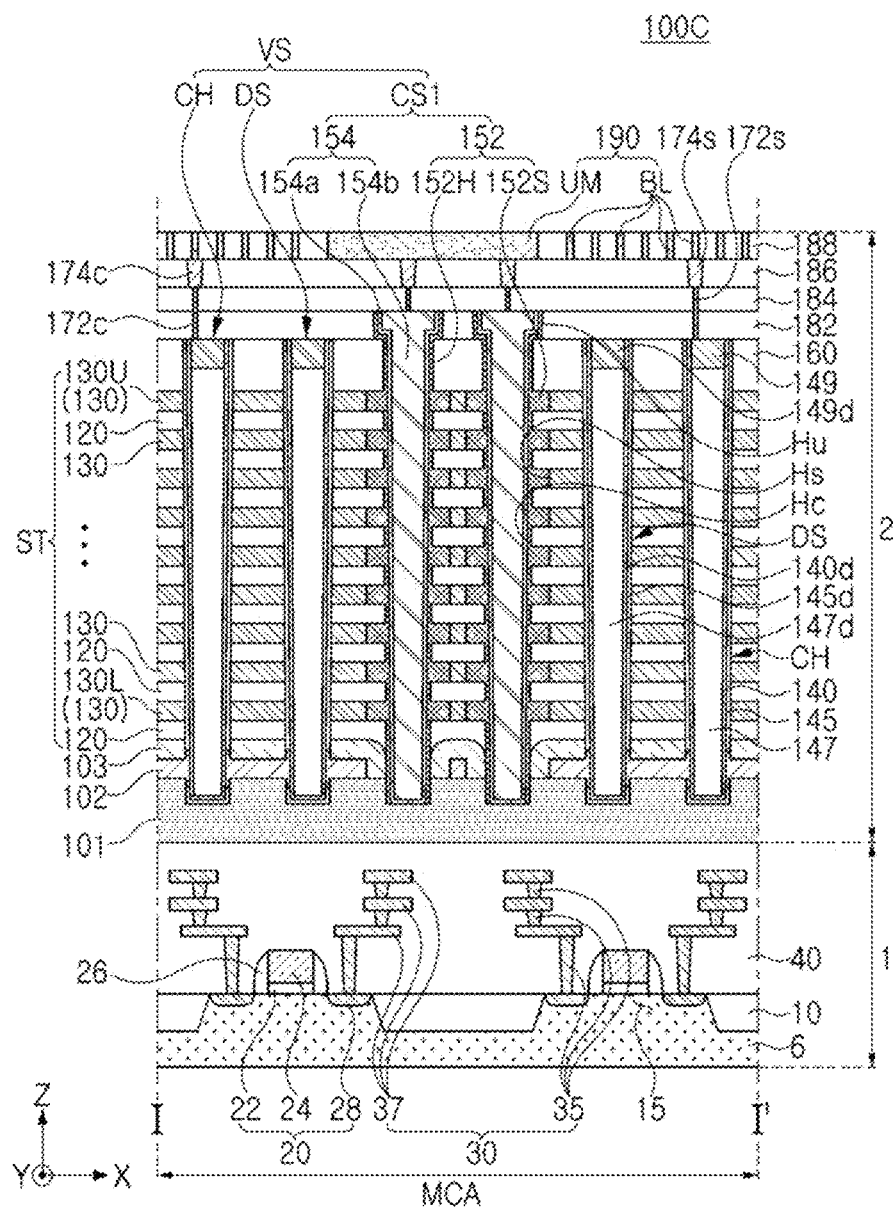
FIGS. 6A and 6B are partially enlarged cross-sectional views illustrating a semiconductor device according to example embodiments.
Figure 6B:
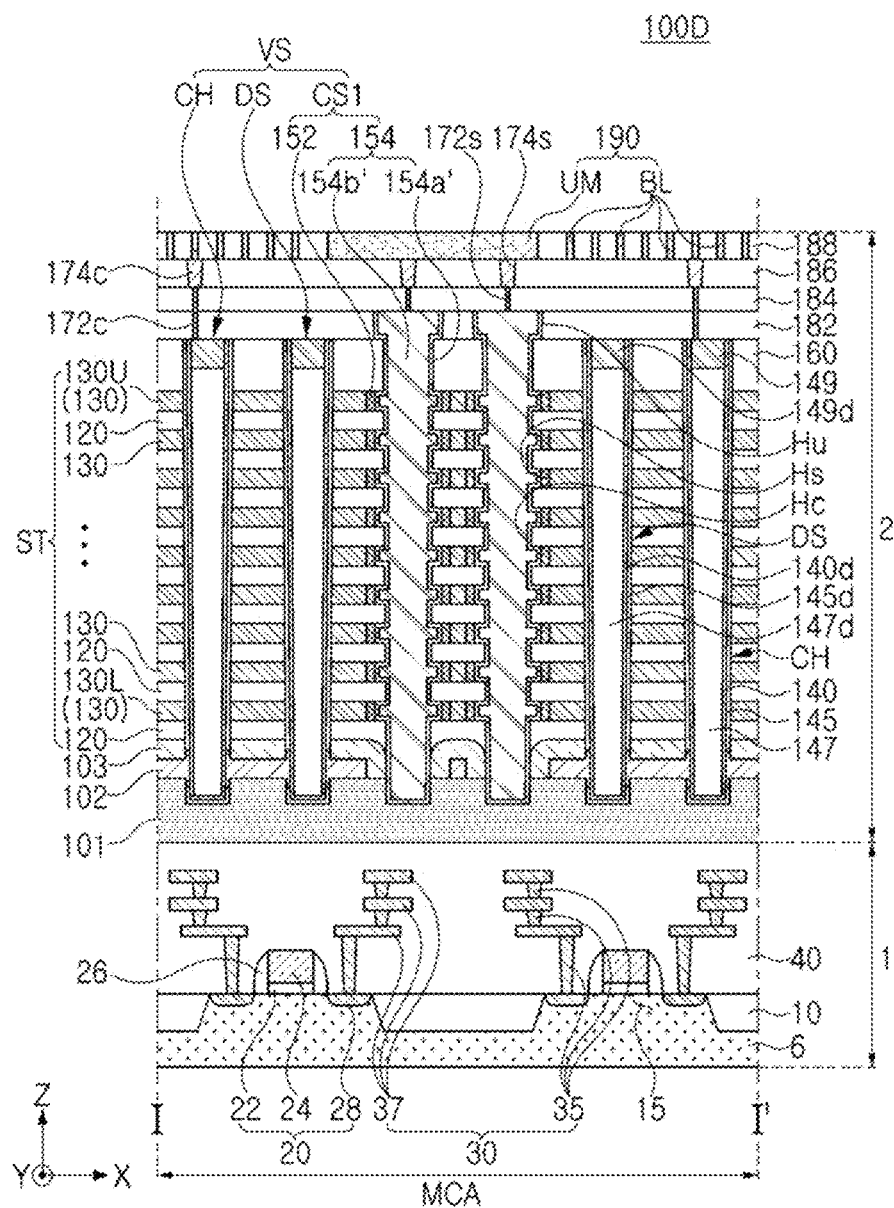

FIGS. 6A and 6B are partially enlarged cross-sectional views of a semiconductor device according to example embodiments. FIGS. 6A and 6B illustrate a region corresponding to FIG. 2A.

Referring to FIG. 6A, in a semiconductor device 100C, the insulating patterns 152 of the contact structure CS1 may include a vertical portion 152H and a horizontal portion 152S. The vertical portion 152H may extend along a side surface of the contact plug 154. The horizontal portion 152S may protrude from the vertical portion 152H toward the gate electrodes 130.

Referring to FIG. 6B, in a semiconductor device 100D, the contact plug 154 of the contact structure CS1 may include protrusions protruding toward the gate electrodes 130. A barrier layer 154a' of the contact plug 154 may be bent to protrude from the contact hole Hc toward the extension portion Hs. A metal plug 154b' may also include a portion protruding toward the extension portion Hs.

Figure 7A:
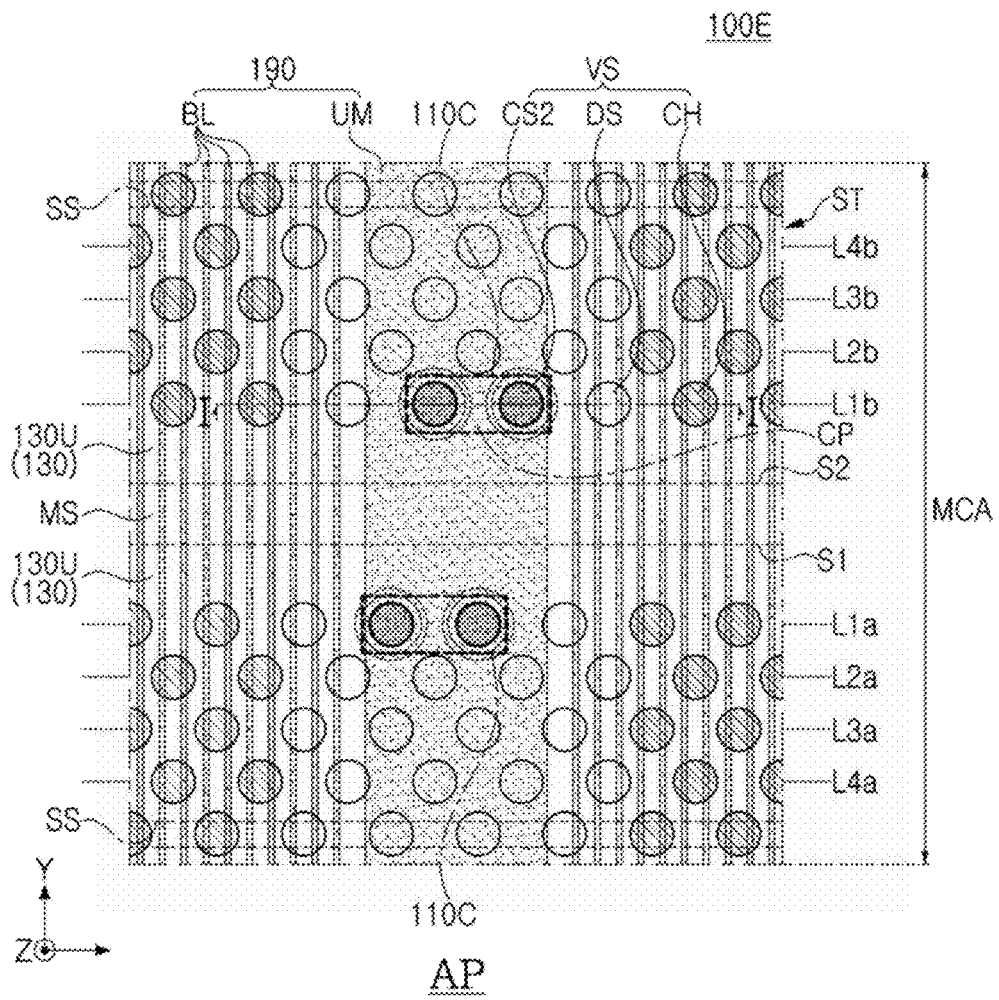
FIG. 7A is a partially enlarged plan view illustrating a semiconductor device according to example embodiments.

FIG. 7A is a partially enlarged plan view of a semiconductor device according to example embodiments. FIG. 7A is an enlarged view of a region corresponding to the region 'AP' of FIG. 2A.

Figure 7B:
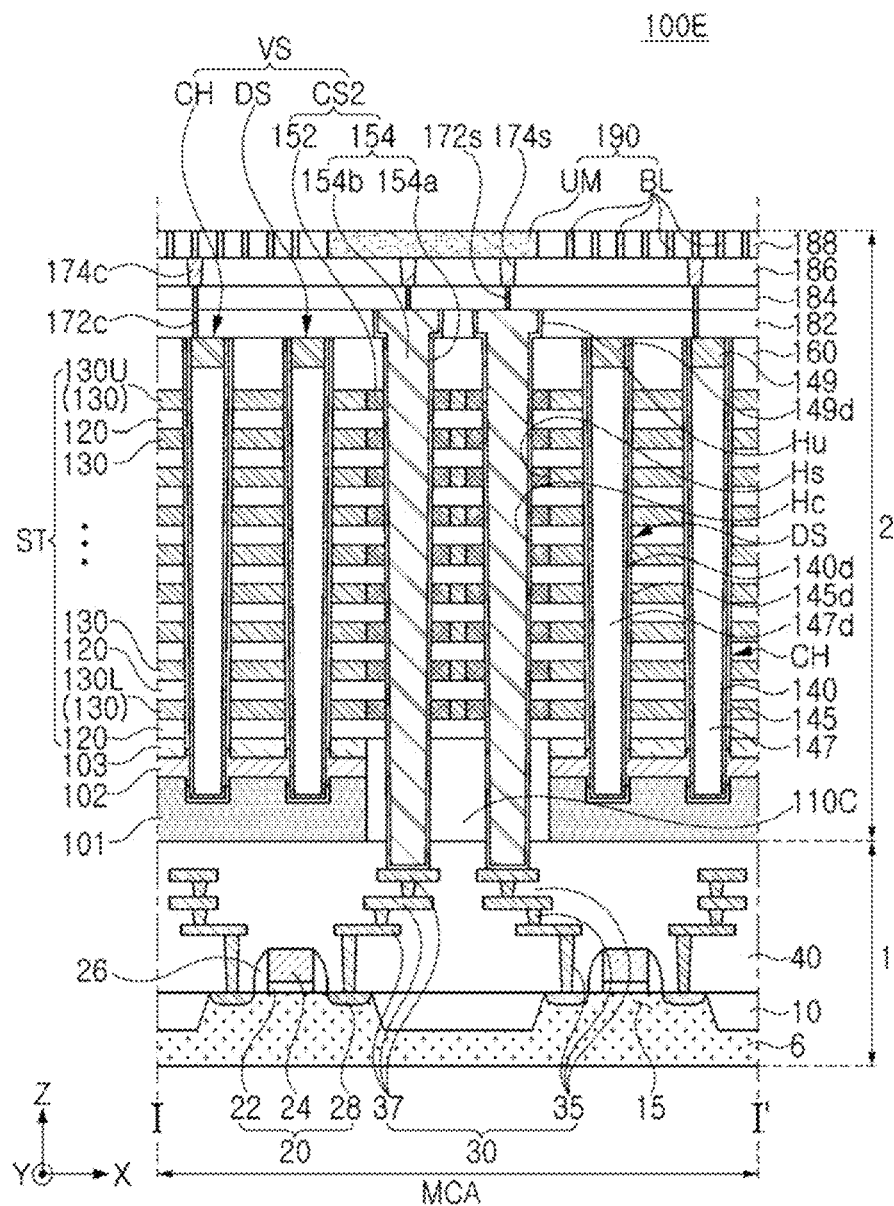
FIG. 7B is a schematic cross-sectional view of a semiconductor device according to example embodiments.

FIG. 7B is a schematic cross-sectional view of a semiconductor device according to example embodiments. FIG. 7B illustrates a cross-section taken along line I-I' of FIG. 7A.

Referring to FIG. 7A, in a semiconductor device 100E, the contact structures CS2 may be through-contact structures connected to the lower wiring structure 30 of the first structure 1. A lower end of the contact plug 154 of the contact structure CS2 may be positioned on a level lower than a lower end of the conductive plate layer 101. The second structure 2 may further include a lower through-insulating layer 110C penetrating through the conductive plate layer 101 so that the contact structures CS2 pass through the conductive plate layer 101. The lower through-insulating layer 110C may be disposed to at least partially overlap the contact structure CS2 in the Z direction, and the contact structure CS2 may penetrate through the lower through-insulating layer 110C. At least two lower through-insulating layers 110C may be disposed adjacent to the separation structure MS. In an example embodiment, the contact structure CS2, which is a through-contact structure, may be disposed in the through-insulating region TH in FIG. 1. In this case, the sacrificial insulating layers 128 may not be disposed in the through-insulating region TH.

Figure 8:
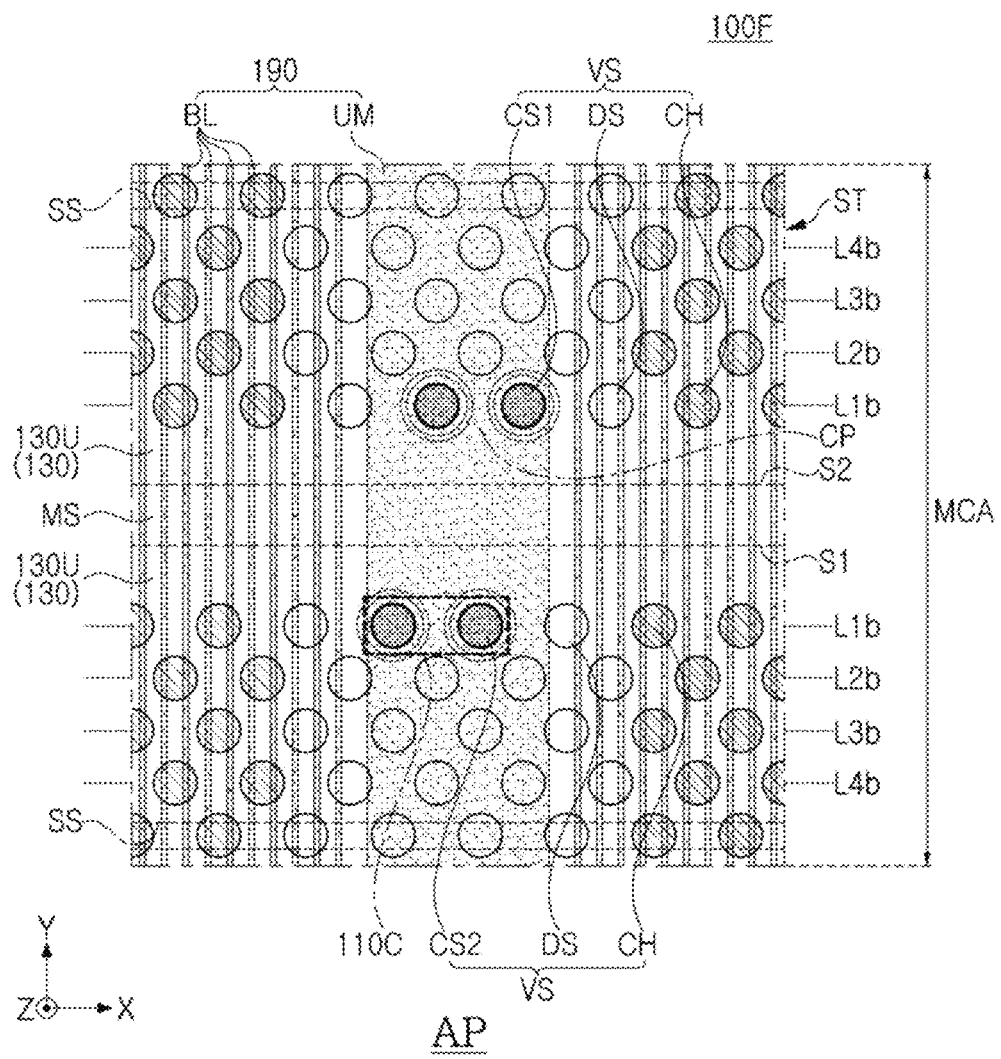
FIG. 8 is a partially enlarged plan view illustrating a semiconductor device according to example embodiments.

FIG. 8 is a partially enlarged plan view of a semiconductor device according to example embodiments. FIG. 8 illustrates an enlarged region corresponding to the region 'AP' of FIG. 2A.

Referring to FIG. 8, in a semiconductor device 100F, the plurality of vertical structures VS disposed in the memory cell array region MCA may include a first contact structure CS1, as a source contact structure, and/or a second contact structure CS2, as a through-contact structure. At least one first contact structure CS1 may be disposed adjacent to the first surface S1 of the separation structure MS, and at least one second contact structure CS2 may be disposed adjacent to the second surface S2 of the separation structure MS. A lower through-insulating layer 110C, penetrating through the conductive plate layer 101, may be disposed below a region in which the second contact structure CS2 is disposed.

FIGS. 9A to 9D are partially enlarged plan views of a semiconductor device according to example embodiments. FIGS. 9A to 9D are enlarged views of a region corresponding to the region 'A' of FIG. 1, illustrating an arrangement of a plurality of vertical structures VS.

Although the arrangement of the contact structure CS, as a source contact structure, is illustrated in the drawings, the contact structure CS2, which is a through contact structure as illustrated in FIG. 7A, may also be similarly arranged in FIGS. 9A to 9D.

Figure 9A:
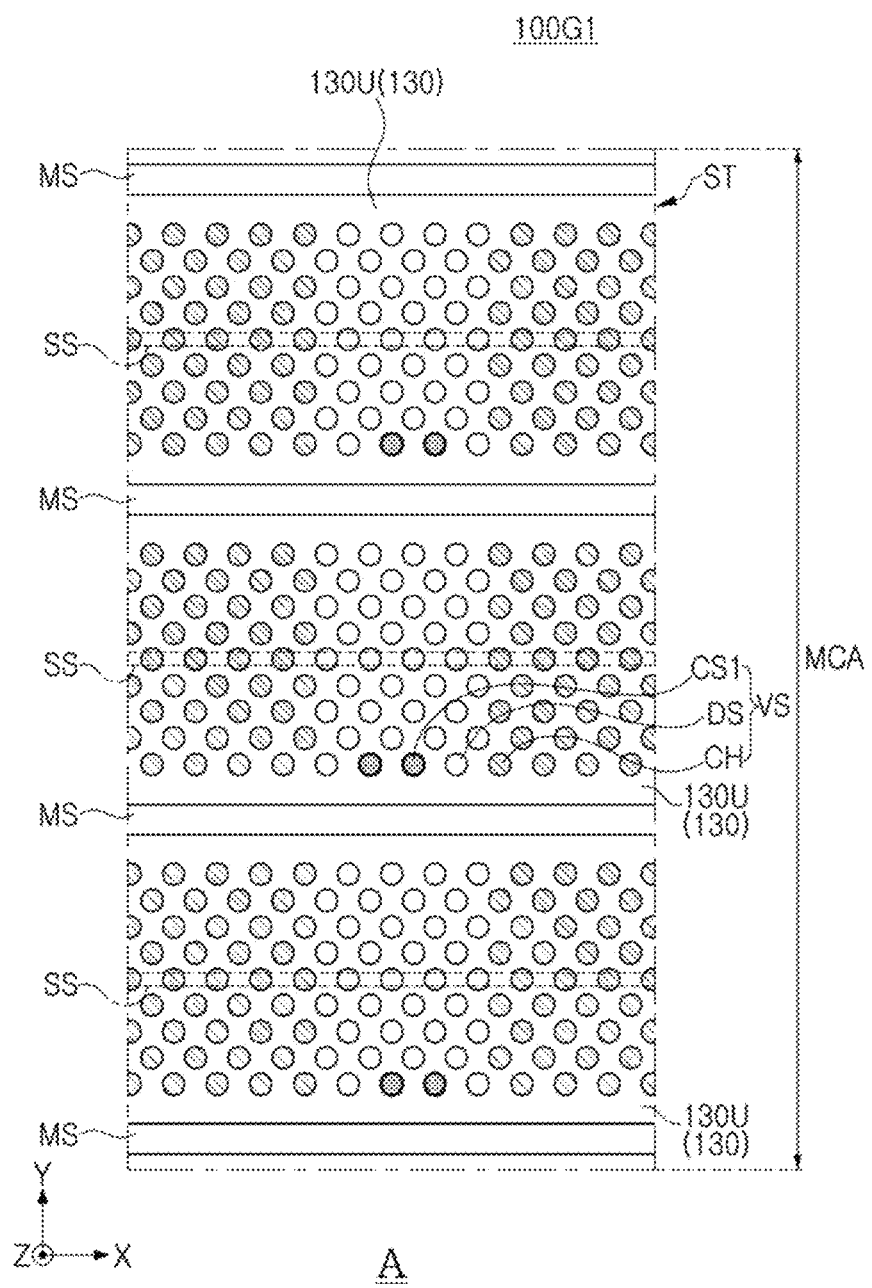
FIGS. 9A to 9D are partially enlarged plan views illustrating a semiconductor device according to example embodiments.

Referring to FIG. 9A, in a semiconductor device 100G1, at least one contact structure CS1 may be disposed adjacent to any one of both side surfaces of the separation structure MS. For example, at least one contact structure CS1 may be disposed in a partial region of any one of the two array lines closest to the one separation structure MS. The dummy structures DS may be disposed adjacent to the at least one contact structure CS1.

Figure 9B:
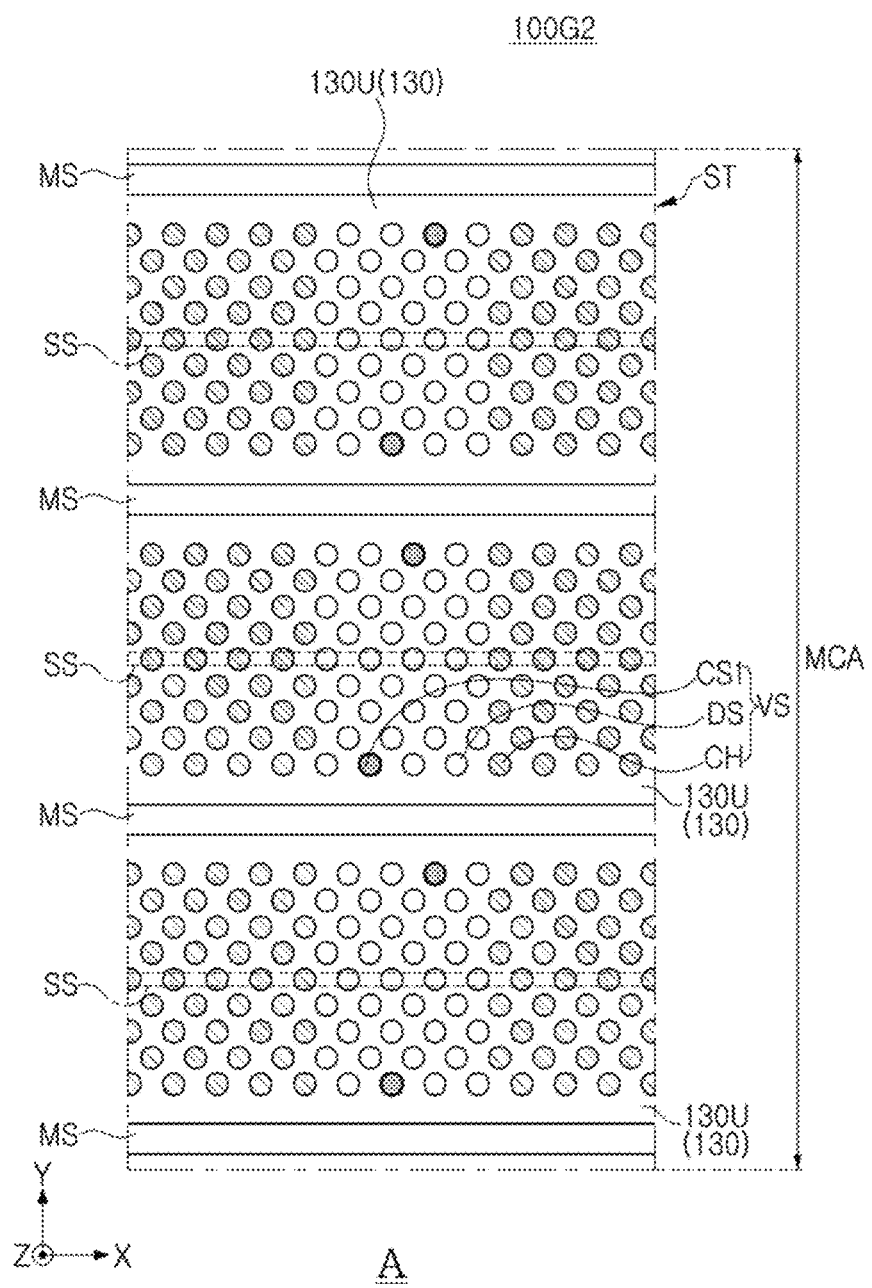

Referring to FIG. 9B, in a semiconductor device 100G2, one contact structure CS1 may be disposed between the dummy structures DS in the X-direction on a partial region of the array line closest to the separation structure MS. The dummy structures DS may be arranged adjacently around one contact structure CS1.

Figure 9C:
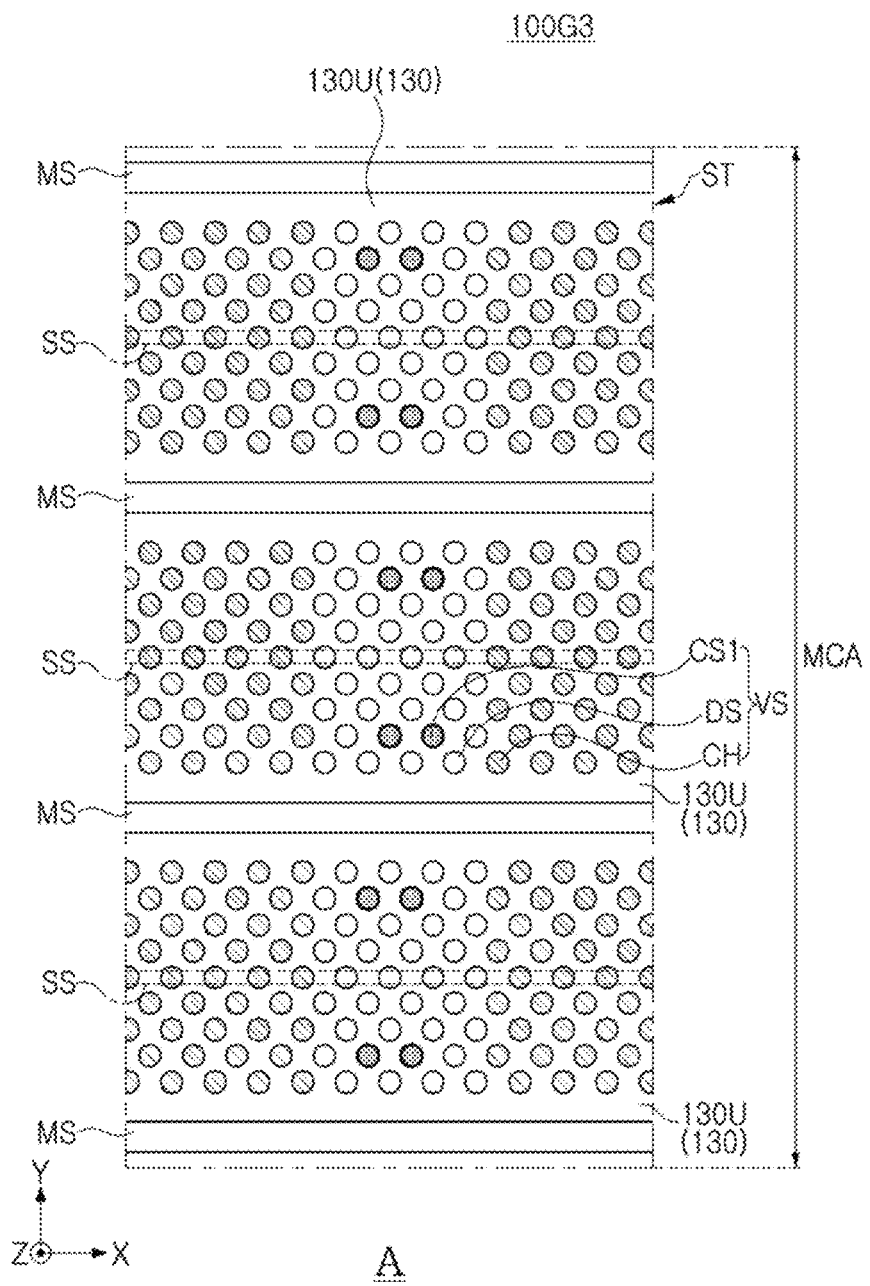
Figure 9D:
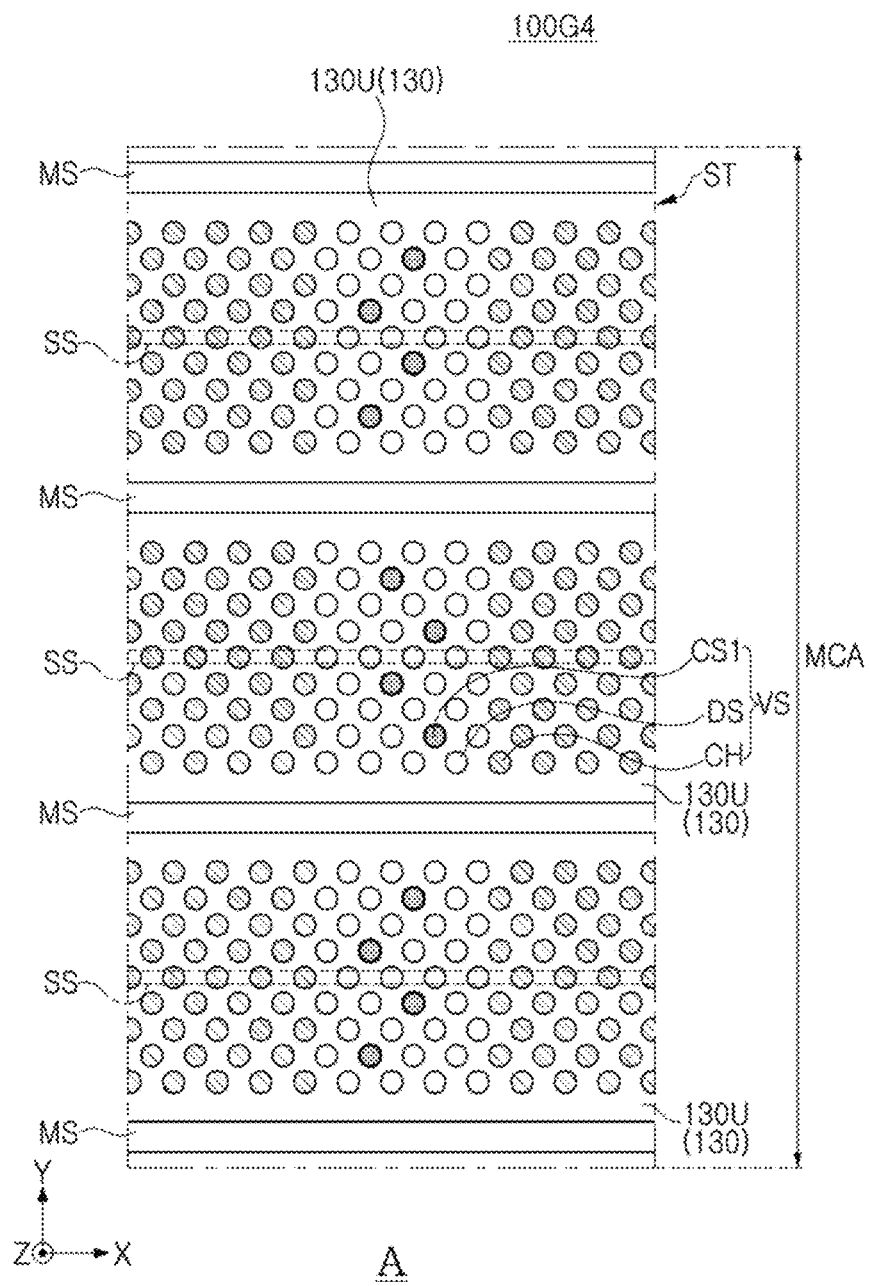

Referring to FIGS. 9C and 9D, in semiconductor devices 100G3 and 100G4, at least one contact structure CS1 may be disposed in array lines other than the array line closest to the separation structure MS. Even in this case, at least one dummy structure DS may be disposed between the at least one contact structure CS1 and the channel structures CH disposed in one array line.

Figure 10:
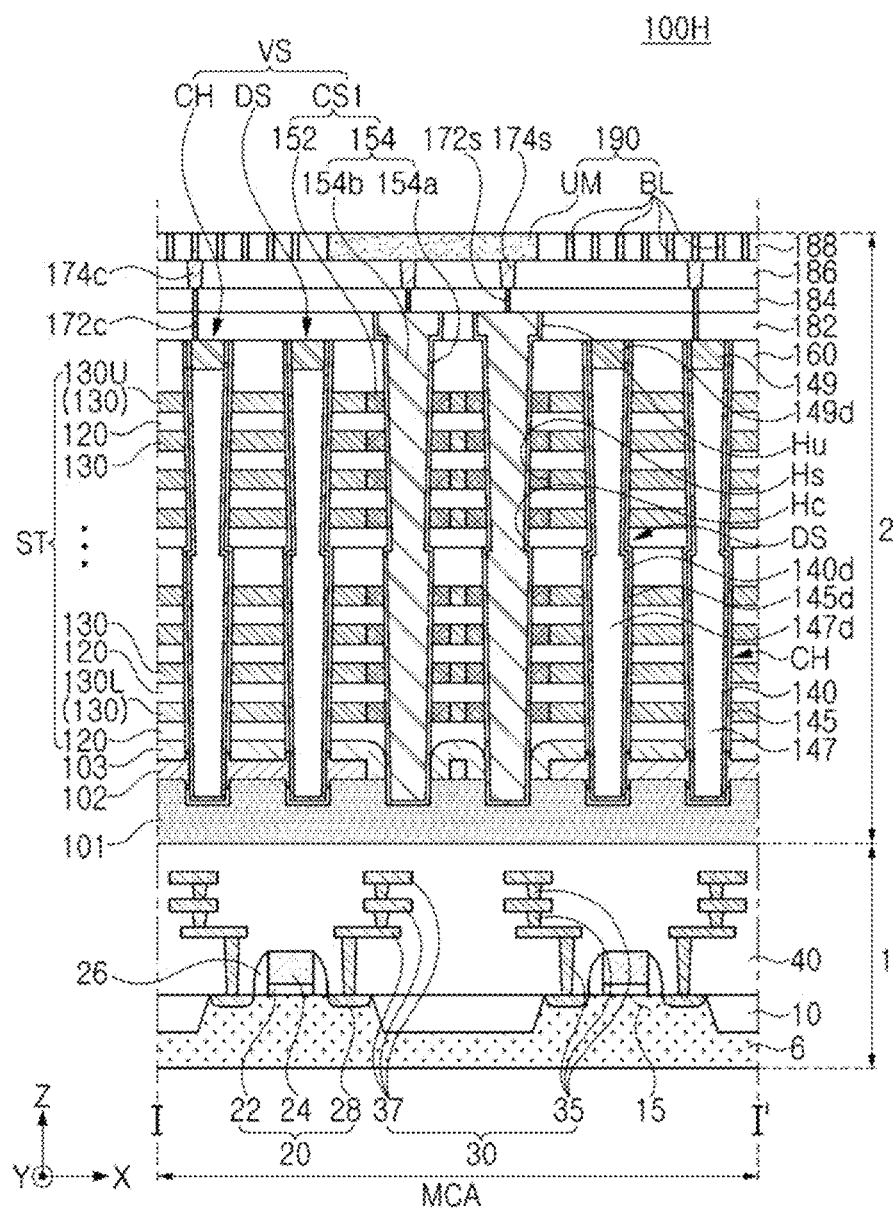
FIGS. 10 and 11 are schematic cross-sectional views of semiconductor devices according to example embodiments.

FIG. 10 is a schematic cross-sectional view of a semiconductor device according to example embodiments. FIG. 10 illustrates a region corresponding to FIG. 2A.

Referring to FIG. 10, in a semiconductor device 100H, the stack structure ST of the second structure 2 includes a lower stack structure and an upper stack structure on the lower stack structure, and each of the channel structures CHa may include a lower channel structure penetrating through the lower stack structure and an upper channel structure penetrating through the upper stack structure. The channel layer 140 of the first channel structure and the channel layer 140 of the second channel structure may be connected to each other. In the connection region, the gate dielectric layer 145 and the channel layer 140 may be bent, respectively, e.g., a side surface of the channel layer 140 may include a bent portion due to a difference in width in the connection region, and a side slope may change. The contact structure CS1 may include a lower contact structure penetrating through the lower stack structure and an upper contact structure penetrating through the upper stack structure. A side surface of the contact structure CS1 may include a bent portion due to a width difference in the connection region. In the present example embodiment, a case in which the stack structure is a double stack structure is illustrated, and the example embodiments may also include a multi-stack structure that is a double or more stack structure.

Figure 11:
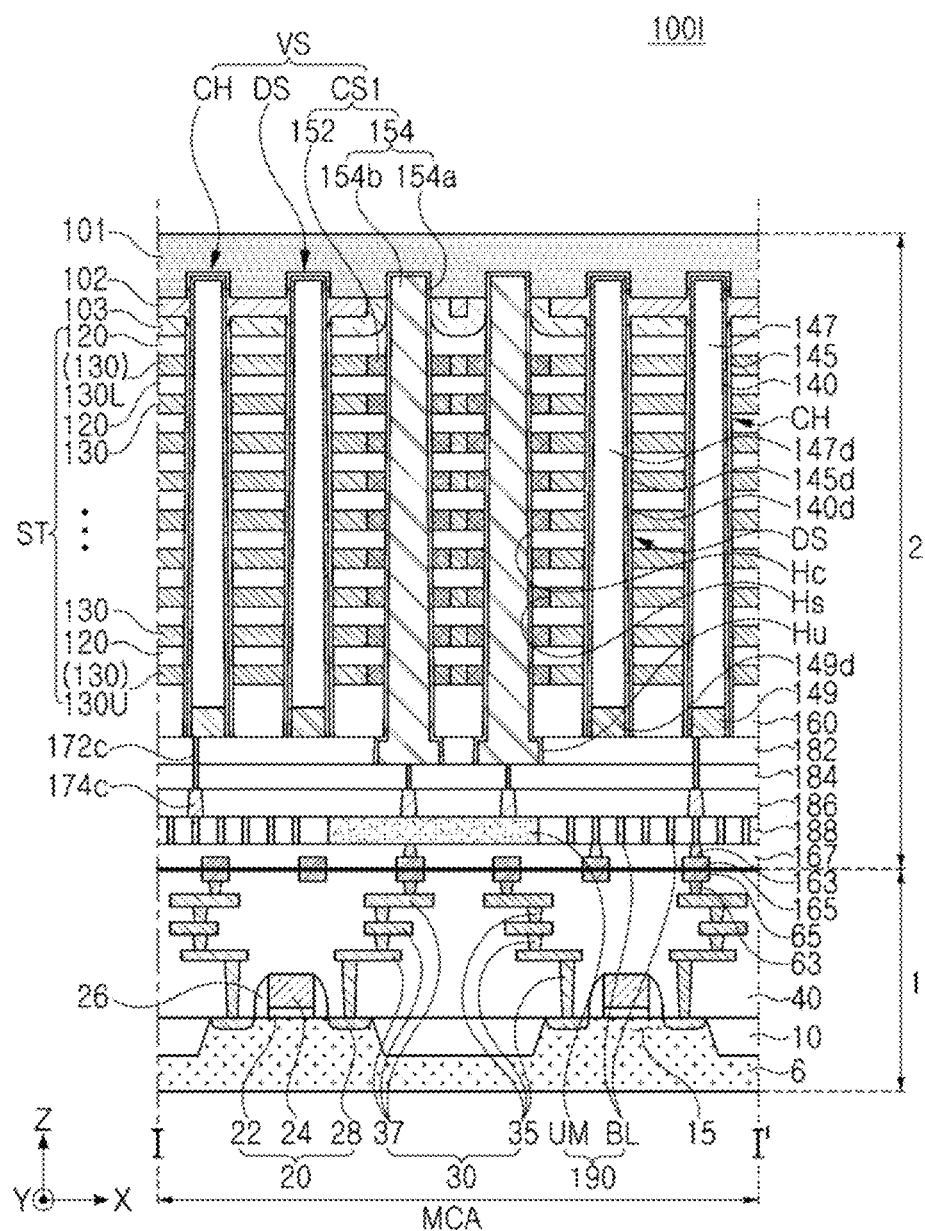

Referring to FIG. 11, in a semiconductor device 100I, the first structure 1 and the second structure 2 may be bonded to each other through a bonding structure. The second structure 2 of the semiconductor device 100I is illustrated by turning the second structure 2 of the semiconductor device 100 of FIG. 2A upside down. The semiconductor device 100I may further include an upper bonding pad 165 and a lower bonding pad 65. The second structure 2 may further include a fifth upper insulating layer 167. The upper bonding pad 165 may be electrically connected to the bit line BL through a separate upper bonding via 163, and the lower bonding pad 65 may be electrically connected to the circuit elements 20 through a separate lower via 63. The lower bonding pad 65 and the upper bonding pad 165 may include, e.g., tungsten (W), aluminum (Al), copper (Cu), tungsten nitride (WN), tantalum nitride (TaN), or titanium nitride (TiN), or a combination thereof. The lower bonding pad 65 and the upper bonding pad 165 may function as bonding layers for bonding the first structure 1 and the second structure 2. In addition, the lower bonding pad 65 and the upper bonding pad 165 may provide an electrical connection path between the first structure 1 and the second structure 2. The lower bonding pad 65 and the upper bonding pad 165 may be bonded by copper-to-copper bonding.

FIGS. 12A to 18B are schematic cross-sectional views illustrating a method of manufacturing a semiconductor device according to example embodiments. FIGS. 12A to 18B illustrates a process of manufacturing the semiconductor device of FIGS. 1 to 3C.

Figure 12A:
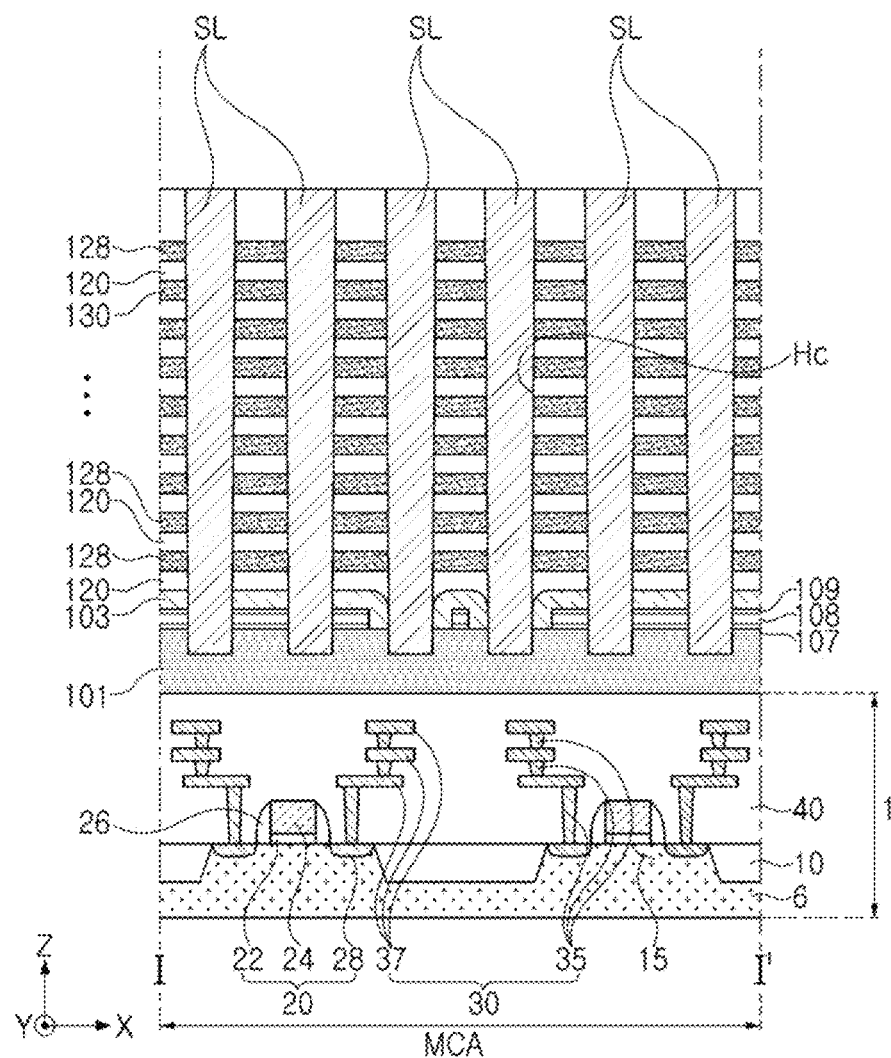
FIGS. 12A to 18C are schematic cross-sectional views illustrating a method of manufacturing a semiconductor device according to example embodiments.
Figure 12B:
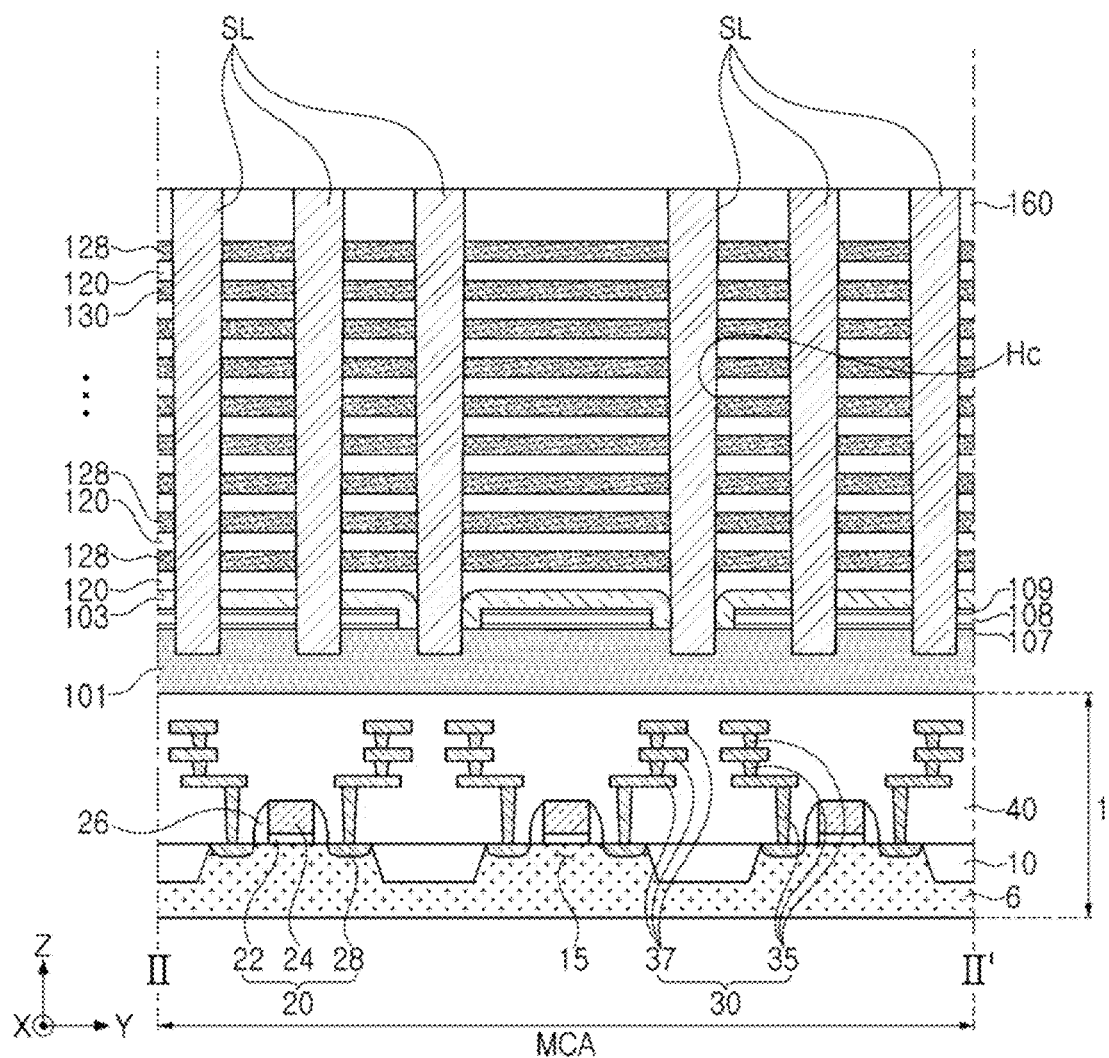
Figure 12C:
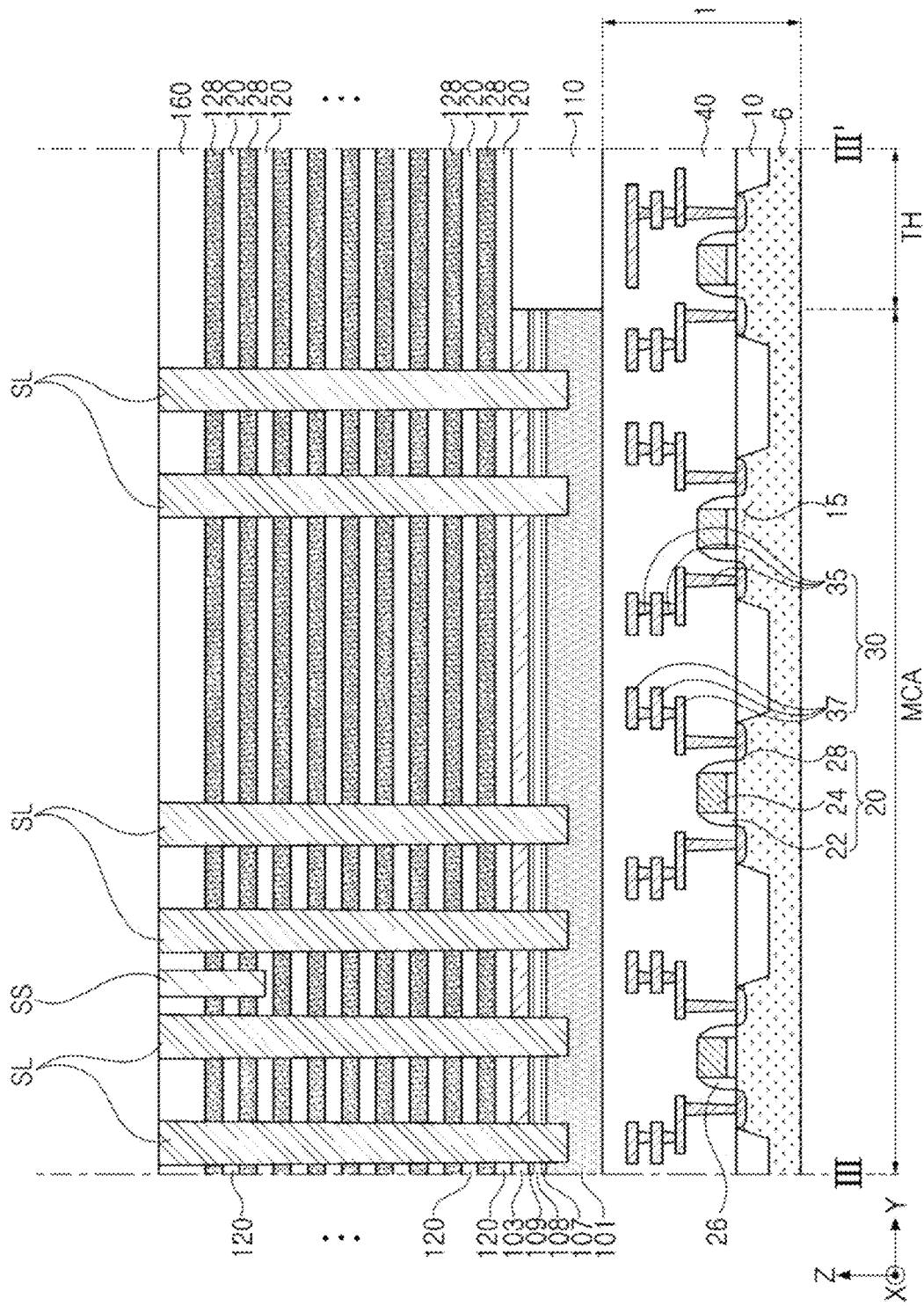

Referring to FIGS. 12A to 12C, the first structure 1 including the circuit elements 20, the lower wiring structure 30, and the lower capping layer 40 may be formed on the substrate 6, and the conductive plate layer 101, the horizontal insulating layers 107, 108, and 109, the second pattern layer 103, and the lower through-insulating layer 110 may be formed on the first structure 1, and thereafter, the sacrificial insulating layers 128 and the interlayer insulating layers 120 may be alternately stacked. In the memory cell region MCA, the vertical sacrificial structure SL penetrating through the preliminary stack structure of the sacrificial insulating layers 128 and the interlayer insulating layers 120 may be formed.

First, the device isolation layers 10 may be formed in the substrate 6, and the circuit gate dielectric layer 22 and the circuit gate electrode 24 may be sequentially formed in the active region 15. The device isolation layers 10 may be formed by, e.g., a shallow trench isolation (STI) process. The circuit gate dielectric layer 22 may be formed of silicon oxide, and the circuit gate electrode 24 may be formed of at least one of polycrystalline silicon or a metal silicide layer, but is not limited thereto. Next, the spacer layer 26 may be formed on both sidewalls of the circuit gate dielectric layer 22 and the circuit gate electrode 24, and the source/drain regions 28 may be formed in the active region 15. In some example embodiments, the spacer layer 26 may include a plurality of layers. The source/drain regions 28 may be formed by performing an ion implantation process.

The lower contact plugs 35 and the lower wiring lines 37 of the lower wiring structure 30 may be formed by partially forming the lower capping layer 40 and then removing a portion by etching and filling a conductive material or by depositing a conductive material, patterning the deposited conductive material, and subsequently filling a region removed through the patterning with a portion of the lower capping layer 40.

The lower capping layer 40 may include a plurality of insulating layers. A portion of the lower capping layer 40 may be formed in each stage of forming the lower wiring structure 30 and a portion is formed on the uppermost lower wiring line 37, whereby the lower capping layer 40 may be formed to finally cover the circuit elements 20 and the lower wiring structure 30.

Next, the conductive plate layer 101, the sacrificial horizontal insulating layers 107, 108, and 109, the second pattern layer 103, and the lower through-insulating layer 110 may be formed.

The conductive plate layer 101 and the second pattern layer 103 may be formed of, e.g., polycrystalline silicon. Polycrystalline silicon constituting the conductive plate layer 101 may include impurities.

The horizontal insulating layers 107, 108, and 109 may include first to third horizontal insulating layers 107, 108, and 109 stacked on the conductive plate layer 101. The horizontal insulating layers 107, 108, and 109 may be partially replaced with the first pattern layer 102 of FIG. 3A through a subsequent process. The first and third horizontal insulating layers 107 and 109 may be formed of the same material as that of the interlayer insulating layers 120, and the second horizontal insulating layer 108 may be formed of the same material as that of the sacrificial insulating layers 128. The second pattern layer 103 may include a portion covering side surfaces of the horizontal insulating layers 107, 108, and 109 in the region in which the horizontal insulating layers 107, 108, and 109 are pattern, and bent to contact the conductive plate layer 101.

The lower through-insulating layer 110 may be formed by removing portions of the conductive plate layer 101, the horizontal insulating layers 107, 108, 109, and the second pattern layer 103 in a region corresponding to a lower portion of the through-insulating region TH and filling the removed portions with an insulating material. After the filing of the insulating material, a planarization process may be further performed using a chemical mechanical polishing (CMP) process. Accordingly, the upper surface of the lower through-insulating layer 110 may be substantially coplanar with the upper surface of the second pattern layer 103.

The sacrificial insulating layers 128 may be partially replaced by the gate electrodes 130 (refer to FIG. 3A) through a subsequent process. The sacrificial insulating layers 128 may be formed of a material different from that of the interlayer insulating layers 120 and may be formed of a material that may be etched with etch selectivity with respect to the interlayer insulating layers 120 under specific etching conditions. For example, the interlayer insulating layer 120 may be formed of at least one of silicon oxide and silicon nitride, and the sacrificial insulating layers 128 may be formed of a material different from the interlayer insulating layer 120 selected from silicon, silicon oxide, silicon carbide, and silicon nitride. In example embodiments, thicknesses of the interlayer insulating layers 120 may not all be the same. The thicknesses of the interlayer insulating layers 120 and the sacrificial insulating layers 128 and the number of films constituting the interlayer insulating layers 120 and the sacrificial insulating layers 128 may be variously changed from those illustrated.

The string separation structure SS penetrating through portions of the sacrificial insulating layers 128 and the interlayer insulating layers 120 may be formed. The string separation structure SS may be formed by exposing a region in which the string separation structure SS is to be formed using a separate mask layer, removing a predetermined number of sacrificial insulating layers 128 and interlayer insulating layers 120 from the top, and then depositing an insulating material.

The vertical sacrificial structures SL may be formed by anisotropically etching the sacrificial insulating layers 128, the interlayer insulating layers 120, the second pattern layer 103, and the horizontal insulating layers 107, 108, and 109 to form a plurality of vertical holes and filling the plurality of vertical holes with the vertical sacrificial layer. Referring to FIG. 2A, the vertical sacrificial structure SL may be formed in rows and columns corresponding to the plurality of vertical structures VS of the memory cell array region MCA. The vertical sacrificial structures SL may be formed of a semiconductor material such as undoped polycrystalline silicon or may be formed of at least one of silicon oxide, silicon nitride, silicon oxynitride, or silicon oxycarbide.

Figure 13A:
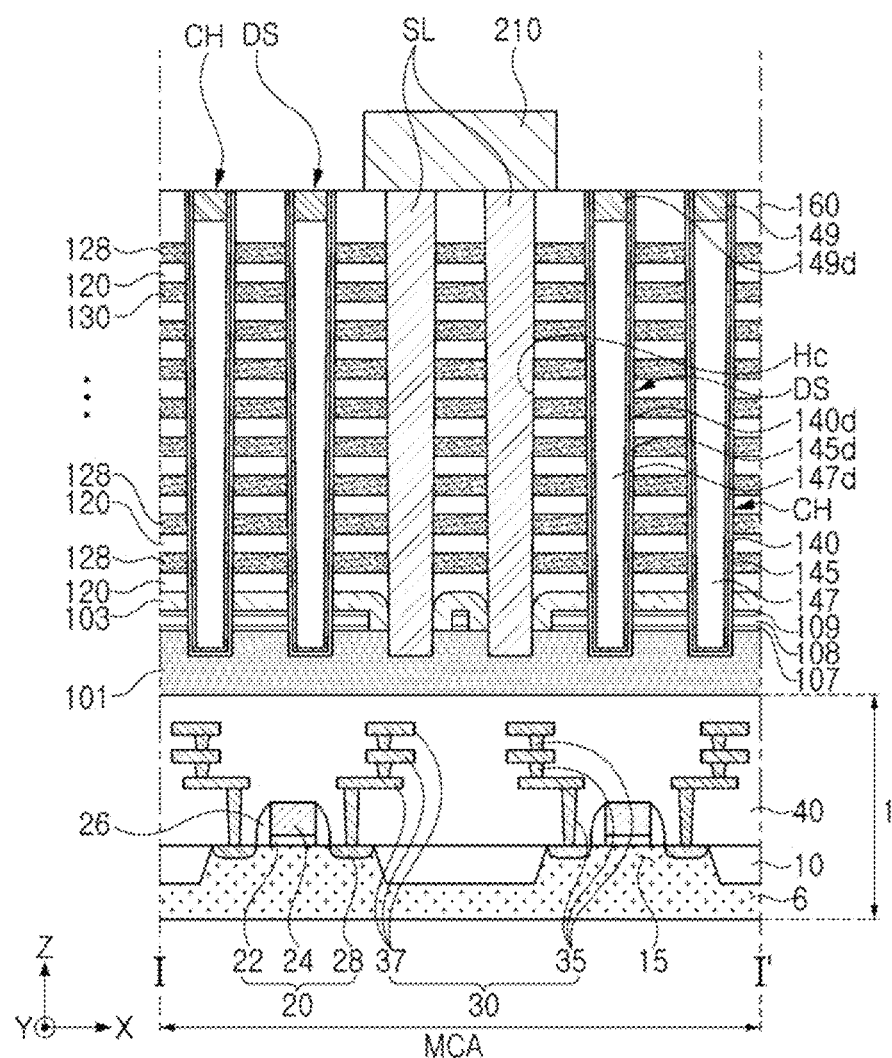
Figure 13B:
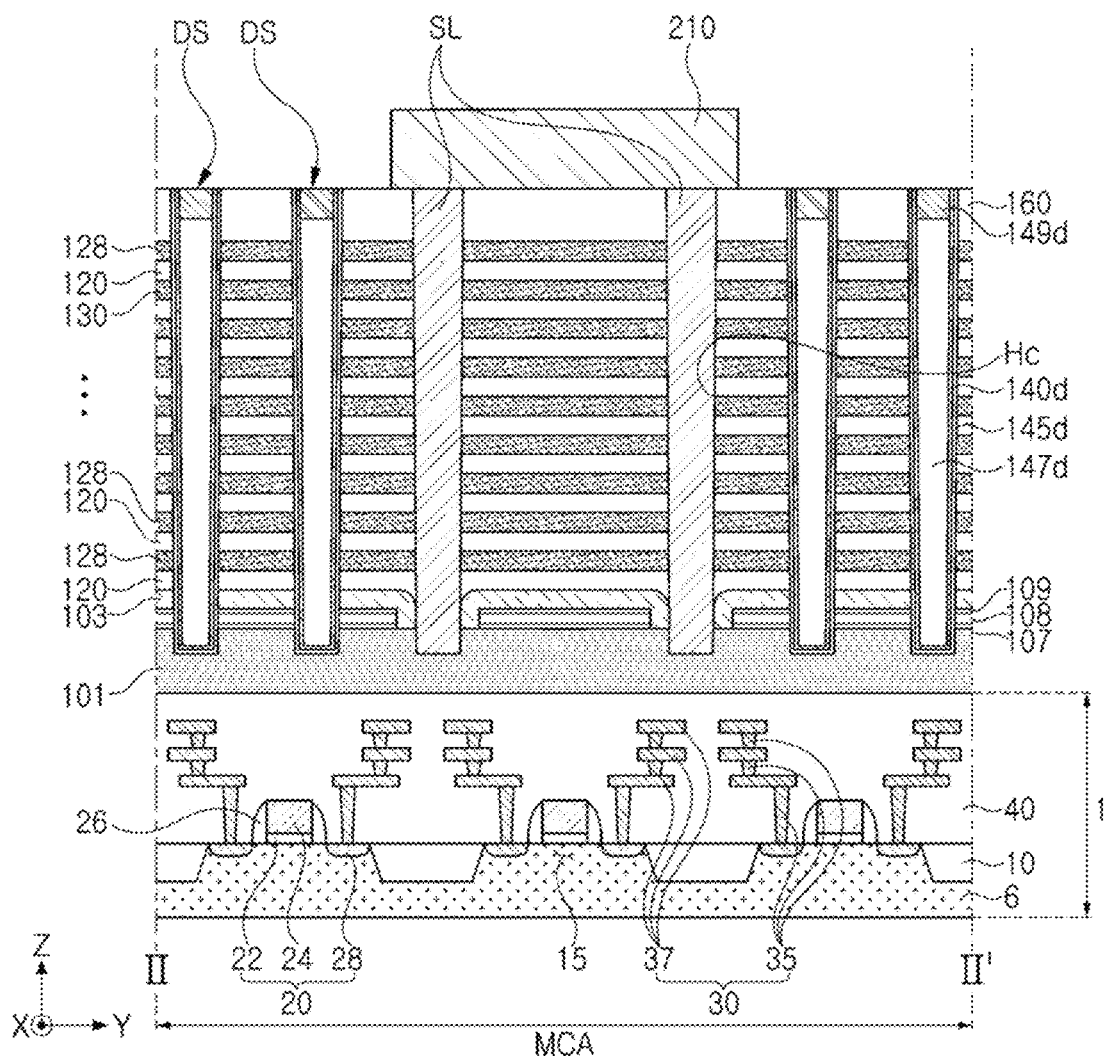
Figure 13C:
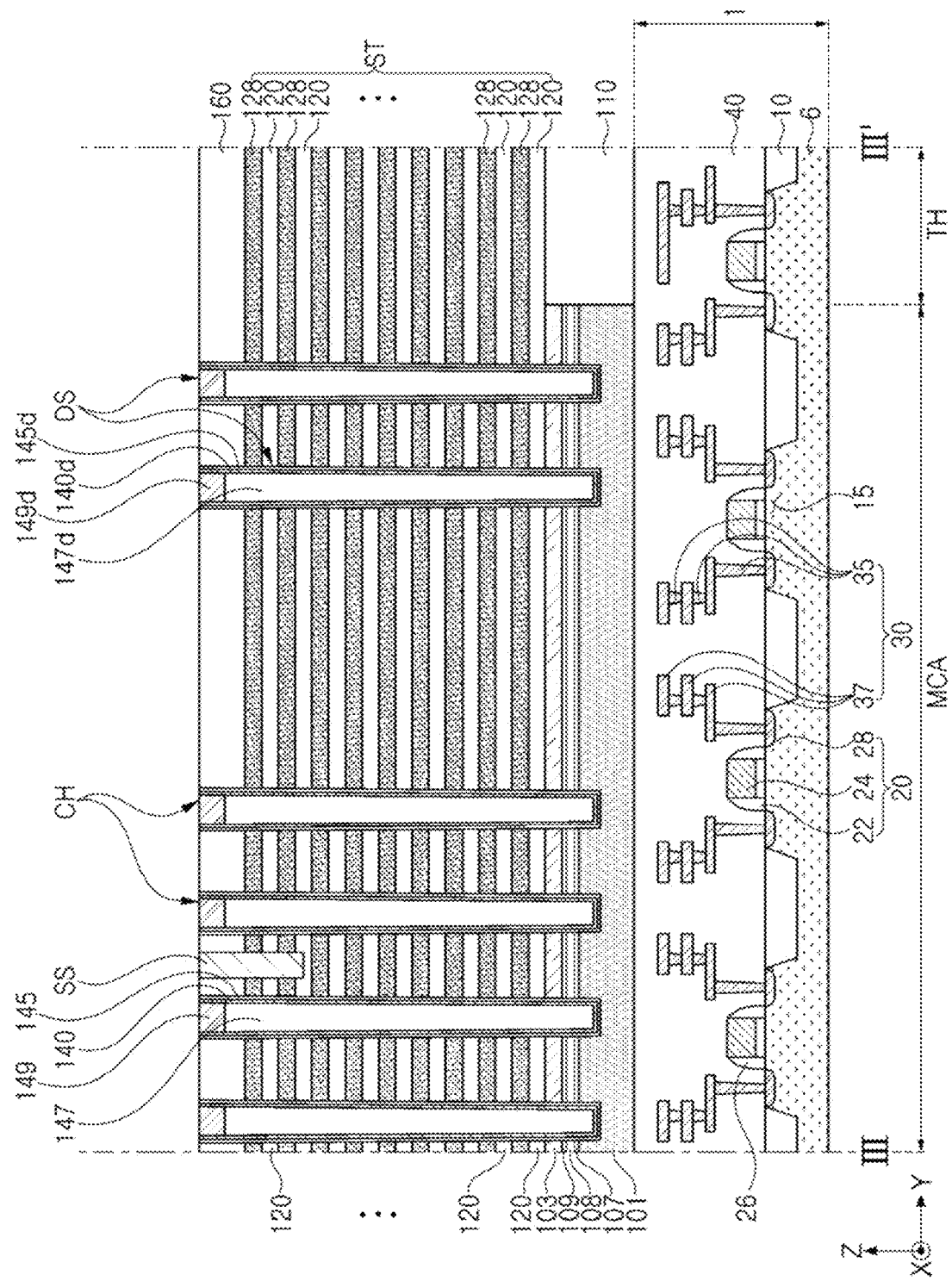

Referring to FIGS. 13A to 13C, an upper mask pattern 210 is formed on some of the vertical sacrificial structures SL and the vertical sacrificial structures SL exposed from the upper mask pattern 210 may be removed to form the channel structures CH and the dummy structure DS.

The upper mask pattern 210 may be formed in a region in which the contact structure CS1 is to be formed. For example, the upper mask pattern 210 may be formed on the vertical sacrificial structures SL in a region in which the contact structure CS1 of the vertical sacrificial structures SL is to be formed.

The plurality of vertical holes may be re-formed by removing the vertical sacrificial structures SL, the gate dielectric layer 145 conformally covering inner walls and bottom surfaces of the plurality of vertical holes may be formed, the channel layer 140 may be formed on the gate dielectric layer 145 within the plurality of vertical holes, the inner core insulating layer 147 filling a space between the inner walls of the channel layer 140 may be formed in the plurality of vertical holes, and the channel pad 149 may be formed in a region in which an upper portion of the inner core insulating layer 147 is partially removed. The channel structures CH may have an inclined side surface with respect to an upper surface of the conductive plate layer 101. The channel structures CH may be formed to recess a portion of the conductive plate layer 101. The dummy vertical structures DS may be formed together with the channel structures CH. After the channel pad 149 is formed, the upper mask pattern 210 may be removed and a planarization process may be performed.

Figure 14A:
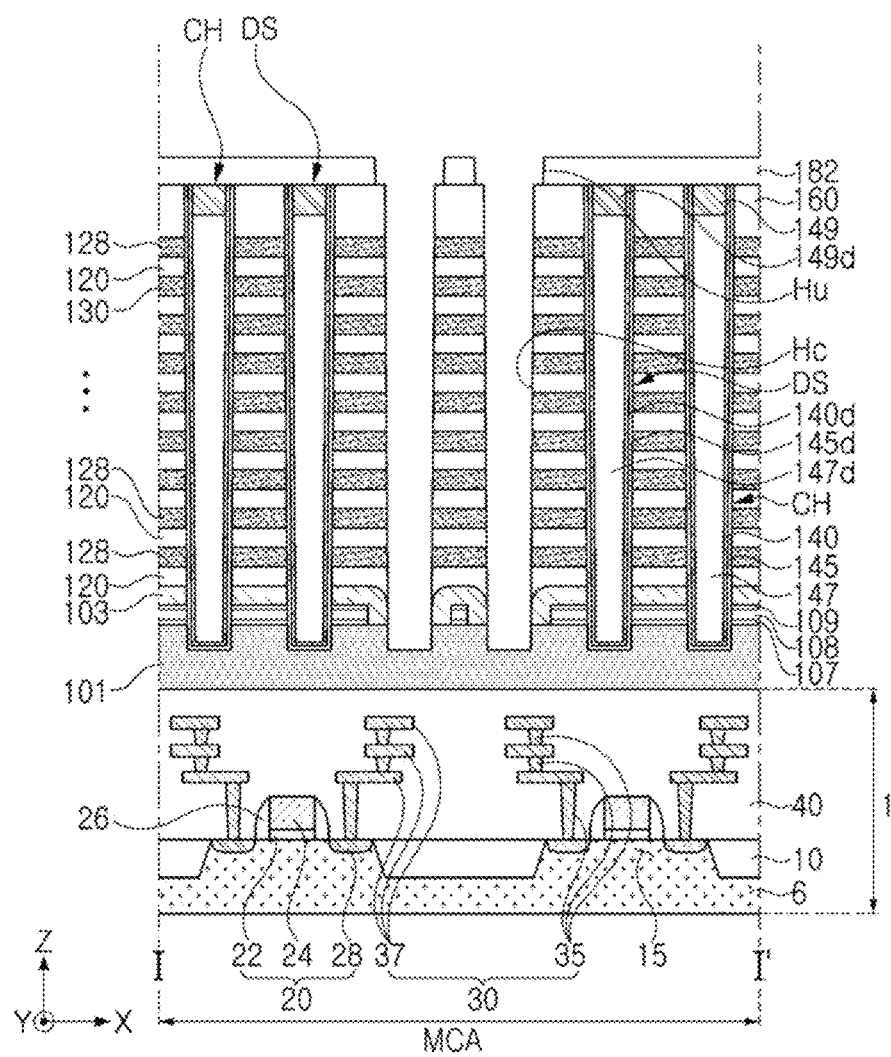
Figure 14B:
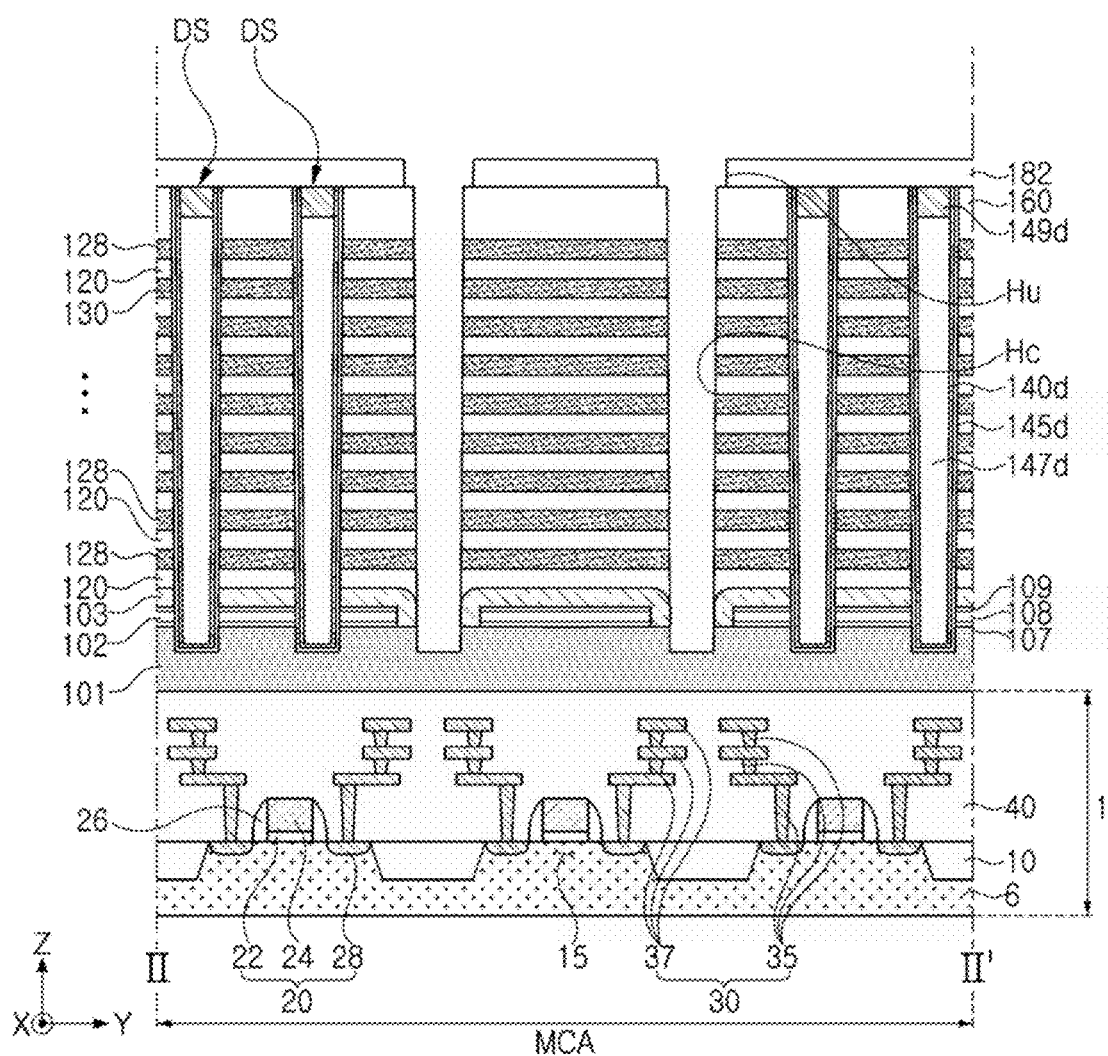

Referring to FIGS. 14A and 14B, the first upper insulating layer 182 is formed and patterned to form the upper open region Hu, and the vertical sacrificial structures SL exposed through the upper open region Hu may be removed.

The first upper insulating layer 182 may be formed on the upper capping layer 160, the channel structures CH, the dummy structure DS, and the vertical sacrificial structure SL. The upper open region Hu may be formed by removing a partial region of the first upper insulating layer 182 overlapping the vertical sacrificial structures SL in the Z direction. The upper open region Hu may be circular in a plan view, or may be formed in various patterns such as a rectangle, an ellipse, or a quadrilateral.

The vertical sacrificial structures SL may be removed to form the contact holes Hc below the upper open region Hu. The contact holes Hc may expose sidewalls of the sacrificial insulating layers 128 and the conductive plate layer 101. The contact holes Hc may be spaced apart from the horizontal insulating layers 107, 108, and 109.

Figure 15A:
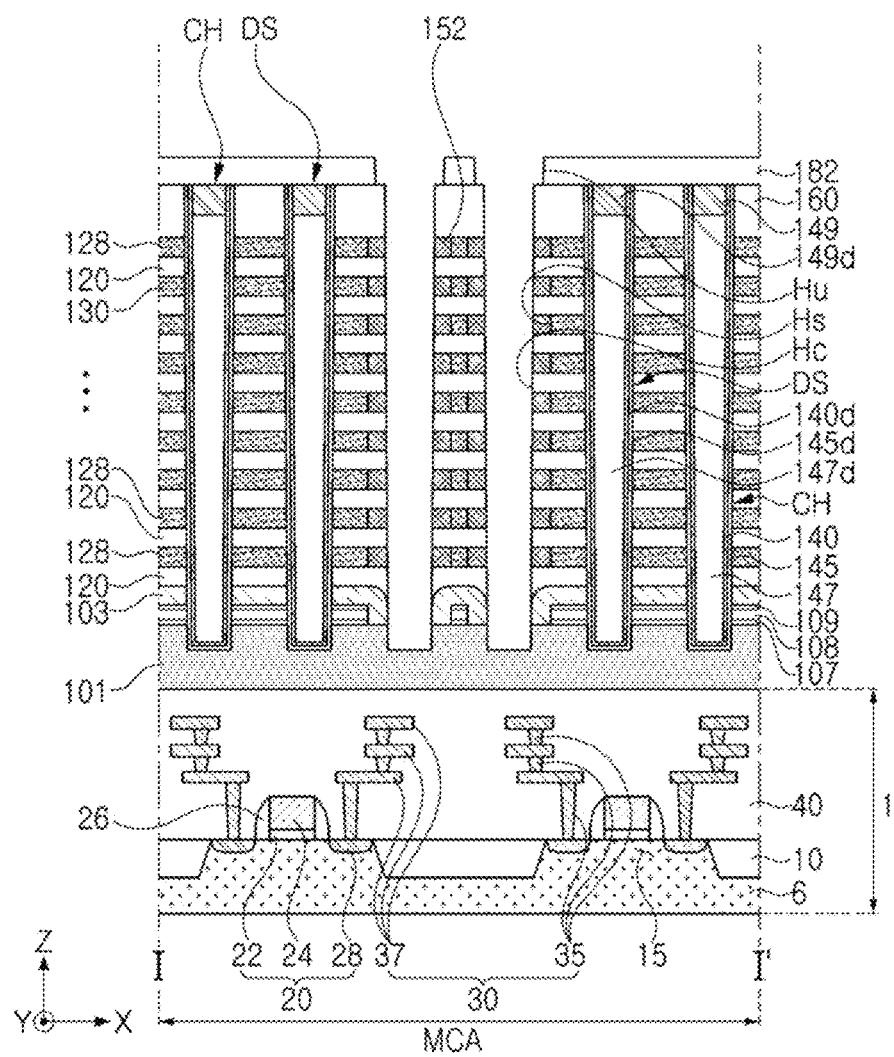
Figure 15B:
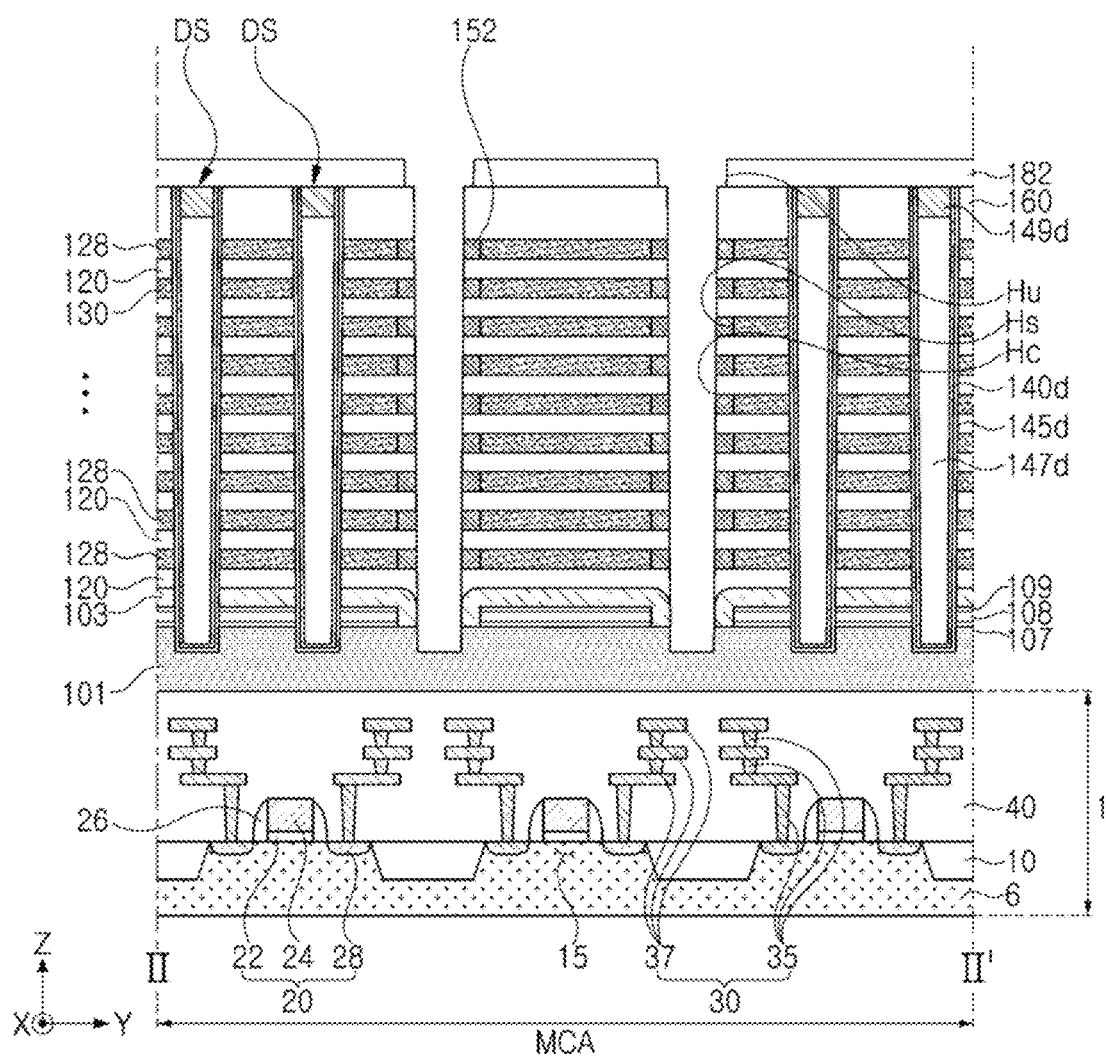

Referring to FIGS. 15A and 15B, the sacrificial insulating layers 128 exposed through the contact holes Hc may be removed from the sidewall to form horizontally extended side regions, and insulating patterns 152 are formed in the side regions.

The sacrificial insulating layers 128 may be partially removed so that the contact hole Hc may horizontally extend to the extension portion Hs. The sacrificial insulating layers 128 may be removed through, e.g., a wet etching process. The insulating patterns 152 may be formed to have a uniform thickness in the contact holes Hc, the upper open region Hu, and the extension portion Hs, and then remain only in the extension portion Hs by performing an etching process. However, while the etching process is performed, the insulating patterns 152 may partially remain in the contact holes Hc, and recesses concave inwardly toward the gate electrodes 130 may be formed in the insulating patterns 152.

Figure 16A:
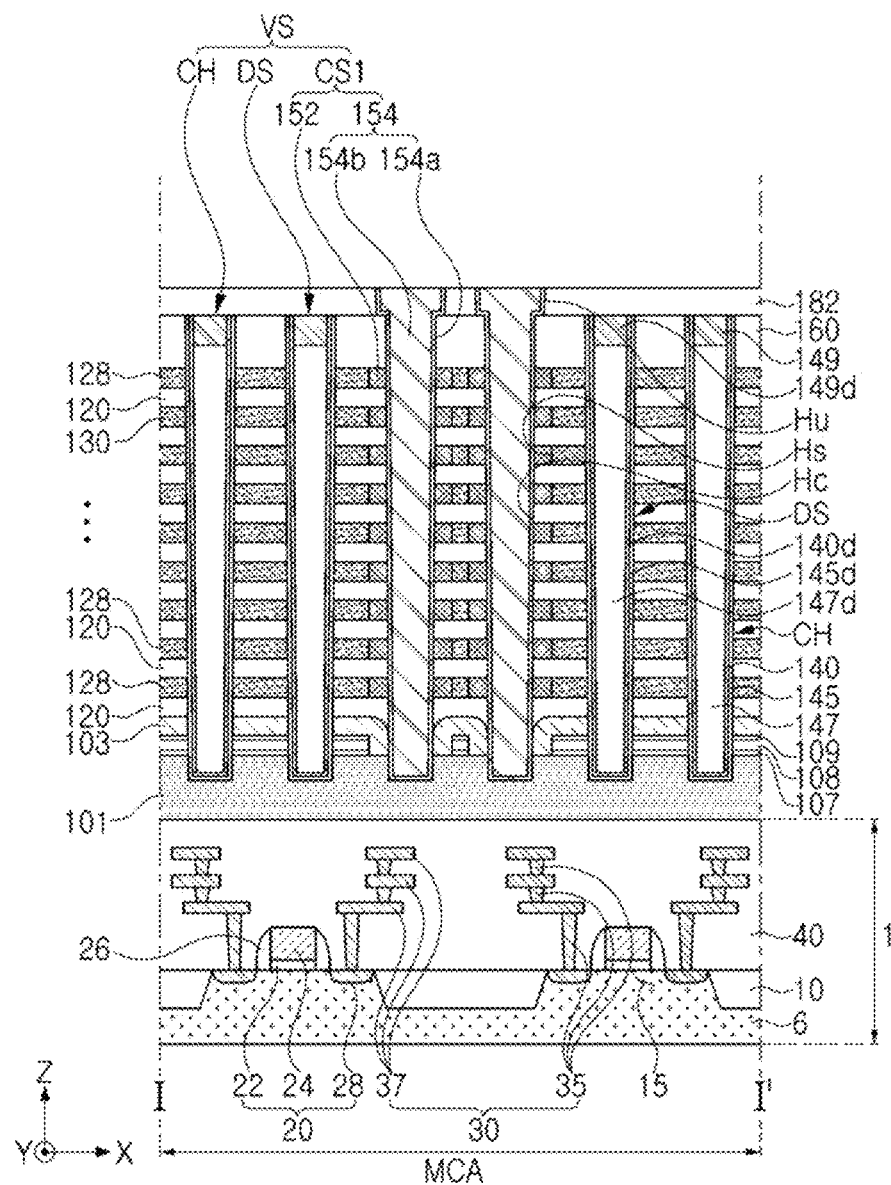
Figure 16B:
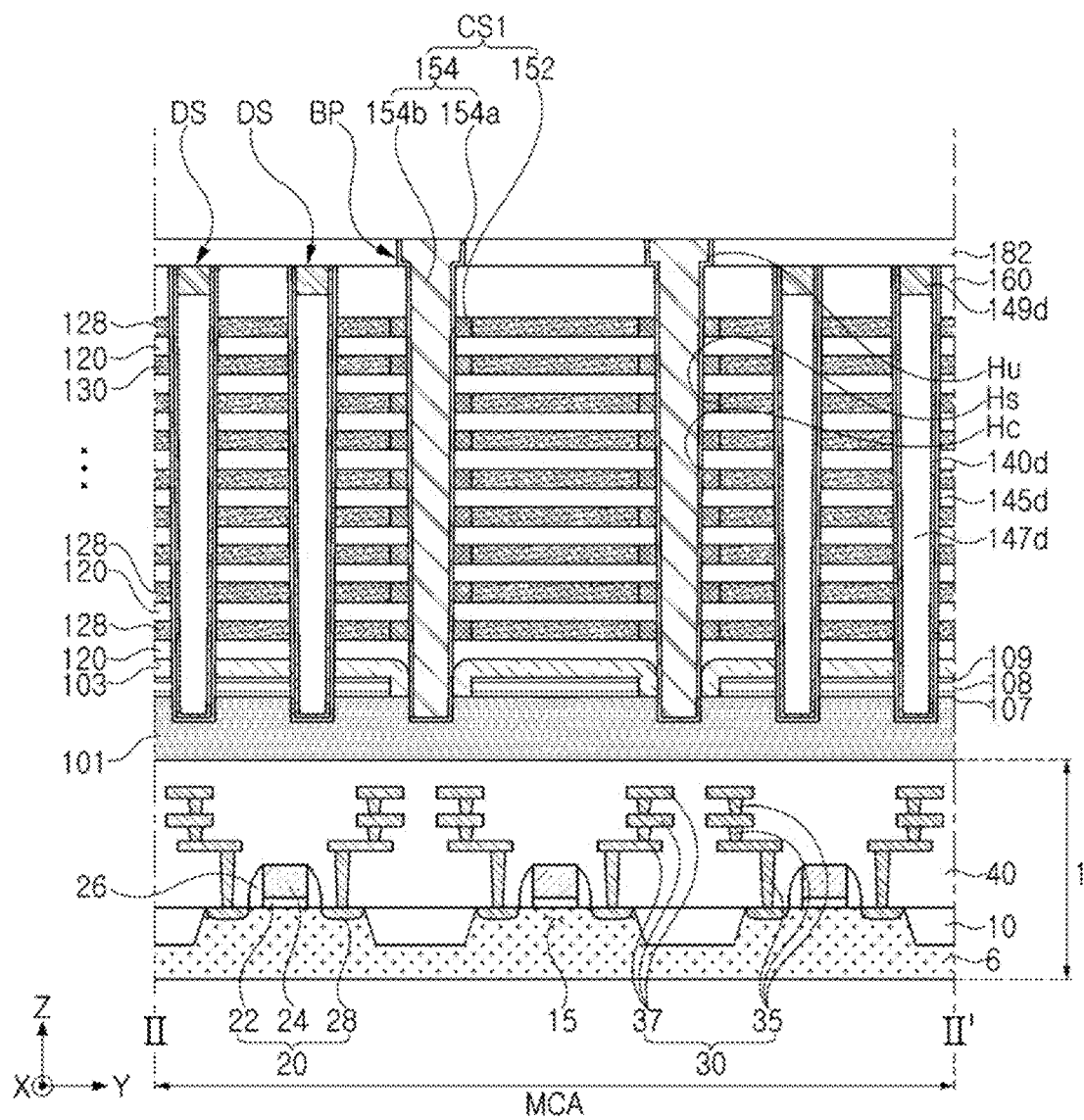

Referring to FIGS. 16A and 16B, the contact structures CS1 may be formed.

Forming the contact structures CS1 may include filling a space in the contact hole Hc with the contact plug 154 including the barrier layer 154a and the metal plug 154b. The barrier layer 154a may cover side surfaces of the insulating patterns 152 exposed through the contact hole Hc and extend downwardly to contact the conductive plate layer 101. The metal plug 154b may be formed on the barrier layer 154a. After the contact structures CS1 are formed, a planarization process may be performed.

Figure 17A:
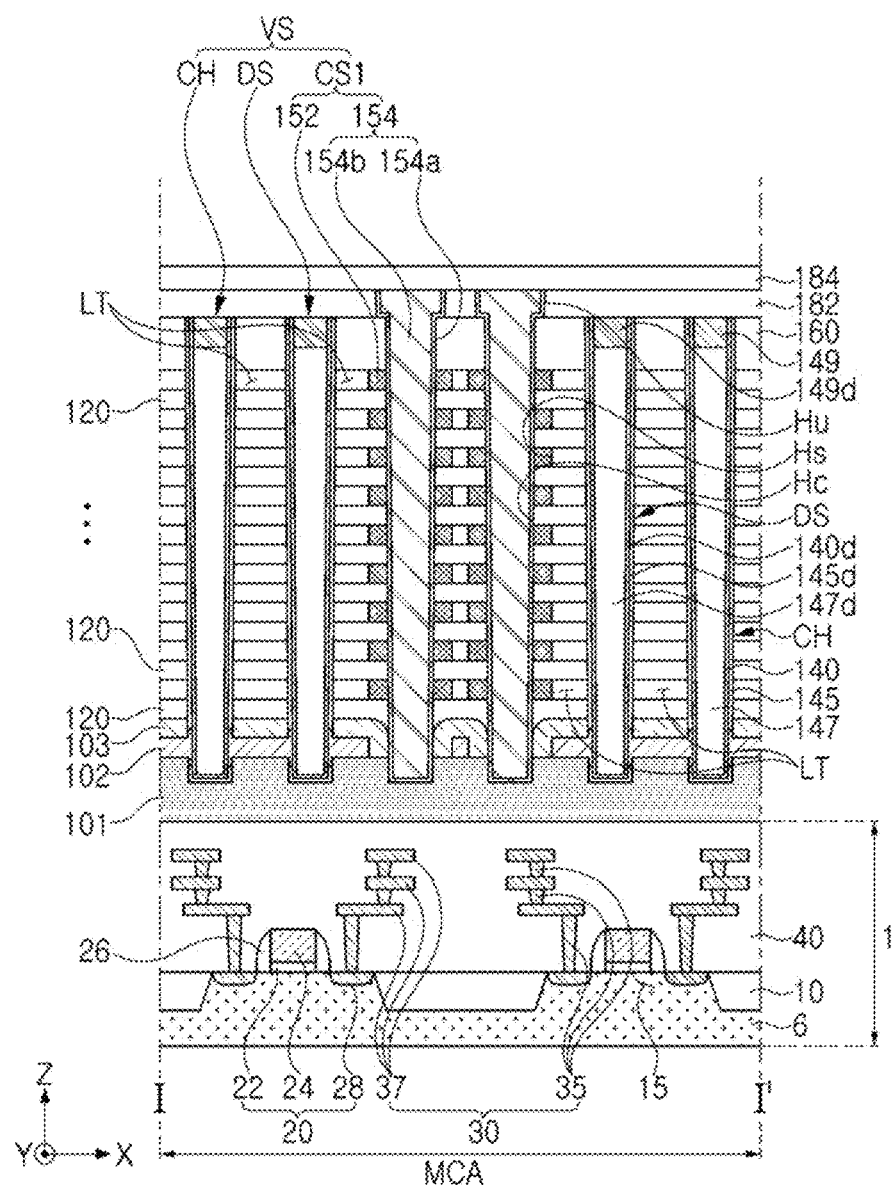
Figure 17B:
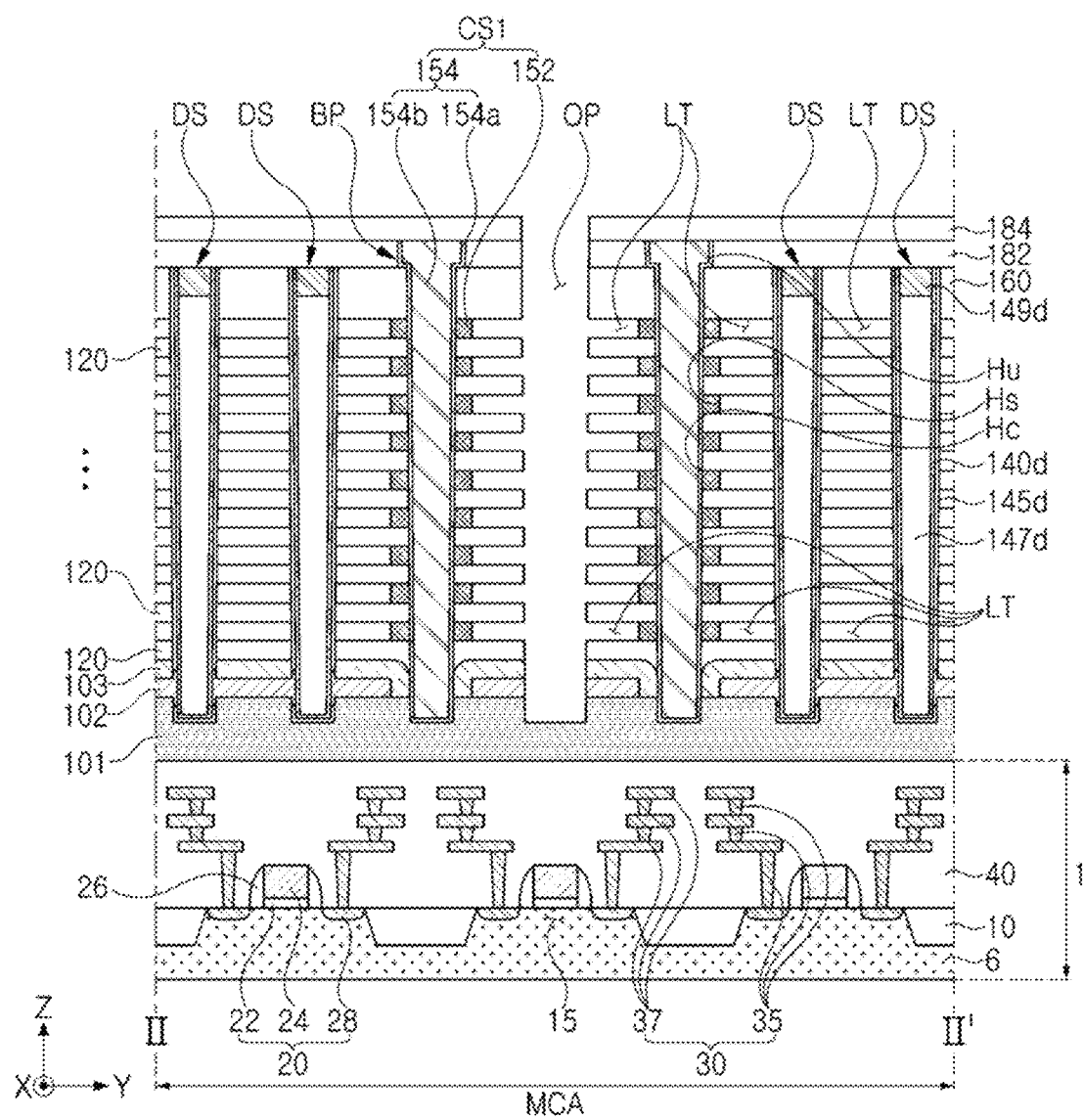
Figure 17C:
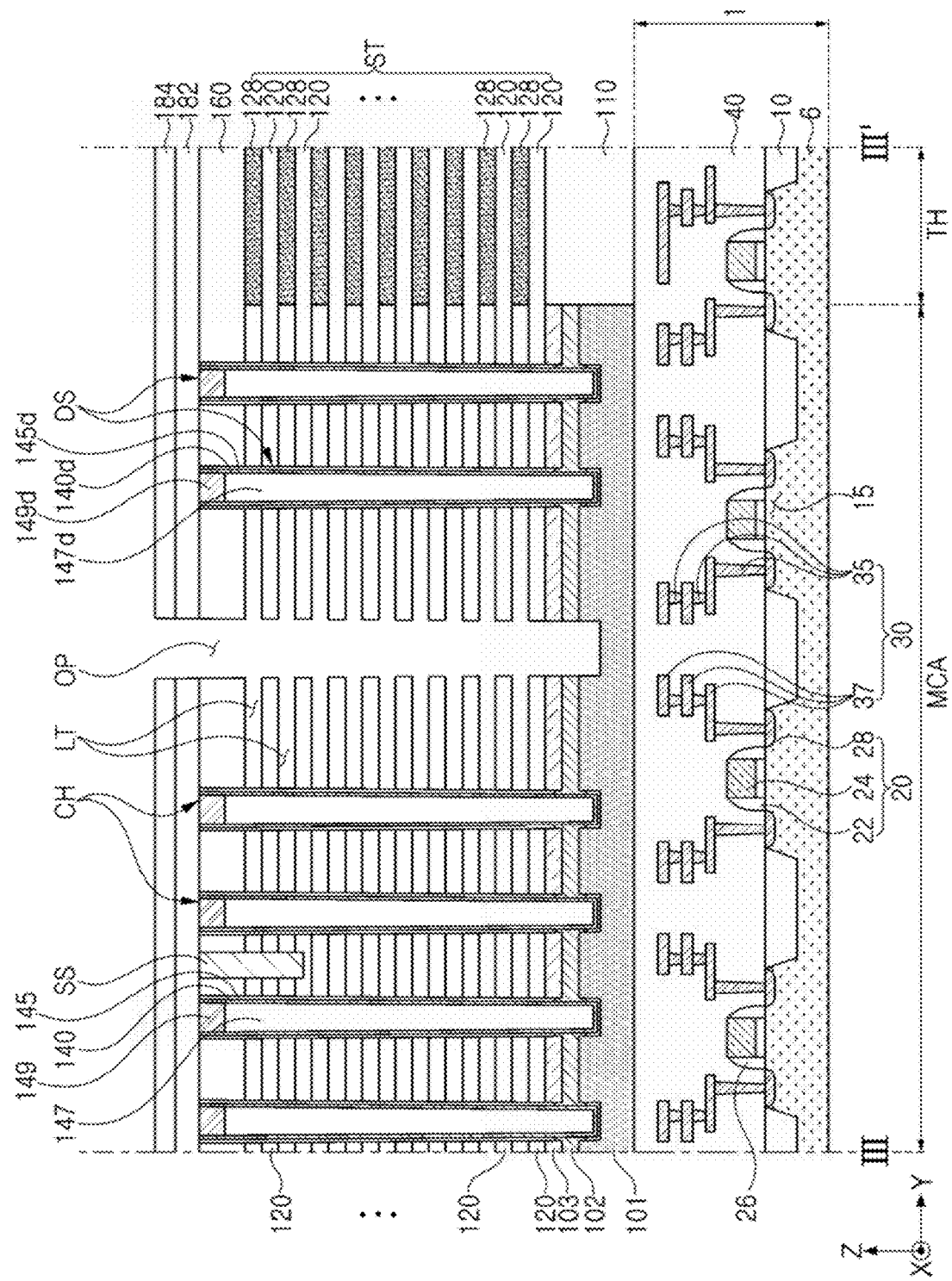

Referring to FIGS. 17A to 17C, the second upper insulating layer 184 may be formed, an isolation opening OP penetrating through the preliminary stack structure of the sacrificial insulating layers 128 and the interlayer insulating layers 120 may be formed, the horizontal insulating layers 107, 108, and 109 may be replaced with the first pattern layer 102 through the isolation opening OP, and the sacrificial insulating layers 128 may be removed.

First, the second upper insulating layer 184 may be formed on the first upper insulating layer 182, and the isolation opening OP may be formed by forming a mask layer using photolithography and anisotropically etching the first and second upper insulating layers 182 and 184, the upper capping layer 160, the sacrificial insulating layers 128, the interlayer insulating layers 120, and the second pattern layer 103. The isolation opening OP may be formed in the form of a trench extending in the X direction.

Next, separate sacrificial spacer layers may be formed in the isolation opening OP and the second horizontal insulating layer 108 may be exposed by performing an etch-back process. The second horizontal insulating layer 108 may be selectively removed from the exposed region, and thereafter, the upper first and the lower third horizontal insulating layers 107 and 109 may be removed to form lower openings. The horizontal insulating layers 107, 108, and 109 may be removed by, e.g., a wet etching process. During the removal process of the horizontal insulating layers 107, 108, and 109, a portion of the gate dielectric layer 145 exposed in the region in which the second horizontal insulating layer 108 is removed may also be removed.

Next, the first pattern layer 102 may be formed by depositing a conductive material in the lower openings. The first pattern layer 102 may be in contact with the conductive plate layer 101 and the second pattern layer 103, and may be formed around the channel layer 140 to contact the channel layer 140. The first pattern layer 102 may also contact the dummy channel layer 140d around the dummy channel layer 140d. The separate sacrificial spacer layers may then be removed.

Next, the sacrificial insulating layers 128 may be selectively removed with respect to the interlayer insulating layers 120, the conductive plate layer 101, and the first and second upper insulating layers 182 and 184. Accordingly, a plurality of horizontal openings LT may be formed between the interlayer insulating layers 120. The sacrificial insulating layers 128 may be removed from the memory cell region MCA, but may not be removed from the through-insulating region TH and may remain. Referring to FIG. 1 together, an isolation opening OP may be formed in a region in which the separation structure MS is to be formed, and as an etchant introduced through the isolation opening OP does not reach, the sacrificial insulating layers 128 may remain in the through-insulating region TH.

Figure 18A:
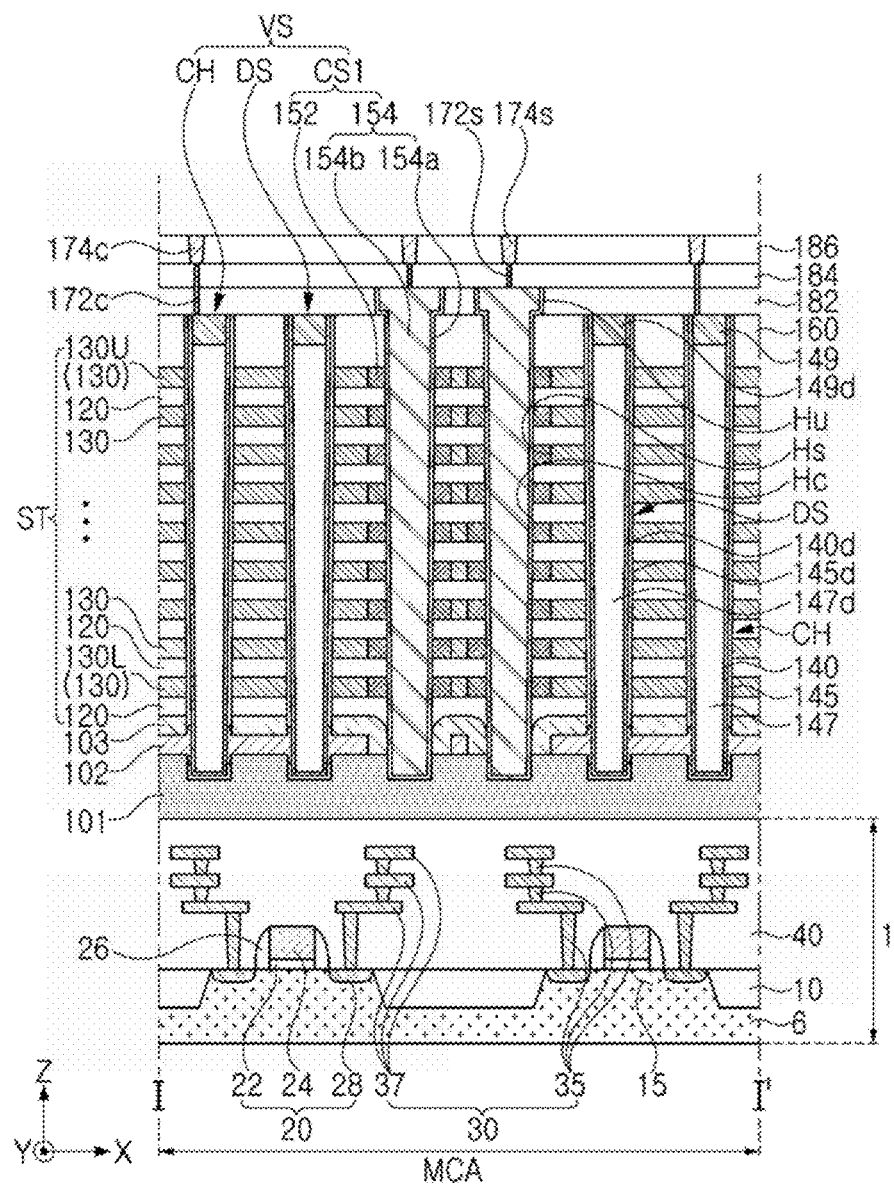
Figure 18B:
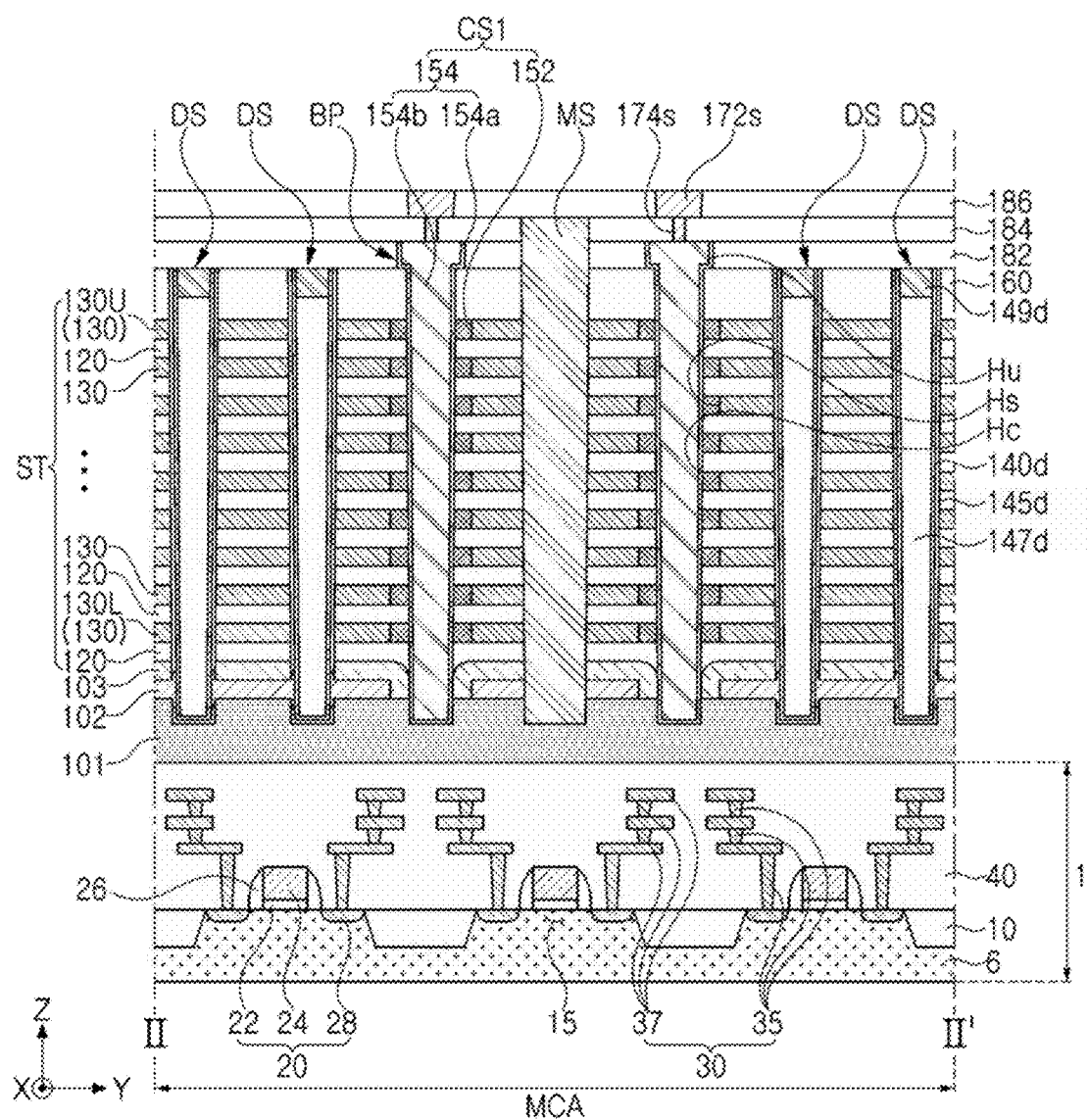
Figure 18C:
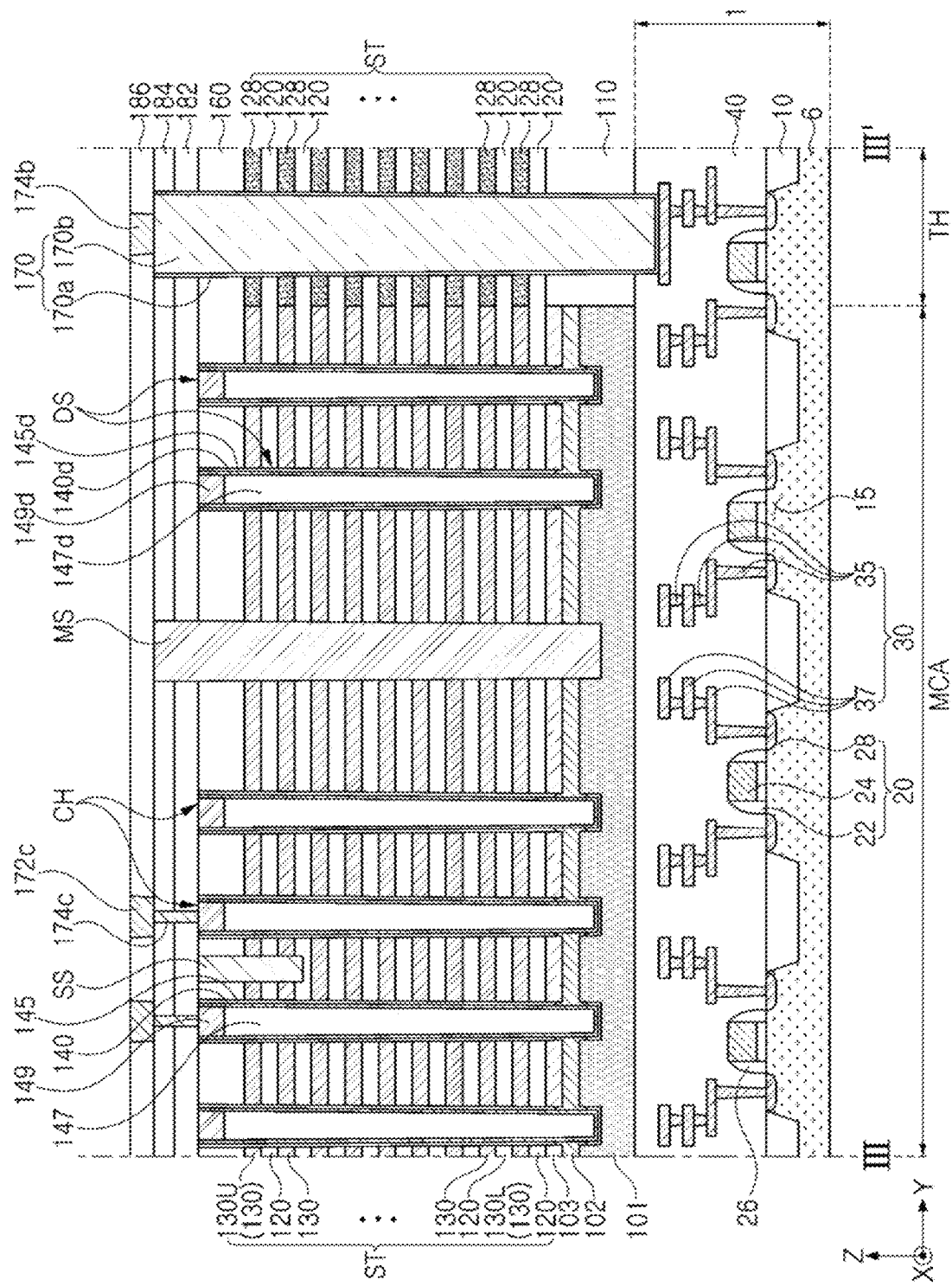

Referring to FIGS. 18A to 18C, the gate electrodes 130 may be formed in horizontal openings LT, the separation structure MS may be formed in the isolation opening OP, and the through-plug 170 penetrating through the sacrificial insulating layers 128 may be formed in the through-insulating region TH. The upper contacts 172c, 174c, 174b, 172s, and 174s and the third upper insulating layer 186 may be formed.

First, the gate electrodes 130 may be formed by filling the horizontal openings LT formed by removing the sacrificial insulating layers 128 through the isolation opening OP with a conductive material. Accordingly, the stack structure ST in which the interlayer insulating layers 120 and the gate electrodes 130 are alternately stacked in the memory cell array region MCA and the interlayer insulating layers 120 and the sacrificial insulating layers 128 are alternately stacked in the through-insulating region TH may be formed.

Next, the separation structure MS may be formed by filling the isolation opening OP with an insulating material.

Thereafter, the second insulating layer 192 and upper contacts 172c, 174c, 174b, 172s and 174s on the separation structure MS and the second upper insulating layer 184 may be formed.

Thereafter, the upper wiring structure 190 including the bit lines BL and the upper metal pattern UM may be formed, thereby manufacturing the semiconductor device 100 of FIGS. 1 to 3C.

FIGS. 19A to 19D are schematic cross-sectional views illustrating a method of manufacturing a semiconductor device according to example embodiments. FIGS. 19A to 19D illustrate a manufacturing process of the semiconductor device of FIGS. 7A and 7B.

Figure 19A:
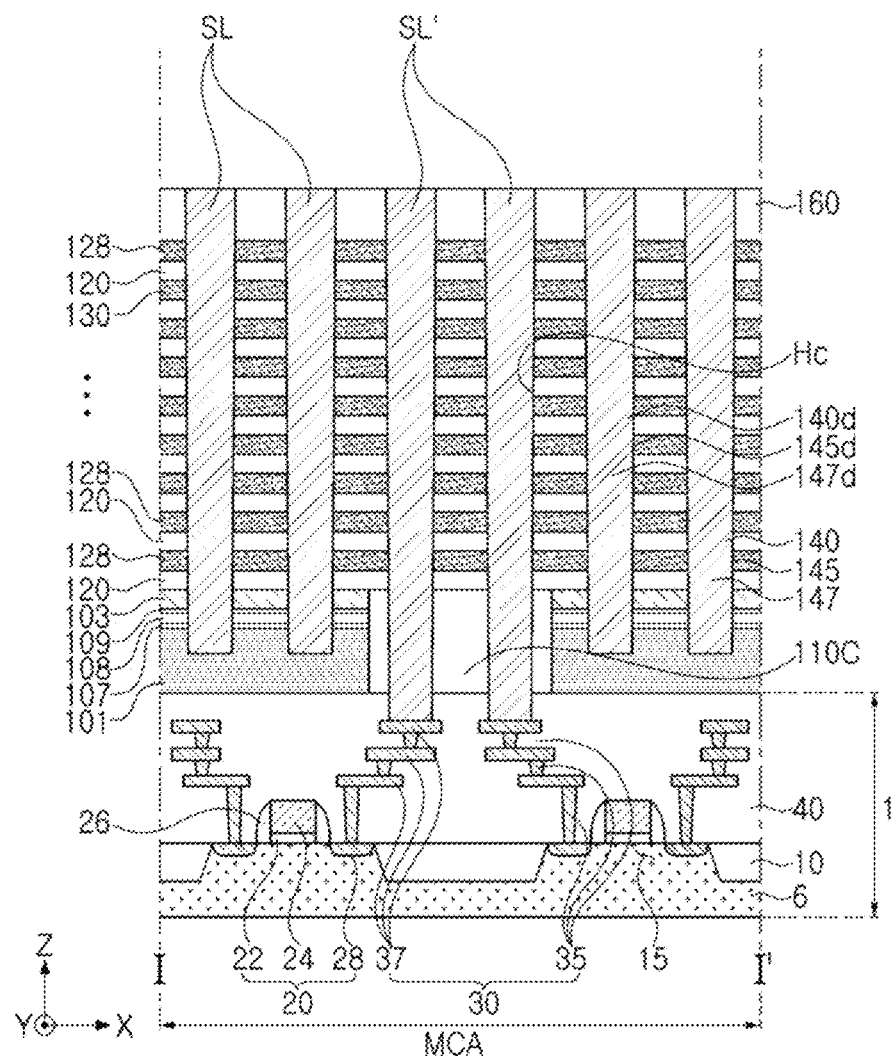
FIGS. 19A to 19D are schematic cross-sectional views illustrating a method of manufacturing a semiconductor device according to example embodiments.

Referring to FIG. 19A, in the region in which the contact structures CS2 are to be formed, in a state in which the lower through-insulating layer 110C penetrating through the conductive plate layer 101 is formed, the sacrificial insulating layers 128 and the interlayer insulating layers 120 may be stacked. Some vertical sacrificial structures SL may land in the conductive plate layer 101, but some other vertical sacrificial structures SL' may penetrate through the lower through-insulating layer 110C and be connected to the lower wiring structure 30.

Figure 19B:
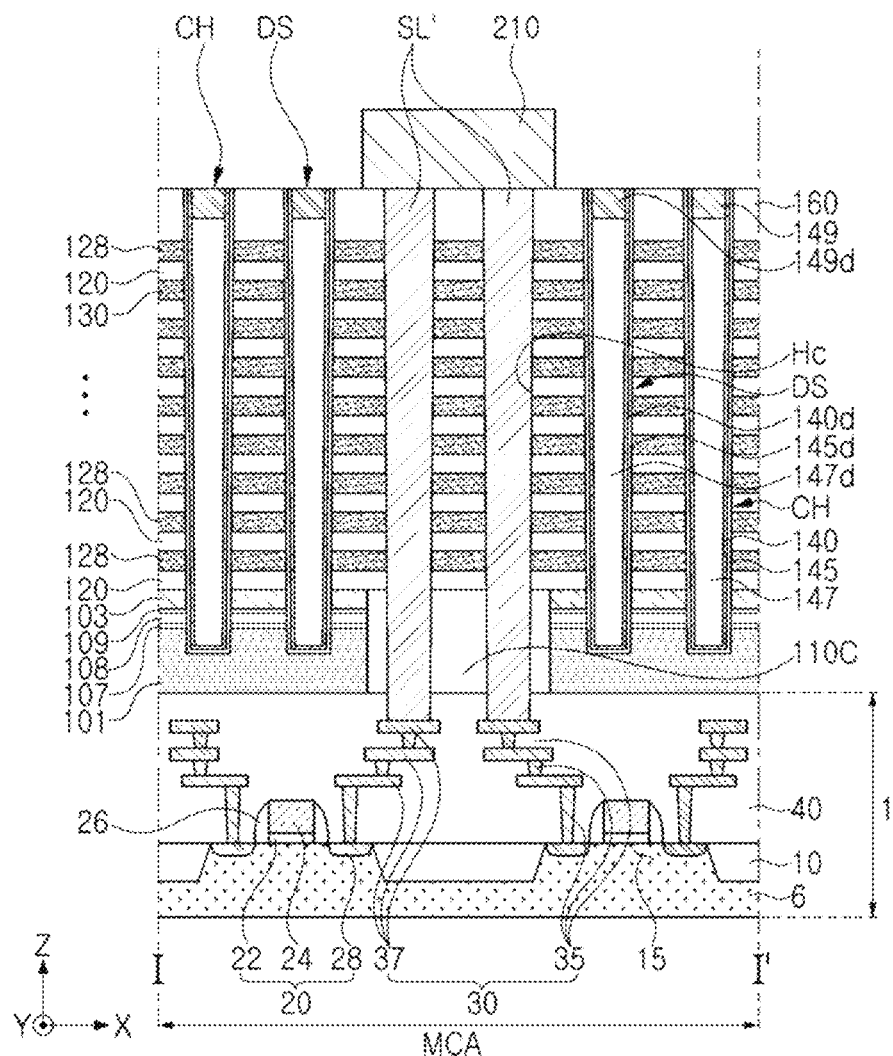

Referring to FIG. 19B, the upper mask pattern 210 may be formed, the vertical sacrificial structures SL may be removed, the channel structure CH and the dummy structure DS may then be formed.

Figure 19C:
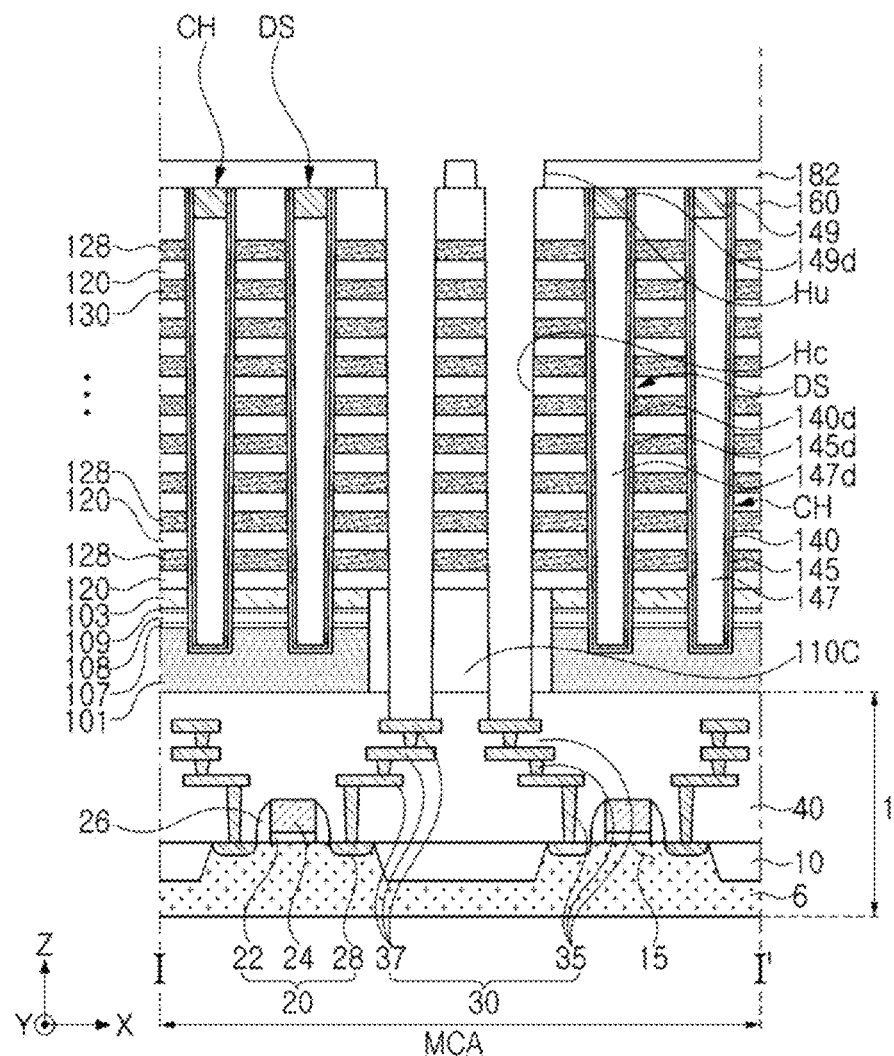

Referring to FIG. 19C, the first upper insulating layer 182 may be formed and pattern to form the upper open region Hu, and the vertical sacrificial structures SL' may be removed to form the contact holes Hc. The contact holes Hc may partially expose the uppermost lower wiring line 37 among the lower wiring lines 37 of the lower wiring structure 30.

Figure 19D:
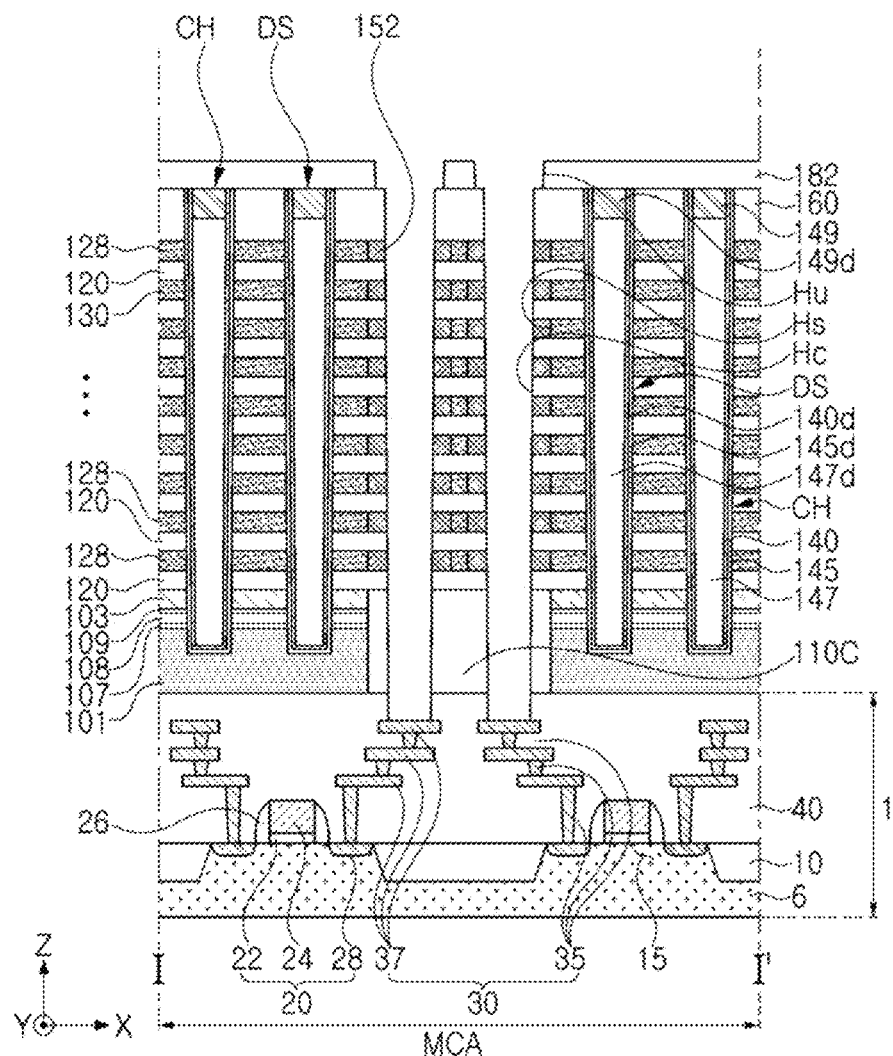

Referring to FIG. 19D, the extension portion Hs extending from a side surface of the contact hole Hc toward the sacrificial insulating layers 128 may be formed, and the insulating patterns 152 may be formed.

Next, the semiconductor device of FIGS. 7A and 7B may be manufactured by applying the manufacturing method described with reference to FIGS. 16A to 18C.

Figure 20:
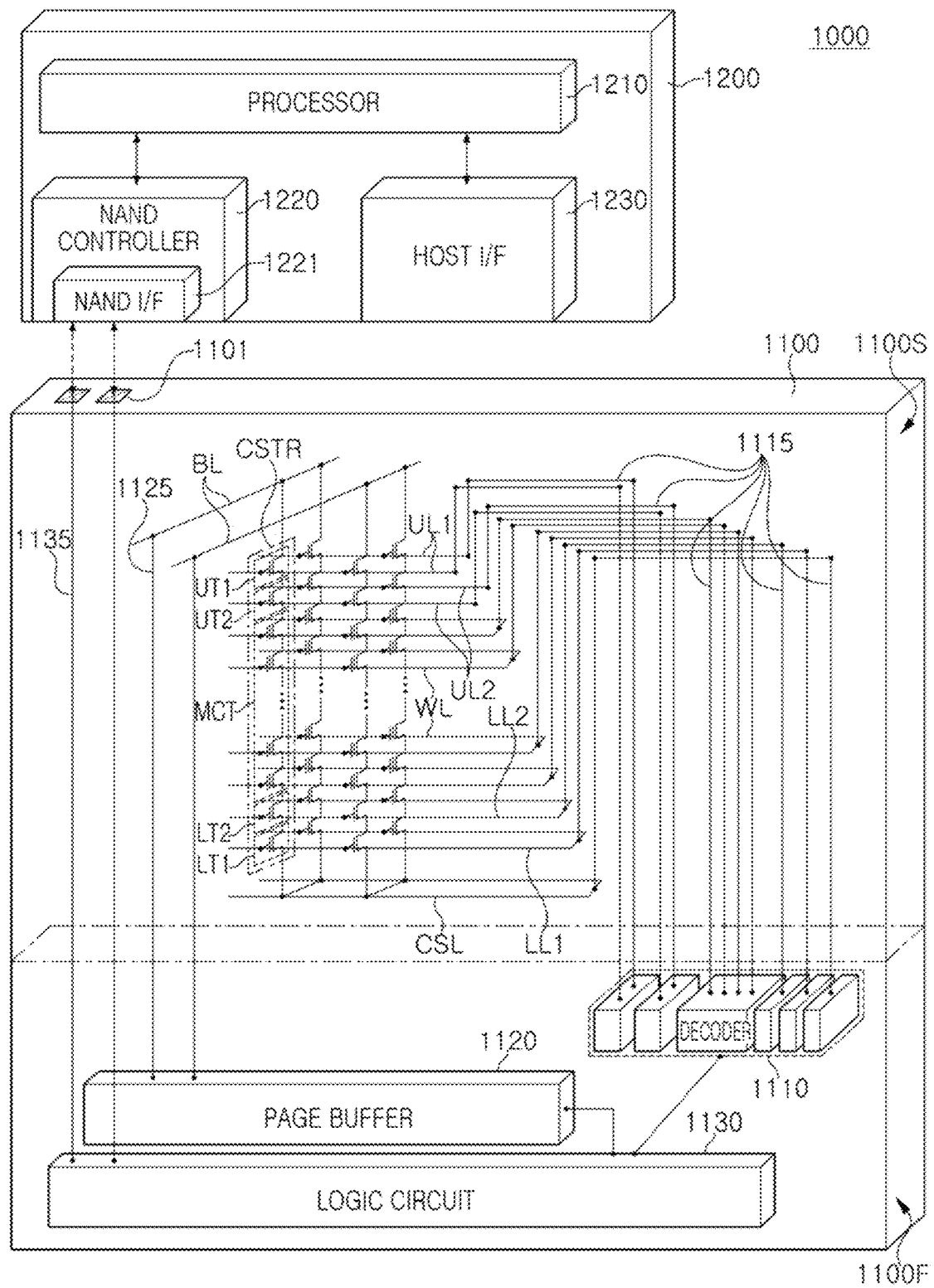
FIG. 20 is a diagram schematically illustrating a data storage system including a semiconductor device according to example embodiments.

FIG. 20 is a diagram schematically illustrating a data storage system including a semiconductor device according to example embodiments.

Referring to FIG. 20, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD) including one or a plurality of semiconductor devices 1100, a universal serial bus (USB), a computing system, a medical device, or a communication device.

The semiconductor device 1100 may be a nonvolatile memory device, e.g., a NAND flash memory device that is formed as described above with reference to FIGS. 1 to 11.

The semiconductor device 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, and first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to example embodiments.

In some example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used in an erase operation for erasing data stored in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from within the first structure 1100F to the second structure 1100S. The bit lines BL may be electrically connected to the page buffer 1120 through second connection lines 1125 extending from within the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from within the first structure 1100F to the second structure 1100S.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the memory cell transistors MCT of the semiconductor device 1100, and data to be read from the memory cell transistors (MCT) may be transmitted. The host interface 1230 may provide a communication function between the data storage system 1000 and an external host. When receiving a control command from an external host through the host interface 1230, the processor 1210 may control the semiconductor device 1100 in response to the control command.

Figure 21:
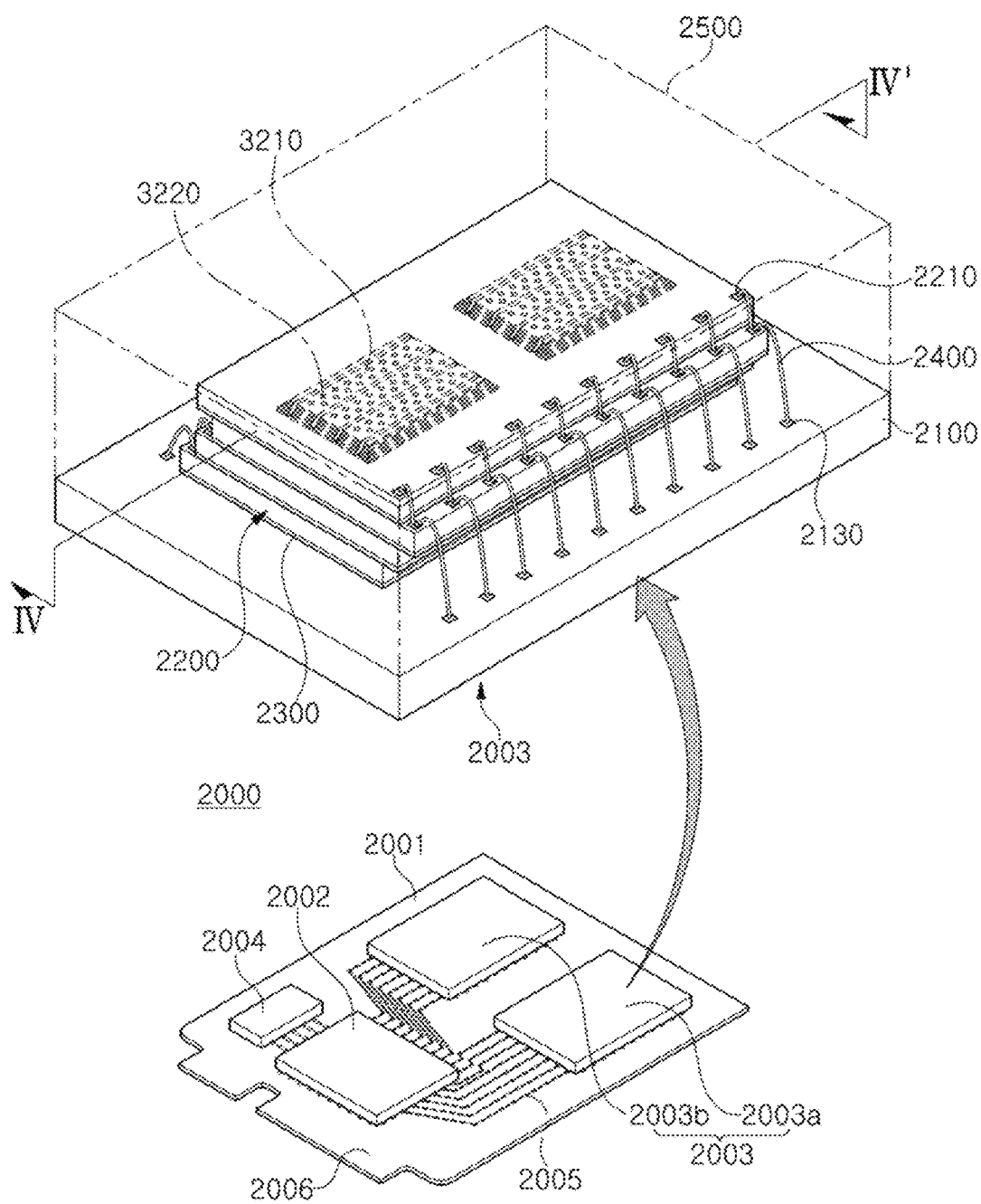
FIG. 21 is a perspective view schematically illustrating a data storage system including a semiconductor device according to an example embodiment.

FIG. 21 is a perspective view schematically illustrating a data storage system including a semiconductor device according to an example embodiment.

Referring to FIG. 21, a data storage system 2000 according to an example embodiment may include a main substrate 2001, a controller 2002 mounted on the main substrate 2001, one or more semiconductor packages 2003, and DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the data storage system 2000 and the external host. In some example embodiments, the data storage system 2000 may communicate with an external host according to any one of the interfaces such as universal serial bus (USB), peripheral component interconnect express (PCI-Express), serial advanced technology attachment (SATA), an M-Phy for universal flash storage (UFS), etc. In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the data storage system 2000.

The DRAM 2004 may be a buffer memory for mitigating a speed difference between the semiconductor package 2003 as a data storage space and the external host. The DRAM 2004 included in the data storage system 2000 may operate as a kind of cache memory and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 20. Each of the semiconductor chips 2200 may include gate stack structures 3210 and channel structures 3220. Each of the semiconductor chips 2200 may include the semiconductor device described above with reference to FIGS. 1 to 11.

In some example embodiments, the connection structure 2400 may be a bonding wire electrically connecting the input/output pad 2210 to the package upper pads 2130. Accordingly, in each of the first and second semiconductor packages 2003a and 2003b, the semiconductor chips 2200 may be electrically connected to each other by a bonding wire method and may be electrically connected to the package upper pads 2130 of the package substrate 2100. According to example embodiments, in each of the first and second semiconductor packages 2003a and 2003b, the semiconductor chips 2200 may be electrically connected to each other by a connection structure including a through-electrode (i.e., a through-silicon via (TSV)), instead of the bonding wire-type connection structure 2400.

In some example embodiments, the controller 2002 and the semiconductor chips 2200 may be included in one package. In an example embodiment, the controller 2002 and the semiconductor chips 2200 may be mounted on a separate interposer substrate different from the main substrate 2001, and the controller 2002 and the semiconductor chips 2200 may be connected to each other by a wiring formed on the interposer substrate.

Figure 22:
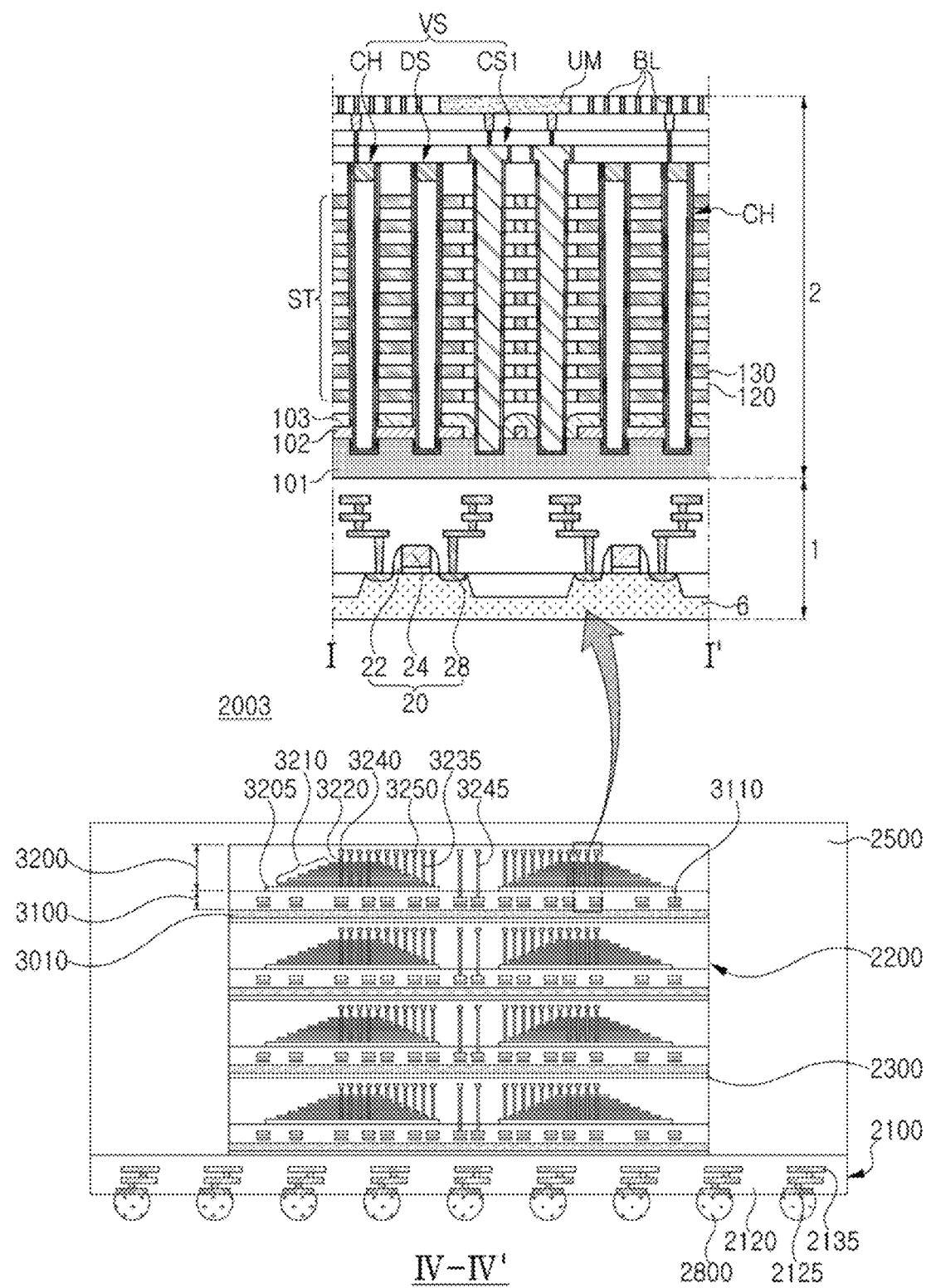
FIG. 22 is a cross-sectional view schematically illustrating a semiconductor package according to an example embodiment.

FIG. 22 is a cross-sectional view schematically illustrating a semiconductor package according to an example embodiment. FIG. 22 illustrates an example embodiment of the semiconductor package 2003 of FIG. 21, and conceptually illustrates a region of the semiconductor package 2003 of FIG. 21, taken along line IV-IV'.

Referring to FIG. 22, in the semiconductor package 2003, the package substrate 2100 may be a printed circuit board. The package substrate 2100 may include a package substrate body portion 2120, package upper pads 2130 (refer to FIG. 21) disposed on an upper surface of the package substrate body portion 2120, lower pads 2125 disposed on a lower surface of the package substrate body portion 2120 or exposed through the lower surface of the package substrate body portion 2120, and internal wirings 2135 electrically connecting the package upper pads 2130 to the lower pads 2125 in the package substrate body portion 2120. The package upper pads 2130 may be electrically connected to the connection structures 2400. The lower pads 2125 may be connected to the wiring patterns 2005 of the main substrate 2010 of the data storage system 2000 as illustrated in FIG. 21 through conductive connectors 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 and isolation regions 3230 penetrating through the gate stack structure 3210, bit lines 3240 electrically connected to the channel structures 3220, and gate contact plugs 3235 electrically connected to the word lines WL (refer to FIG. 20) of the gate stack structure 3210. As described above with reference to FIGS. 1 to 11, each of the semiconductor chips 2200 may include a substrate 6, circuit elements 20, a conductive plate layer 101, a stack structure ST including gate electrodes 130, channel structures CH, a dummy structure DS, a contact structure CS1, and a bit line BL.

Each of the semiconductor chips 2200 may include a through-wiring 3245 electrically connected to the peripheral wirings 3110 of the first structure 3100 and extending into the second structure 3200. The through-wiring 3245 may be disposed outside the gate stack structure 3210 and may be further disposed to penetrate through the gate stack structure 3210. Each of the semiconductor chips 2200 may further include an input/output pad 2210 (refer to FIG. 20) electrically connected to the peripheral wirings 3110 of the first structure 3100.

As described above, embodiments may provide a semiconductor device having improved electrical characteristics and integration by optimizing arrangement of channel structures, dummy structures, and contact structures in a memory cell array region, and a data storage system including the semiconductor device having improved electrical characteristics and integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first structure including a substrate, circuit elements on the substrate, and a lower wiring structure electrically connected to the circuit elements; and
a second structure on the first structure, the second structure including:
a conductive plate layer;
a stack structure including interlayer insulating layers and gate electrodes alternately stacked on the conductive plate layer;
separation structures penetrating through the stack structure in a vertical direction and extending in a first direction, perpendicular to the vertical direction, to separate the gate electrodes;
vertical structures penetrating through the stack structure in the vertical direction, the vertical structures including channel structures respectively including a channel layer, contact structures respectively including a metal plug, and dummy structures; and
bit lines electrically connected to the channel structures and extending in a second direction, perpendicular to the first direction, on the stack structure, wherein:
at least one contact structure of the contact structures is disposed adjacent to at least one side of at least one of the separation structures,
at least one dummy structure of the dummy structures is disposed adjacent to the at least one contact structure,
the channel structures are arranged at a first pitch in the first direction, the at least one contact structure is arranged at a second pitch in the first direction from the at least one dummy structure adjacent thereto, and
the first pitch and the second pitch are substantially equal to each other.

2. The semiconductor device as claimed in claim 1, wherein:
the vertical structures are arranged on a plurality of array lines extending in the first direction, and
the plurality of array lines are arranged at a constant interval in the second direction away from the at least one side of the at least one separation structure.

3. The semiconductor device as claimed in claim 2, wherein the channel structures, the at least one dummy structure, and the at least one contact structure are disposed to be aligned with each other in the first direction on at least one array line among the plurality of array lines in a plan view.

4. The semiconductor device as claimed in claim 3, wherein the at least one array line is a first array line, which is closest to the at least one separation structure in the plurality of array lines in the plan view.

5. The semiconductor device as claimed in claim 4, wherein the at least one dummy structure on the first array line is disposed between the channel structures and the at least one contact structure in the first direction in the plan view.

6. The semiconductor device as claimed in claim 1, wherein:
the at least one separation structure has first and second surfaces facing each other in the second direction, and
the at least one contact structure includes at least one first contact structure adjacent to the first surface and at least one second contact structure adjacent to the second surface.

7. The semiconductor device as claimed in claim 6, wherein the dummy structures include:
at least one first dummy structure disposed around the at least one first contact structure; and
at least one second dummy structure disposed around the at least one second contact structure.

8. The semiconductor device as claimed in claim 1, wherein:
the at least one contact structure includes a first contact structure and a second contact structure adjacent to each other in the first direction, and
the first contact structure and the second contact structure are electrically connected to each other through a connection pattern extending horizontally from upper portions of the first contact structure and the second contact structure.

9. The semiconductor device as claimed in claim 1, wherein the at least one contact structure includes at least one of at least one source contact structure in contact with the conductive plate layer and at least one through-contact structure connected to the lower wiring structure through the conductive plate layer in the vertical direction.

10. The semiconductor device as claimed in claim 9, wherein:
the stack structure includes a memory cell array region in which the vertical structures are arranged and a connection region in which the gate electrodes form a step structure, and
the at least one contact structure is disposed to penetrate through an uppermost gate electrode and a lowermost gate electrode, among the gate electrodes, in the vertical direction in the memory cell array region.

11. The semiconductor device as claimed in claim 9, wherein the at least one through-contact structure overlaps a lower through-pattern penetrating through the conductive plate layer in the vertical direction, and the at least one through-contact structure penetrates through the lower through-pattern.

12. The semiconductor device as claimed in claim 1, wherein:
the at least one contact structure includes a contact plug disposed in a contact hole penetrating through the stack structure and insulating patterns surrounding at least a portion of a side surface of the contact plug, and
the insulating patterns are arranged on side regions extending from the side surface of the contact hole toward the gate electrodes.

13. A semiconductor device, comprising:
a conductive plate layer;
a stack structure including interlayer insulating layers and gate electrodes alternately stacked on the conductive plate layer;
a separation structure penetrating through the stack structure in a vertical direction and extending in a first direction, perpendicular to the vertical direction, to separate the gate electrodes in a second direction, perpendicular to the first direction; and
a plurality of vertical structures penetrating through the stack structure in the vertical direction and arranged at a constant pitch in at least one direction, parallel to an upper surface of the conductive plate layer, wherein:
the plurality of vertical structures are arranged along array lines extending in the first direction and sequentially arranged in the second direction away from at least one side of the separation structure in a plan view,
the plurality of vertical structures include a channel structure including a channel layer, a contact structure including a metal plug having an upper surface on a level higher than a level of an upper surface of the channel structure, and a dummy structure disposed adjacent to the contact structure, and
the channel structure, the dummy structure, and the contact structure are disposed to be aligned with each other on at least one array line of the array lines.

14. The semiconductor device as claimed in claim 13, wherein the at least one array line is an array line closest to the separation structure, among the array lines.

15. The semiconductor device as claimed in claim 13, wherein:
a center of the channel structure is spaced apart from the separation structure at a first distance in the second direction, and a center of the contact structure is spaced apart from the separation structure at a second distance in the second direction, in the plan view, and
the first distance is substantially equal to the second distance.

16. The semiconductor device as claimed in claim 15, wherein:
a center of the dummy structure is spaced apart from the separation structure at a third distance in the second direction in the plan view, and
the second distance is substantially equal to the third distance.

17. The semiconductor device as claimed in claim 13, wherein:
the separation structure includes first and second surfaces facing each other in the second direction, and
the contact structure includes at least one first contact structure adjacent to the first surface and at least one second contact structure adjacent to the second surface.

18. The semiconductor device as claimed in claim 13, wherein:
the channel structure further includes a gate dielectric layer extending between the channel layer and the gate electrodes, a core insulating layer on an inner surface of the channel layer, and a channel pad in contact with an upper portion of the channel layer on the core insulating layer, and
the contact structure further includes a barrier layer covering lower and side surfaces of the metal plug and insulating patterns extending from a side surface of the barrier layer toward the gate electrodes at a corresponding level between the interlayer insulating layers.

19. The semiconductor device as claimed in claim 13, wherein a side surface of an upper region of the contact structure includes a bent portion.

20. A data storage system, comprising:
a lower structure including a substrate, circuit elements on the substrate, and a lower wiring structure electrically connected to the circuit elements;
an upper structure on the lower structure;
a semiconductor storage device including an input/output pad electrically connected to the circuit elements; and
a controller electrically connected to the semiconductor storage device through the input/output pad and controlling the semiconductor storage device, wherein:

the upper structure includes:
a conductive plate layer on the lower structure;
a stack structure including interlayer insulating layers and gate electrodes alternately stacked on the conductive plate layer;
a separation structure penetrating through the stack structure in a vertical direction and extending in a first direction, perpendicular to the vertical direction, to separate the gate electrodes in a second direction, perpendicular to the first direction; and
a plurality of vertical structures penetrating through the stack structure in the vertical direction and arranged at a constant pitch in at least one direction, parallel to an upper surface of the conductive plate layer,
the plurality of vertical structures are arranged along array lines extending in the first direction and sequentially arranged in the second direction away from at least one side of the separation structure on a plane parallel to the upper surface of the conductive plate layer,
the plurality of vertical structures include a channel structure including a channel layer, a contact structure having an upper surface on a level higher than a level of an upper surface of the channel structure and including a metal plug, and
a dummy structure disposed adjacent to the contact structure, and the channel structure, the dummy structure, and the contact structure are disposed to be aligned with each other on at least one of the array lines.

* * * * *